United States Patent
Toya et al.

[11] Patent Number: 6,043,468
[45] Date of Patent: Mar. 28, 2000

[54] CARBON HEATER

[75] Inventors: Eiichi Toya, Yamagata; Masahiko Ichishima, Kanagawa; Tomio Konn, Yamagata; Tomohiro Nagata, Yamagata; Shigeru Yamamura, Yamagata; Norihiko Saito, Yamagata; Kouji Teraoka, Saitama; Takeshi Inaba; Hiroyuki Honma, both of Yamagata; Ken Nakao, Kanagawa; Takanori Saito, Kanagawa; Hisaei Osanai, Kanagawa; Toshiyuki Makiya, Tokyo, all of Japan

[73] Assignees: Toshiba Ceramics Co., Ltd.; Tokyo Electron Limited, both of Tokyo, Japan

[21] Appl. No.: 09/126,847

[22] Filed: Jul. 31, 1998

[30]    Foreign Application Priority Data

Jul. 21, 1997 [JP] Japan .................................... 9-218941
Jul. 31, 1997 [JP] Japan .................................... 9-219018
Sep. 26, 1997 [JP] Japan .................................... 9-277938
Apr. 28, 1998 [JP] Japan .................................... 10-132630

[51] Int. Cl.⁷ .................................................. H05B 3/44
[52] U.S. Cl. ........................... 219/544; 219/548; 219/549
[58] Field of Search ................................. 219/545, 549, 219/548, 528, 544, 553, 460.1, 462.1, 468.1, 468.2; 338/268, 212, 214, 252, 311; 392/435; 423/447.1, 447.2, 445 R

[56]             References Cited

U.S. PATENT DOCUMENTS

| 3,774,299 | 11/1973 | Sato et al. ............................... | 29/611 |
| 4,091,355 | 5/1978  | Beck ........................................ | 338/286 |
| 4,471,212 | 9/1984  | Hager, Jr. ................................ | 219/345 |
| 4,783,586 | 11/1988 | Takeda ..................................... | 219/544 |

FOREIGN PATENT DOCUMENTS

| 9-26925A  | 3/1999  | France . |
| 63-284787 | 11/1988 | Japan . |
| 6-260430  | 9/1994  | Japan . |
| 8-138845  | 5/1996  | Japan . |
| 9-148056  | 6/1996  | Japan . |
| 8-310837  | 11/1996 | Japan . |
| 8-315965  | 11/1996 | Japan . |

*Primary Examiner*—Teresa Walberg
*Assistant Examiner*—Sharontina T. Fuqua
*Attorney, Agent, or Firm*—Foley & Lardner

[57]                 ABSTRACT

A carbon heater comprising heater members (11, 111, 121 . . . 161, 212, 222, 315, 325 . . . 345, 411, 515, 612) in which a plurality of carbon fiber bundles having a plurality of carbon fibers whose diameter is 5 to 15 μm bundled are woven into a longitudinally elongated shape such as a wire shape or a tape shape and the impurity content is less than 10 ppm in ashes.

47 Claims, 57 Drawing Sheets

$(t_1 = t_2)$ $(t_1 = \frac{1}{2} t_2)$

Fig.36
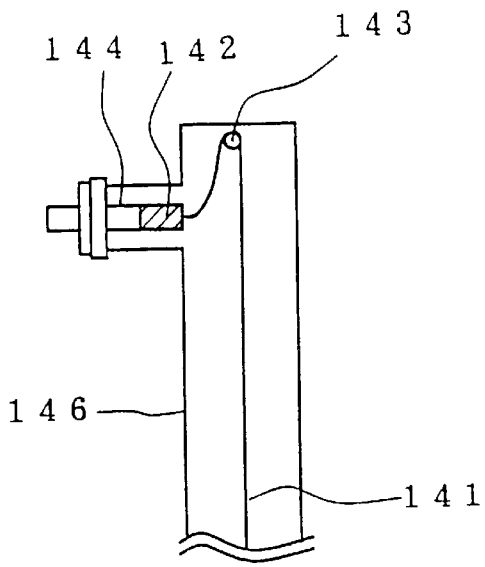
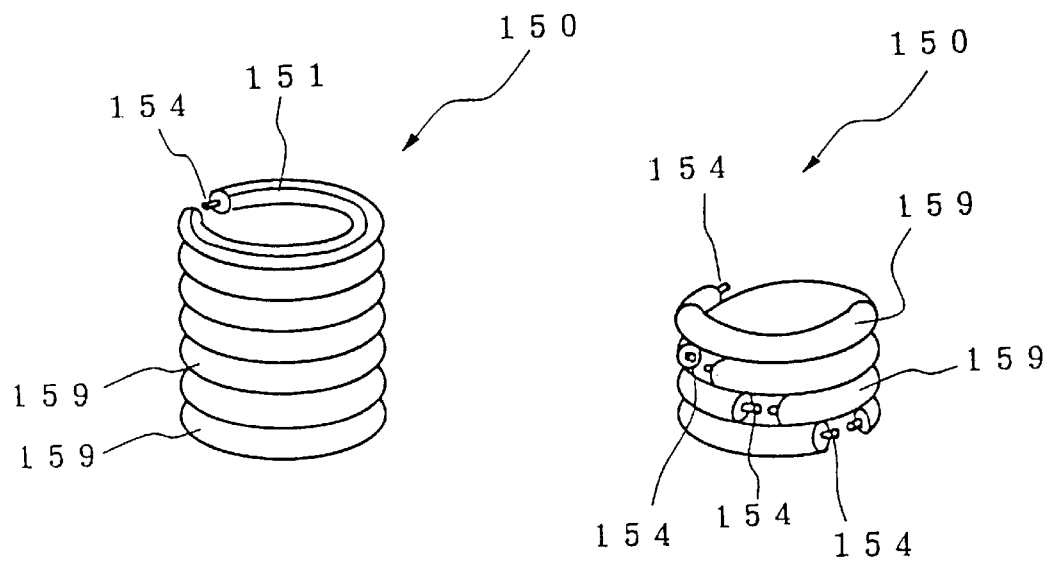
Fig.37A	Fig.37B

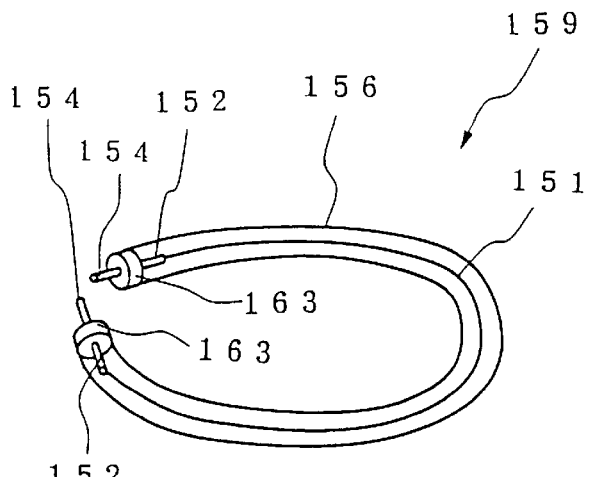
Fig.38A
Fig.38B
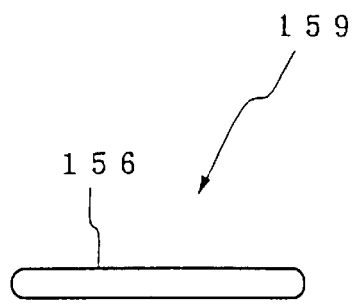
Fig.38C
Fig.38D
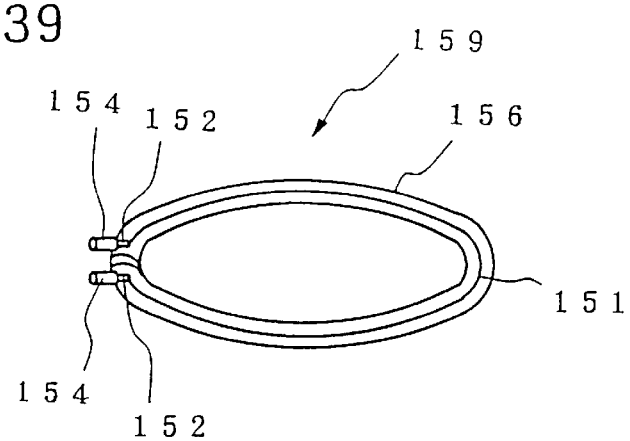
Fig.39

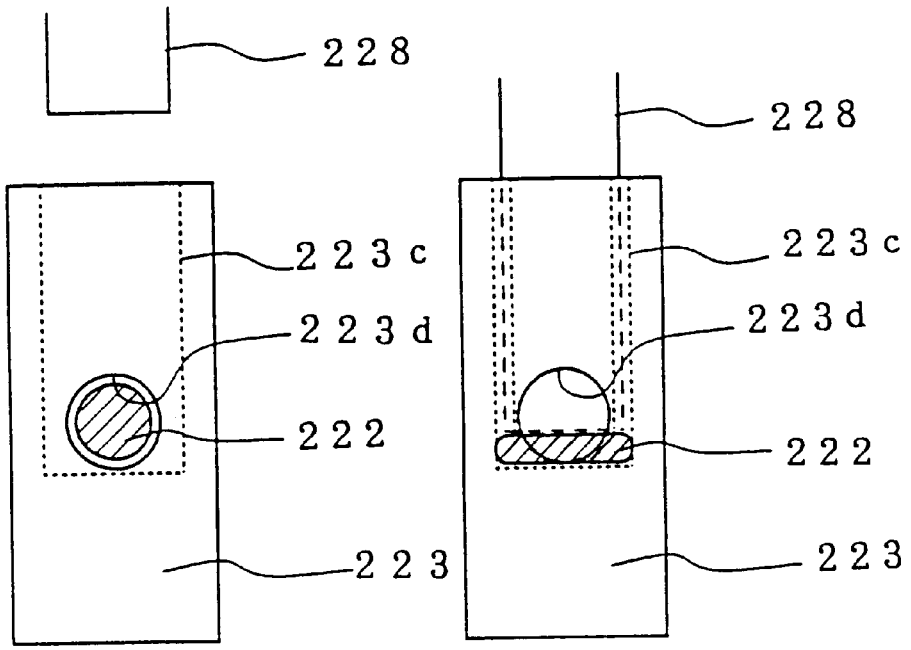
Fig.60A  Fig.60B
Fig.61
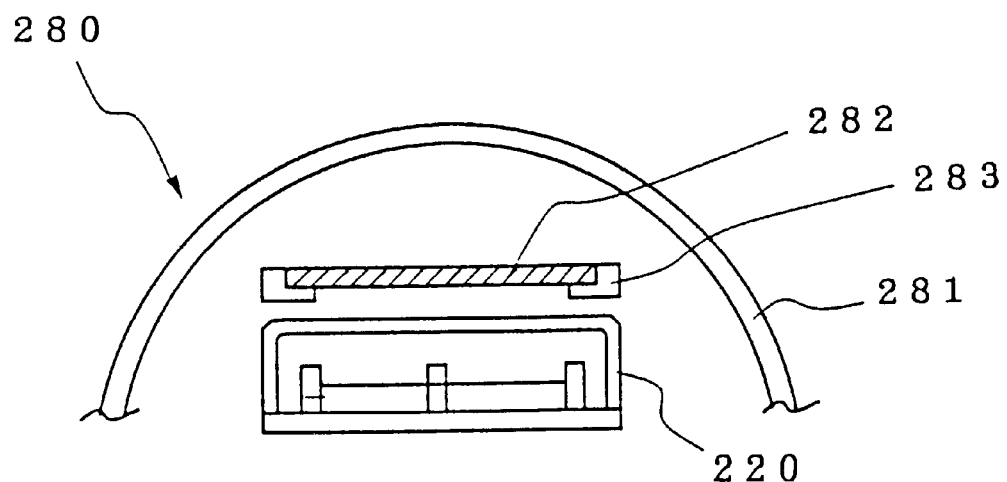

CARBON HEATER

BACKGROUND OF THE INVENTION

1. Field of the Invention

This invention is related to a carbon heater, and particularly to a carbon heater suitable for use with a semiconductor manufacturing apparatus.

2. Description of the Prior Art

In the manufacturing process of semiconductors, for example, various heat treatments for a silicon wafer are carried out. In the manufacturing process of semiconductors accompanied by some kind of heating as described above, strict temperature control is required. Furthermore, it is important to keep the atmosphere of heating treatment clean.

For these reasons, it is earnestly desired that a high performance heater for a semiconductor manufacturing apparatus, which is excellent in heat-equalizing properties and temperature rising and decreasing properties, and which does not release contaminated substances, is developed and formed into products.

Japanese Patent Application Laid-Open No. 7-161725 Publication discloses, in a wafer heating apparatus, an electrode construction in which a graphite carbon fiber composite (hereinafter referred to as C/C) solidified and integrated using resins, is used for a heater.

Furthermore, in the aforementioned apparatus, a flat plate-like volute type SiC heater member or a complex-shaped Mo—Si heater member, subjected to welding process has been heretofore used.

In the aforementioned C/C heater member, if the member has a shape in which it is sufficiently large in two dimensions, it has an extremely high mechanical strength, even if it is thin in the third dimension. However, if the member has a longitudinally long shape having a one-dimensional length, i.e., a width of less than 5 mm, a sufficient mechanical strength cannot be obtained in a case where the member is used as a heater for semiconductor manufacturing apparatus. In such a case when both ends of the member lengthwise are fixed to the terminals, a thermal load occurs with the thermal expansion of C/C, particularly in the vicinity of the terminal fixing portion, so that the member is easily broken.

Then on the other hand, if the width of the member is widened, the resistance value of the member decreases, which in turn requires a considerable increase in the electric current value in order to achieve the same level of heat generation. In addition, if the width of the member is widened, its thermal capacity increases, rendering rapid heating difficult.

Furthermore, when an attempt is made to obtain a complex-shape such as a nearly volute shape as shown in FIG. 3 of the aforementioned Japanese Patent Application Laid-Open No. 7-161725 Publication, slit processing for obtaining a heat-equalizing construction is difficult, and for obtaining the high resistance as mentioned above, it is necessary to narrow the width of the member. However, at present, such a processing is difficult and expensive and when processing commensurate with the costs is carried out, the heat-equalizing properties is never satisfactory.

Furthermore, in the above-described SiC heater member or Mo—Si heater member, an electric load density required for suppressing deterioration resulting from sublimation is merely approximately 20 W/cm$^2$ and as a result, there was a limit in shortening of temperature rising speed. Also in these heater members, a sufficient heat resistance strength was not obtained in the complex-shape requiring a bend portion.

In the past, as a heater for a semiconductor heat treatment apparatus, a metal heater has been used sometimes. However, the metal heater had a problem in that metallic contamination was liable to occur, and the quality was liable to be unstable.

For enhancing the heat treatment efficiency of semiconductors, a heater capable of being rapidly raised and decreased in temperature is necessary. However, since the metal heater is high in thermal capacity, there was a limit in the improvement of these properties.

Further, since the metal heater is generally high in thermal capacity of supplementary equipment such as heat insulating materials, there was an inconvenience that the rapid temperature rising and decreasing were difficult.

Then, a carbon material, which is small in thermal capacity and excellent in high-temperature resistance in a non-oxidizing atmosphere has been utilized.

However, the carbon material using a normal electrode material or the like has a problem in terms of flexibility, causing a bottleneck to designing of its shape.

Furthermore, generally, in a carbon heater using a carbon wire as a heat generating element, a carbon wire is generally arranged within a container kept in a non-oxidizing atmosphere for prevention of oxidation. Since the carbon wire becomes very high in temperature when heat is generated, a bundle of a plurality of carbon wires is used as a terminal wire.

In the past, the carbon wire has been locked by impregnation and baking using a carbon paste. In the case of a relatively small-diameter carbon wire, it was sometimes locked by screwing.

However, in the locking method using the carbon paste, the carbon paste baked element sometimes becomes peeled off leading to an occurrence of dust.

On the other hand, in the screwing type locking method, in the case where the carbon wire bundle has many wires, the screwing work was cumbersome. Further, in the case of a large-diameter carbon wire, it could not sometimes be locked firmly.

In the heater using carbon wires as a heat generating element, a terminal device is also necessary to connect a terminal wire comprising a bundle of carbon wires to a metal terminal wire.

However, a terminal device capable of positively and easily connecting both the terminal wires has not yet been proposed.

Furthermore, in general, for keeping the atmosphere in the periphery of the carbon heat generating element a non-oxidizing atmosphere, the sealing technique of the carbon heat generating element is important.

However, in the conventional sealing system in which a carbon heat generating element is sandwiches between two quartz glass plates, outer periphery of which is welded, a strain or deformation occurs due to local heating, and stress is concentrated on the welded locking portion so that there is the great possibility of breaking the quartz.

SUMMARY OF THE INVENTION

It is an objective of the present invention to provide a carbon heater which is excellent in heat-equalizing properties and flexibility, and which can be rapidly raised and decreased in temperature and can be manufactured at low cost.

The carbon heater according to the present invention comprises a heater member in which a plurality of carbon fiber bundles comprising carbon fibers, 5 to 15 μm in a diameter are woven into a longitudinally elongated shape, such as a wire shape or a tape shape, and the impurity content is less than 10 ppm in ashes.

One or a plurality of the heater member(s) can be sealed into a sealed type member made of quartz glass.

The resistance value at 1000° C. of the heater member is preferably 1 to 20 Ω/m.pce.

The sealed type member has a shape either of a double pipe shape, a straight pipe shape (146) or an annular pipe shape, and a plurality of them are combined to form a fixed shaped heating zone.

Non-oxidizing gas can be filled a space formed in said sealed type member made of quartz glass.

The space formed in said sealed type member made of quartz can be vacuumed at less than 20 Torr.

The sealed type member can be made of a substantially integrated a plate-like quartz glass support element and hollow space is formed around the peripheral portion of said heater member.

The quartz glass support element can be integrated by fusion of the whole joining surface of a plurality of quartz glass plates, a wiring groove is formed in the surface of at least one quartz glass plate, and said heater member is arranged thereon.

The quartz glass support element is formed by fusion of two quartz glass plates, a wiring groove having a fixed depth is formed in the joining surface of at least one quartz glass plate, and the thicknesses of each quartz glass plates substracted said depth are substantially the same.

The quartz glass support element can be formed by fusion of two quartz glass plates which are different in thickness, a wiring groove having a fixed depth is formed in the joining surface of at least one quartz glass plate, and the thickness of one quartz glass plate substracted said depth is less than ½ of that of the other.

The wiring groove has a curved shape in at least a lower side of a sectional shape vertical to lengthwise thereof, and is subjected to glossing process.

The wiring groove can be interiorly joined in a reduced or non-oxidizing gas atmosphere.

The wiring groove can be a wholly "gibbous shape" in sectional shape vertical to lengthwise thereof.

The wiring groove is formed in a first quartz glass plate, a narrow inserting groove or a through-slit paired with said wiring groove in a second quartz glass plate, said first and second quartz glass plates are joined so that the grooves are opposed to each other, the surface of said second quartz glass plate is polished or ground to delete a bottom of the inserting groove or the through-slit to thereby expose it as an inserting window, said heater member is pressed therefrom into the wiring groove of the first quartz glass plate, a third quartz glass plate is adjusted to a polished surface or a ground surface, after which three quartz glass plates are fused to substantially integrate the whole surface except the groove whereby said wiring groove has a wholly "gibbous shape" in sectional shape vertical to lengthwise thereof Furthermore, even if the first quartz glass plate is applied with wiring groove processing in a "gibbous shape" and the third quartz is fused, the similar construction can be obtained.

The quartz glass support element (12) may be provided with an opaque quartz glass layer (12e).

One out of a plurality of quartz glass plates may be constituted of an opaque quartz glass plate.

The reflecting plate (15) made of carbon whose at least one surface is a mirror surface can be sealed into said substantially integrated plate-like quartz glass support element (12), and another hollow space is formed around the peripheral portion of said reflecting plate.

The heater member is arranged on the wiring grooves, which is formed in the surface of at least one quartz glass plate, and said reflecting plate is arranged on the concavity which is formed in the surface of at least one quartz glass plate and said quartz glass plates can be integrated by fusion to seal said heater member and reflecting plates.

The carbon-made reflecting plate whose at least one surface is a mirror surface is sealed into a substantially integrated wholly plate-like quartz glass support element, and said wholly plate-like quartz glass support element (22) is arranged adjacent to said quartz glass support element which seals heater member.

At least one outer surface of plate-like quartz glass support element can be formed with a gibbous portion (13a, 13b) which is semicircular or trapezoidal in section, and said outer surface being subjected to glossing process.

The sealed type member comprises a setting member made of quartz glass having a wiring groove and a lid member made of quartz glass, said heater member being arranged on said wiring groove.

The flame weir is formed on the outer peripheral portion of either said setting member or said lid member, or both members, the opposed surfaces except for said flame weir are arranged at intervals of 0.2 to 1.0 mm, and both members can be integrated by a build-up method of quartz glass.

The carbon terminals are arranged on both ends of said heater members, metal electrodes are connected to the carbon terminals, and a quartz glass pipe covers a portion of said metal electrode on the carbon terminal side.

The non-oxidizing gas is introduced into a space into which the heater members are sealed, and the gas can be discharged from the quartz glass pipe covering the electrode.

The impurity density of the carbon terminal is preferably made less than 10 ppm in ashes.

Alumina powder is arranged on the wiring groove, and the said heater member can be supported by a sintered element of the alumina powder.

The iron impurity density of the alumina powder is preferably less than 5 ppm.

The member or terminal members which are connected on both ends of said heater member are drawn substantially vertical with respect to heater surfaces formed by said heater member.

Both ends of said heater member are projected to the opposite side of the heater surface, the projected heater member is fixed by a plurality of wire-like carbons, or wire-like carbon which is woven and having at least one end divided into a plurality of parts arranged in a quartz glass tube in contact with the quartz glass support plate, and a quartz glass tube covers the quartz glass pipe to seal said sealed type member.

The other end side of said wire-like carbon is connected to a second wire-like carbon connecting member formed with a hollow portion and having a core member internally thereof by the pressing by way of said core member, a metal inscribed wire is connected by a metal wire connecting member making use of a split core, and both the connecting members are connected by a cylindrical core.

A tapered surface is formed externally of said split core, a tapered portion engaged with the tapered surface is formed on the metal wire connecting member, the metal inscribed wire is held between support portions formed in the split core and connected to the cylindrical core while pressing it.

The heater member is linear-symmetrically arranged in said sealed type member, a gas inlet and outlet is formed on the symmetrical axis, a non-oxidizing gas is introduced from the gas inlet and outlet when the containers are welded, and the gas is exhausted from the gas inlet and outlet when the containers are fused.

The heater member are fixed by a plurality of wire-like carbons or wire-like carbon which is woven and having at least an end divided into a plurality of parts arranged in a quartz glass tube, said wire-like carbon and a metal inscribed wire on the power supply side are connected by a second terminal device, said second terminal device comprising a second wire-like carbon connecting member for connecting a plurality of wire-like carbons, or wire-like carbons having at least an end divided into a plurality of parts, a metal wire connecting member adapted to connect the metal inscribed wire making use of a split core, and the second wire-like carbon connecting member (643) and the metal wire connecting member are connected by the cylindrical core.

The quartz glass tube and said second terminal device are sealed into a quartz glass pipe.

A third terminal device wherein the metal inscribed wire arranged internally of said quartz glass pipe and a circumscribed wire on the power supply side are connected through a Mo foil, said Mo foil being sealed by a pinch seal portion made of quartz glass.

The heater member is linear-symmetrically arranged in said sealed type member, a gas inlet and outlet is formed on the symmetrical axis, a non-oxidizing gas is introduced from the gas inlet and outlet when the containers are welded, and the gas is exhausted from the gas inlet and outlet when the containers are fused.

The sealed type member is in the form of a split mold which is wholly a flat plate semicircular in shape and has a slit in the center. Preferably, the combination of the two forms a circular flat plate heater and jig may passed the center thereof.

The terminal members are projected to the opposite side of the heater surface, and the quartz glass pipe covers the terminal member to seal the quartz glass member.

The terminal portion body (523) is arranged on the free end side of said quartz glass pipe (513), and said terminal member (521) and the terminal portion body (523) are connected by a plurality of wire-like or wire-like carbons, which is woven and having at least an end divided into a plurality of parts.

The heater member formed of carbon wire and the wire-like carbon are connected by the first terminal device, and the wire-like carbon and the metal inscribed wire on the power supply side are connected by the second terminal device, said first terminal device comprising the terminal member, said heater member being connected to the heater member connecting portion formed on one end side thereof, and the first wire-like carbon connecting member for connecting a plurality of or wire-like carbons having an end divided into a plurality of parts, the first wire-like carbon connecting member being connected to the other end side of the terminal member, the first wire-like carbon connecting member being formed into hollow and arranging the core member internally thereof the divided wire-like carbon being connected by being pressed by the core member, said second terminal device comprising a second wire-like carbon connecting member for connecting a plurality of or wire-like carbons having an end divided into a plurality of parts, a metal wire connecting member adapted to connect the metal inscribed wire making use of a split core, and a terminal portion body for connecting the second wire-like carbon connecting member and the metal wire connecting member, and both the connecting members are connected to one end and the other end of the terminal portion body.

A third terminal device wherein said heater member and said first and second terminal devices are sealed into the quartz glass pipe, the metal inscribed wire arranged internally of said quartz glass pipe and the circumscribed wire on the power supply side are connected through the Mo foil, said Mo foil being sealed by the pinch seal portion made of quartz glass.

The sealed type member having the heater member sealed therein comprises a flat plate-like container made of quartz glass or alumia.

The heater member is supported in a non-contact manner within the flat plate-like container by a plurality of terminal members and wire support jigs and sealed.

A substantially cylindrical hole portion for inserting a bolt is formed lengthwise of said terminal member, and a substantially cylindrical lateral hole at least extending through said hole portion is formed, whereby said heater members are inserted into said lateral hole, and a bolt having a length at least reaching the lower end of said lateral hole is rotatably inserted into said hole portion.

Preferably, the diameter of the substantially cylindrical hole portion for inserting a bolt is made larger than that of the substantially cylindrical lateral hole, and the heater member inserted into the lateral hole is pressed by the bolt and flattened so as to reach the hole portion.

Preferably, an expansion graphite sheet is intervened between the bolt and the heater member.

Preferably, the wire support jig comprises a single transparent alumina or an assembly member of high purity carbon and transparent alumina.

Preferably, a portion of said assembly member in contact with the heater member is formed of a high purity carbon material, and a portion of said assembly member is arranged and connected to the flat plate-like container is formed of a transparent alumina material.

Preferably, the reflecting plate made of carbon can be arranged under the heater member.

The heat generating surface of said flat plate-like container is formed with a gibbous portion which is semicircular or trapezontal in section, said surface being subjected to glossing.

The sealed type member having said heater members sealed therein may have a curved shape.

A plate-like carbon heater having said heater member sealed into said plate-like quartz glass support element, and the quartz glass support element substantially integrated, except for the peripheral portion of the heater member, is pressed between a die made of carbon having a fixed shaped section and a male die made of carbon paired therewith to curve the plate-like carbon heater into a fixed shape.

The die and said male die made of carbon have a shape which is semicircular in section to provide a substantially semicylindrical carbon heater.

The reflecting plate made of carbon at least one surface of which is a mirror surface is sealed into said plate-like quartz glass support element independently of said heater members.

The summary of the invention according to the first group will be described hereinafter.

It is an objective of the invention according to the first group to provide a carbon heater particularly for a semiconductor manufacturing apparatus which is excellent in heat-equalizing property and flexibility and which can be manufactured at low costs.

The carbon heater according to the invention of the first group comprises a heater member in which a plurality of carbon fiber bundles comprising carbon fibers having a diameter of 5 to 15 μm are used, and woven into a longitudinally elongated shape, such as a wire shape and a tape shape, and the impurity content is less than 10 ppm in ashes.

With this, the tensile strength at a high temperature is secured as a heater member, and the contactness of the carbon fibers is uniform lengthwise whereby the uneven heat generation lengthwise can be reduced.

Here, the diameter of each of the carbon fibers bundled in plural is 5 to 15 μm in diameter because when they are less than 5 μm in diameter, the fibers one by one are weak to make it difficult to provide a heater member in which the fibers are bundled and woven into a fixed longitudinally elongated shape. Furthermore, if the fibers are fine, the number of fibers for obtaining a fixed resistance value increases, which is not practical. In the diameter exceeds 15 μm, the flexibility is so poor that the carbon fiber bundle bundled in plural is difficult to be woven, and in addition, there occurs an inconvenience that the carbon fibers are cut and the material strength lowers.

Furthermore, the impurity of the carbon heater is limited to 10 ppm or less in ashes because if the impurity exceeds 10 ppm, the heater is oxidized a minute amount of oxygen tends to be oxidized, and because of abnormal heat generation tends to occur.

Actually, it has been confirmed that if the impurity exceeds 10 ppm in ashes, abnormal heat generation occurs in 10 minutes in the atmosphere at 800° C., and in the atmosphere in which oxygen of 100 ppm is present in nitrogen, when it is used for 10 hours at 800° C., abnormal heat generation occurs.

On the other hand, it has been confirmed that when the impurity is less than 10 ppm in ashes, even if it is used for 50 hours or more in the atmosphere in which oxygen of 100 ppm is present in nitrogen, abnormal heat generation does not occur, and that in the atmosphere at 800° C., abnormal heat generation does not occur if less than 10 minutes.

Preferably, the impurity is less than 3 ppm in ashes. In this case, particularly the effect for suppressing the abnormal heat generation increases, and longer life can be achieved.

Preferably, the heater member is one in which 100 to 800 carbon fibers of 5 to 15 μm are bundled, and three or more, preferably, 6 to 12 bundles described above are bundled and woven into a longitudinally elongated shape, such as a wire shape and a tape shape.

When the number of carbon fibers bundled is less than 100, 6 to 12 bundles are not enough to obtain fixed strength and resistance value, making it difficult to achieve weaving. Further, if the number of the fibers is small, the weaving comes loose with respect to partial rupture to make it difficult to maintain the shape. When the number exceeds 800, the number bundled for obtaining the fixed resistance value reduces to make it difficult to maintain the wire shape formed by weaving.

Furthermore, preferably, for the heater member, the resistance value at 1000° C. is 1 to 20 Ω/m.pce. The reason is that in a general heating device for manufacturing a semiconductor, it is necessary to match the transformer capacity in the past.

That is, when the resistance value exceeds 20 Ω/m.pce., since the resistance is high, the length of the heater cannot be taken long and heat is taken away between terminals and uneven temperature tends to occur.

On the other hand, when the resistance value is less than 1 Ω/m.pce., since the resistance is low conversely, the length of the heater needs be taken long more than as necessary. There is a large possibility that uneven temperature occurs due to the uneven tissue of the elongated heater member such as a carbon wire and a carbon tape and the uneven atmosphere.

It is noted that the electric resistance value at 1000° C. of the heater member is 2 to 10 Ω/m.pce. for obtaining the aforementioned properties with higher reliability.

Furthermore, by weaving the carbon fiber bundles, the diameter of the heater member which is substantially circular in sectional shape can be fixed lengthwise, and as a result, the heat generation amount can be stabilized lengthwise. Furthermore, by this weaving, it is possible to form a fluffing state caused by the carbon fibers on the surface of the heater member described later. The heater member is heated whereby the thermal expansion occurs for itself For example, if the heater member stretched between two terminals is one not woven, sagging occurs and an uneven heat generation occurs. However, by being woven, no such a problem does not occurs.

In the invention according to the first group, preferably, the carbon fibers to be materials for the carbon heater are ones which are not solidified with resins and integrated, unlike the conventional C/C. This is because the flexibility of the carbon fibers is impaired, and the fibers are cut due to the thermal contraction of resins.

Preferably, one of said heater member or a plurality of the heater members are arranged in parallel which sealed into the sealed type member made of quartz glass or transparent alumina to constitute, for example, a carbon heater for a semiconductor manufacturing apparatus.

Thereby, the heater member can be used under various conditions such as an oxidized atmosphere, a high temperature atmosphere or the like.

Particularly, the heater member is made of quartz, whereby higher high-purity can be achieved, which is effective for the semiconductor manufacturing apparatus.

It is noted that the arrangement of a plurality of heater members means that two heater members or more are arranged adjacent to each other and substantially in parallel over the fill length of the heater members. Thereby, the electric resistance value of the whole carbon heater can be easily adjusted, and the state in which a plurality of heater members are adjacent to each other, that is, are in contact at many places lengthwise, whereby even if there occurs an inconvenience such that for example, a single heater member is partly cut at a fixed portion, the aforementioned contact portion is present in the vicinity thereof thus preventing an uneven heat generation resulting from the aforementioned inconvenience.

Further, the sealed type member termed herein means of course a member for physically sealing the heater member with a material made of quartz glass or transparent alumina, and also means a substantially sealed member in which a construction for introducing into and discharging nitrogen or another non-oxidizing gas from the heater member is added, as described later, and as a result, the heater member is prevented from contacting with open air (air).

The shape of the container can be either a double tube shape, a straight tube shape, or an annular shape and the like.

A plurality of quartz glass or transparent alumina containers having shapes as described are combined to form a heating zone having a fixed shape whereby an article to be processed matched to the shape can be uniformly heated.

Furthermore, preferably, the nitrogen or another non-oxidizing gas is introduced into the container or the container is placed at vacuum less than 20 Torr. Thereby, it is possible to prevent the carbon heater from being deteriorated and a longer life and duration of heat-equalization for a long period of time are enabled.

Next, the summary of the invention according to the second group will be described.

It is a first objective of the invention according to the second group to provide a carbon heater which can uniformly heat-treat an article to be heated, for example, such as a semiconductor (wafer), which can maintain a strength at a high temperature for a long period of time, and which can obtain a high durable life.

It is a further objective of the invention according to the second group to provide a carbon heater in which in a state where stress is not concentrated on a quartz glass support element constituting a sealed member for supporting a heater member in which a plurality of carbon fiber bundles having a plurality of carbon fibers are woven into a longitudinally elongated shape, such as a wire shape and a tape shape, sealing can be carried out positively, and moreover, a thickness of a quarts glass support element for supporting the heater member can be set freely.

In the carbon heater according to the second group, the heater member is sealed into the substantially integrated plate-like quartz glass support element, and a hollow space is formed around the peripheral portion of the heater member.

The substantially integrated constitution termed herein refers to the state where in case the carbon heater according to the present invention is manufactured without a joining material by fusing a plurality of joining surfaces of quartz glass plates as described later, the peripheral portion of the carbon heater is fused such that the space in the carbon heater such as a groove furnished with the heater member and a terminal portion is cut its connection with the outside (atmospheric air or atmosphere in a furnace) through the fused portion, and further inner quartz glass contact surfaces are overall fused. However, any non-fused portion may be allowed to be in existence, so far as nothing interferes with the effect of fusion, if it is in the order of less than 30% in area relative to the contact area. The reason for such a value in the order of less than 30% is because a radiative light emitted from the heater member is prevented from being uneven.

Thereby, the close contact can be carried out positively in the form in which no concentration of stress on the quartz glass support element for supporting the heater member, and even in the case where a quarts glass plate of low strength having a thickness of 5 mm or less is used, no break of the quartz glass occurs under the reduced environment.

In the carbon heater according to the second group, the quartz glass support element is integrated by fusion of the whole joining surface of a plurality of quartz glass plates. Preferably, a wiring groove is formed in the surface of at least one quartz glass plate, and said heater member is arranged thereon.

As described above, the constitution wherein a heater member is arranged in which a wiring groove is formed in the surface of at least one quartz glass plate, a plurality of carbon fiber bundles having a plurality of carbon fibers having a diameter of 5 to 15 μm are used and woven, into the wiring groove, into a longitudinally elongated shape, such as a wire shape and a tape shape, and the impurity content is less than 10 ppm in ashes, provides a construction in which the carbonic heater member is placed in contact with the sealed type member made of quartz glass by a number of carbon fibers having a diameter of 5 to 15 μm fluffed the surface of the heater member in the shape of wire or in the shape of tape. Therefore, even in the state that the heater member is energized and heated to a high temperature, the reaction between the carbon and the quartz glass progresses, and as a result, the carbon heater member can be prevented from being deteriorated. (It is supposed that since the carbon fibers fluffed on the surface of the heater member come in contact with the sealed type member made of quartz glass, silicifying progresses from the contact portion but since the diameter thereof is extremely fine and the volume is small the silicifying reaction is suppressed from progressing with respect to the whole heater member.) That is, this means that the uneven heat generation is prevented from occurring, and the durable life can be prolonged.

It is noted that one heater member or two or more heater members which is arranged can be arranged in parallel in order to adjust the heat generation amount or to stabilize the quality. In this case, preferably, two-stage grooves corresponding to the number of heater members are further provided in the bottom of the wiring groove.

The carbon heater according to the invention of the second group is a carbon heater in which the heater member is sealed into the quartz glass support element, and the quartz glass support element is substantially integrated and hollow space is formed around the peripheral portion of the heater member, whereby the quartz glass support element is formed by fusing two quartz glass plates, at least one quartz glass plate is formed in the surface with a wiring groove having a fixed depth, and thicknesses of the quartz glass plates subtracted said depth portion are the same. Thereby, the equal radiation by the carbon heater can be made vertically.

The other carbon heater according to the invention of the second group is a carbon heater in which the heater member is sealed into the quartz glass support element, and the quartz glass support element is substantially integrated and a hollow space is formed around the peripheral portion of the heater member, whereby the quartz glass support element is formed by fusing two quartz glass plates different in thickness, at least one quartz glass plate is formed in the joining surface with a wiring groove having a fixed depth, and a thickness of one quartz glass plate subtracted said depth portion is less than ½ of that of the other. Thereby, since the radiation with respect to one is made large. Either of two forms of carbon heaters capable of making radiation small as described above can be suitably selected depending on positions where they are arranged.

Further, preferably, in the carbon heater according to the invention of the second group, the wiring groove has a curved shape at least on the lower side of a curved shape vertical to lengthwise thereof more preferably, glossing process being applied thereto. Of course, the whole of the cross section may be made curved.

Thereby, in fusing a plurality of quartz glass plates together, it is possible to prevent, to the utmost, a cross-sectional shape of the wiring groove from being thermally deformed to come in face contact with the carbon wire, and to prevent the carbon wire from being deteriorated due to the reaction between the quartz glass and the carbon.

This results from the fact that the curve-shaped curvature is provided interiorly of the groove due to the curved shape as described above to scatter the stress to enable suppression of deformation in the groove.

Furthermore, it is possible to suppress the accumulation of internal strain of the quartz glass support element due to the thermal deformation, and to prevent an inconvenience such as crack. Moreover, it is possible to prevent an uneven heat generation as the carbon heater due to the absorption of heat generation amount from the heater member resulting from the face contact.

The glossing process by heating the wiring groove for a fixed period of time by means of an oxygen-hydrogen burner is intended that in the normal state in which a number of irregularities are present when a wiring groove is formed in the quartz glass plate by machining, in the case where the carbon heater is heated so that the wiring groove is heated, there assumes a local heating state particularly in the gibbous portion out of the irregularities resulting in the construction in which the polishing process is done sparsely to generate an uneven heating by the carbon heater, which has to be prevented.

Preferably, in the carbon heater according to the invention of the second group, the quartz glass plates is joined under the reduced or non-oxidizing gas atmosphere in the interior of the wiring groove. The reason is to prevent the carbon wire from being oxidized and deteriorate during the manufacture.

Another carbon heater according to the invention of the second group is a carbon heater in which the heater member is sealed into the plate-like quartz glass support element, and the quartz glass support element is substantially integrated and a hollow space is formed around the peripheral portion of the heater member, whereby the wiring groove is a wholly "gibbous shape" in sectional shape vertical to lengthwise thereof.

With this, in arranging the carbon wire in the wiring groove, it is possible to prevent the wire from being levitated upward, improving workability. Furthermore, it is possible to relieve the heat strain caused by flexure particularly in the upper side (upper plate) of the groove in the periphery of the groove.

Here, the shape of "gibbosity" means such a configuration that to the approximately central portion of the upside of a long sideways rectangle, either a regular square having a side shorter than the above-mentioned upside or a long sideways rectangle having an upside shorter than the above-mentioned upside is connected.

Furthermore, in the carbon heater according to the invention of the second group, preferably, a wiring groove is formed in a first quartz glass plate, a narrow inserting groove or a through-slit paired with the wiring groove is formed in a second quartz glass plate, the first and second quartz glass plates being joined so that the grooves are opposed to each other, the surface of the second quartz glass plate is polished or ground to delete the bottom of the inserting groove or the through-slit to thereby expose it as an inserting window, from which said heater member is forced into the wiring groove of the first quartz glass plate, a third quartz glass plate is adjusted to the polished surface or the ground surface, after which three quartz glass plates are fused so that the whole surface of portion except the groove is substantially integrated, whereby the wiring groove has a wholly "gibbous shape" in sectional shape vertical to the lengthwise thereof.

Thereby, it is possible to positively improve the workability and relieve the thermal strain.

Still another carbon heater according to the invention of the second group is a carbon heater in which the heater member is sealed into the plate-like quartz glass support element, and the quartz glass support element is substantially integrated and a hollow space is formed around the peripheral portion of the heater member, whereby the quartz glass support element has an opaque quartz glass layer.

Furthermore, out of a plurality of quartz glass plates, one may be an opaque quartz glass plate.

Thereby, the radiation with respect to the side which is not desired to be heated by the carbon heater can be prevented by the opaque quartz glass layer.

In the still another carbon heater according to the invention of the second group, the heater member and the reflecting plate made of carbon at least one side of which is a mirror surface, are sealed into the substantially integrated plate-like quartz glass support element, and a hollow space is formed around the peripheral portion of said heater member and another hollow space is formed around the peripheral portion of said reflecting plate.

In this case, preferably, in the case where three quartz glass plates are used. A heater member is arranged on the wiring groove, which is formed in the surface of at least one quartz glass plate, and said reflecting plate is arranged on the concavity which is formed in the surface of at least one quartz glass plate, and said quartz glass plates are integrated by fusion to seal said heater member and reflecting plate.

Thereby, it is possible to suppress radiation in a direction of the reflecting plate and increase radiation to the surface in one direction. Further, the presence of the reflecting plate causes heat radiated to be uniformly accumulated and dispersed to make a temperature distribution within the heater surface even.

Particularly, the reason why carbon is selected is that a carbon material is easily subjected to purifying process, and by using the highly purified carbon material, it is possible to prevent metal contamination with respect to the heater member and articles to be processed caused by diffusion of impurities.

Still another carbon heater according to the invention of the second group is a carbon heater in which the heater member is sealed into the plate-like quartz glass support element, and the quartz glass support element is substantially integrated and a hollow space is formed around the peripheral portion of the heater member, whereby a carbon-made reflecting plate at least one side of which is a mirror surface is sealed into the wholly plate-like glass support element, and said wholly plate-like quartz glass support element is arranged adjacent to said quartz glass support element which seals the heater member.

Thereby, it is possible for the reflecting plate to extremely easily interrupt and reflect radiation to protect portions not desired to be heated.

In the carbon heater according to the invention of the second group, preferably, even in any form as described above, at least one outer surface of the plate-like quartz glass support element is formed with a gibbous portion which is semicircular or trapezoidal in section, the outer surface being subjected to glossing process. Thereby, there can be obtained the prism effect in which heat generation upward of the heater surface caused by a linear heat generating element like the heater member according to the present invention can be made uniform by the scattering of light.

Normally, there is employed a method for sand-blasting the heater surface in order to obtain the similar effect. In this case, however, the surface is the meshes of sand, and radiation from the surface is suppressed so that heat is accumulated in the quartz glass itself to lower the energy efficiency. In this sense, the glossing process is an important matter.

Furthermore, in the carbon heater according to the invention of the second group, preferably, the terminal members are connected on both ends of the heater member is drawn substantially vertical with respect to the heater surface forming the heater member. The terminal members are drawn vertically to the heater surface to thereby make large the fusion surface of the quartz glass support element, which is advantageous in terms of strength.

Furthermore, the terminal member can be constituted as a carbon terminal. By the provision of the carbon terminal, it is possible to make a temperature of the carbon terminal lower than the carbon heat generating element to prevent oxidization even in the case where it comes in contact with some oxygen. Of course, if non-oxidizing gas is introduced into the periphery of the carbon terminal, the oxidization can be thoroughly prevented.

The carbon terminal is also useful in a sense of eliminating direct contact between the metal electrode on the power supply side and the heater member.

Preferably, a quartz glass pipe covers at least a portion on the carbon terminal side of the metal electrode. The exposed portions of the metal electrode and terminals are arranged outside the furnace of the heat semiconductor manufacturing apparatus. By covering the inner portion of furnace of the metal electrode as described, it is possible to reduce contamination by impurities such as Fe and Al from the metal electrode.

Another carbon heater according to the invention of the second group is a carbon heater in which one or a plurality of the heater members a sealed type member made of quartz glass, the sealed type member being curved.

This enables the provision of a curved type carbon heater, which is less in uneven heat generation, can maintain the strength at a high temperature for a long period of time, can obtain a highly durable life, and has a shape, for example, in which a cylinder is divided into two parts, capable of heat-treating uniformly rods on which for example, articles to be heated such as semiconductors (wafers) are arrayed.

In the curved type carbon heater, preferably, a plate-like carbon heater in which the heater member is sealed into the plate-like quartz glass support element, and the quartz glass support element is substantially integrated and a hollow space is formed around the peripheral portion of the heater member is pressed between a carbon-made female die having a fixed shape section and a carbon male die paired therewith, the plate-like carbon heater being curved into a fixed shape.

With this, there is obtained a curve-shaped carbon heater in which the heater member is sealed into the quartz glass support element, and the quartz glass support element is substantially integrated and a hollow space is formed around the peripheral portion of the heater member. Thereby, the fusion can be positively carried out in the form that the stress concentration on the quartz glass support element for supporting the heater member does not occur, and even in the case where a quartz glass plate of low strength whose thickness is less than 5 mm is used, no break occurs in the quartz glass under the reduced environment.

Preferably, the carbon male die and female die have a semicircular shape in section, and a substantially semicylindrical carbon heater is provided Furthermore, preferably, a carbon-made reflecting plate at least one surface of which is a mirror surface is sealed into the plate-like quartz glass support element independently of the heater member. This is because of protecting non-heating portions and of stopping radiation.

Next, the summary of the invention according to the third group will be described.

In the aforementioned invention according to the first group, the carbon heater is constituted using flexible carbon wires into which carbon fibers are woven. By using the carbon wires as described above, a freedom in shape of the heater is created, and the advantage in design and handling can be enjoyed.

It is an objective of the invention according to the third group to provide a carbon heater, for example, for a semiconductor manufacturing apparatus, which uses the carbon wire-like heater member as described above, which can considerably improve the durable life and can be rapidly risen and decreased in temperature.

The carbon heater according to the invention of the third group is a carbon heater in which one or a plurality of heater members, each of which comprises a plurality of carbon fiber bundles, having a plurality of carbon fibers whose diameter is 5 to 15 $\mu$m, said carbon fiber bundles being woven into a longitudinally elongated shape such as a wire shape and a tape shape, and the impurity content is less than 10 ppm in ashes, are sealed in parallel into a sealed type member made of quartz glass, said sealed type member comprising a setting member made of quartz glass having a wiring groove and a lid member made of quartz glass, said heater members being arranged in the wiring groove.

By the aforementioned construction, the uneven heat generation is less, that is, semiconductors (wafers) as articles to be heated can be uniformly heat-treated, the strength at a high temperature can be maintained for a long period of time, and the high durable life can be obtained.

The surface of the heat generating element in which a plurality of carbon fiber bundles, having a plurality of carbon fibers woven into a wire configuration, is formed into the construction fluffed with carbon fibers whose diameter is 5 to 15 $\mu$m. It has been confirmed therefrom that a substantial contact area between quartz and carbon becomes extremely small and as a result, the carbon heater can be used for a considerably long period of time even at 1350° C. or so.

In the carbon heater according to the invention of the third group, preferably, a flame-proof weir is formed on the outer peripheral portion of either of the setting member or the lid member or the other party, the opposed surfaces except for the flame-proof weir are arranged at intervals of 0.2 to 1.0 mm, and both the members are integrated by a build-up method of quartz glass.

In covering the setting portion made of quartz glass and the lid member, preferably, both the members are fixed without clearance by the build-up deposition of quartz glass in the state where they are parted substantially in parallel at fixed intervals. When the outer peripheral portions of both members are deposited or build-up deposited, for example, in the state that they are placed in contact substantially in the whole area, crevices or cracks occur in both the members, or either of the members as a result of heating the outer peripheral portion, whereas according to the aforementioned fixing, a firm covering is possible without occurrence of such problems as noted above. This is contemplated to be based on the fact that concentration of thermal stress caused by partial heating during heat treatment process and warping of the setting member and the lid member due to a difference in temperature.

By the presence of the flame-proof weir in the preferred form as described above, it is possible to prevent, to the utmost, the flame of an oxygen-hydrogen burner as a heating source from moving in between the members to oxidize the carbon heater inside. Furthermore, the spacing between the setting member and the lid member can be made uniform over the whole region. Furthermore, it is possible to prevent a white cloud on the outer peripheral portions of the setting member and the lid member, caused by $SiO_2$ fine powder from occurring to improve the heat equalizing property of the present carbon heater.

It is important in this invention according to the third group that the surface of the flame-proof weir in contact with the mating member be heated and deposited in the whole surface. Because if a portion not deposited but merely placed in face contact is present, the crevices or cracks as described above occur during deposition.

The flame-proof weir can be provided integrally when both members having a fixed shape are formed, or can be provided by welding it to the outer peripheral portions later.

Preferably, the opposed surfaces of both members are arranged at intervals of 0.2 to 1.0 mm. This is because is the interal is less than 0.2 mm, the crevices or cracks of both the members cannot be prevented sufficiently, and if it exceeds 1 mm, there is a large possibility that flame for deposition tends to enter so that the carbon heater is oxidized.

Furthermore, in the carbon heater according to the invention of the third group, preferably, carbon terminals are arranged on both ends of the heater member, electrodes are connected to the carbon terminals, and quarts glass pipes cover portions of the electrodes on the carbon terminal side.

By the providing of the carbon terminals, it is possible to make the carbon terminals lower in temperature than the heater member, so that even if some oxygen enter, the oxidization can be prevented. Particularly, if non-oxidizing gas is introduced from the periphery of the carbon terminals, the oxidization can be prevented more thoroughly.

Furthermore, when the heater member and the metal electrode are in direct contact, the life of the heater member lowers due to metal contamination. The intervention of the carbon terminal is useful in a sense of eliminating the contact between the heater member and the metal electrode.

Preferably, a quartz glass pipe covers at least a portion of the metal electrode on the carbon terminal side. The exposed portions of the metal electrode and terminal are arranged outside the furnace. By covering the in-furnace portion of the metal electrode with quartz glass, it is possible to reduce the impurity contamination by Fe, Al or the like from the metal electrode.

Preferably, the concentration of impurities of the carbon terminal is less than 10 ppm in ashes. Because thereby it is possible to suppress the deterioration of the heater member to prolong the life.

Preferably, non-oxidizing gases such as nitrogen, argon gas and the like are introduced into the heater. It is possible to prevent the heater member from being oxidized by introducing the non-oxidizing gases.

The metal electrode connected to the carbon terminal may also generate impurities when the temperature rises, but if the non-oxidizing gas is discharged from the quartz glass pipe storing the metal electrode, the generation of impurities can be prevented.

Furthermore, preferably, for the metal electrode, molybdenum (Mo) is used. This is because the thermal expansion coefficient of Mo approximates that of carbon material so that the excellent joining with the carbon terminal is maintained even at a high temperature.

As the heater member, preferably, the heater member mentioned in the invention of the first group is used.

The setting member and the lid member can be the flat plate.

Furthermore, in the carbon heater according to the invention of the third group, preferably, for positively suppressing the reaction between the heater member made of carbon and the setting member made of quartz glass, alumina powder is arranged in an arranging groove, and a heat generating element is supported by a sintered element of alumina powder.

Thereby, it is possible to increase the maximum operation temperature of the carbon heater up to 1350° C. or so.

The sintered element of alumina powder is formed by placing the alumina powder and the heater member in the set concavity, and thereafter performing a heat treatment at about 1300° C.

Furthermore, preferably, the concentration of iron impurity in alumina powder is suppressed to 5 ppm or less so that the life of the carbon heater member is not lowered due to the iron contamination.

It is noted that the carbon heater according to the invention of the third (and first group and second group) group can be applied not only to semiconductor manufacturing apparatuses for oxidization, diffusion, CVD or the like of semiconductors, but also to all kinds of apparatuses including manufacturing apparatuses involving some heating in the washing apparatus.

Next, the summary of the invention according to the fourth group will be described.

It is an objective of the invention according to the fourth group to provide a carbon heater for, for example, a semiconductor manufacturing apparatus, which uses the carbon wire-like heater member having the merits as mentioned above, which can considerably improve the durable life, and which can be rapidly raised or decreased in temperature.

It is a further objective of the invention according to the fourth group to provide a carbon heater of a simple construction capable of positively and easily connecting the heater member and a terminal wire formed of wire-like carbon, and further, a terminal wire formed of wire-like carbon and a terminal wire made of metal.

The carbon heater according to the invention of the fourth group is a carbon heater in which the heater member is sealed into a plate-like quartz glass support element and the quartz glass support element is substantially integrated and a hollow space is formed around the peripheral portion of the heater member, the heater member or a terminal portion of the heater member is drawn substantially vertical to a heater surface.

According to the constitution as described above, the heater can be easily arranged in semiconductor manufacturing apparatus which heats the semiconductor wafers from the lower side or upper side of said wafers. This heater is excellent in in-plane equalizing property and long in durable life.

The preferred form of the above-described heater is as mentioned in the invention according to the first group.

One form of the carbon heater according to the invention of the fourth group has the construction in which the heater member itself is drawn substantially vertically to a heater surface forming the heater member (this will be described in detail hereinafter as the invention of the 4th-1 group). In this case, preferably, both ends of the heater member are projected on the side opposite to the heater surface, the projected heater member is fixed by a plurality of wire-like carbons, or wire-like carbon which is woven and having at least an end divided into a plurality of parts arranged in a quartz glass tube in contact with the quartz glass support plate, and the quartz glass tube covers the quartz glass pipe to seal the sealed type member.

Thereby, the heater member can be connected firmly and positively to the terminal wires formed of the wire-like carbon. It is also possible to prevent an inconvenience such as spark, because the wire comes in contact with a plurality of wires of the same kind to lower the contact resistance.

Furthermore, according to the constitution as described above, because there is less foreign matter other than the heater member within the sealed type member, there is a tendency that the uneven heat generation on the heater surface is further reduced as compared with the method for arranging the terminal member on the end of the heater member as described later within the sealed type member made of quartz glass to connect it to the terminal wire.

In the carbon heater according to the invention of the 4th-1 group, preferably, the other end side of the wire-like carbon to be the terminal wire is connected to the second wire-like carbon connecting member formed with a hollow portion and having a core member internally thereof by pressing in the core member, the metal inscribed wire is connected by the metal wire connecting member making use of a split core, and both the connecting members are connected by the terminal portion body positioned in the middle thereof.

Particularly, by the method for connecting a plurality of wire-like carbons making use of the pressing in the core member, it is possible to suppress the contact resistance to prevent the generation of spark. Furthermore, it is possible to place the metal inscribed wire in contact with the carbon terminal member in the wide surface by the method for connecting the inscribed wire using the split core to prevent the generation of spark.

The method for connecting an inscribed wire by the metal wire connecting member making use of the split core, preferably, particularly comprises forming a tapered surface on the outside of the split core, forming a tapered portion in engagement with the tapered surface on the metal wire connecting member, placing the metal inscribed wire between support portions formed on the split core, and connecting the inscribed wire to cylindrical core while pressing it. Thereby, the contact resistance can be suppressed to prevent spark.

Furthermore, preferably, the heater member is linear-symmetrically arranged in the sealed type member, and a gas inlet and outlet are formed on the symmetrical axis so that non-oxidizing gas is introduced from the gas inlet and outlet when the container is welded, and the gases are discharged from the gas inlet and outlet when the container is fused. Thereby, the oxidization prevention of carbon and the heater in-plane temperature distribution can be made uniform.

As it can be understood from the above-described explanation, in the carbon heater according to the invention of the 4th-1 group, more preferably, the heater member formed from the carbon wire and the wire-like carbon are fixed by a plurality of wire-like carbons or wire-like carbon which is woven and having at least an end divided into a plurality of parts arranged in a quartz glass tube in contact with the quartz glass support plate, and the wire-like carbon and the metal inscribed wire on the power supply side are connected by the second terminal device, the second terminal device comprising a second wire-like carbon connecting member for connecting a plurality of wire-like carbons or wire-like carbon which is woven and having at least an end divided into a plurality of parts, a metal wire connecting member constituted to connect a metal inscribed wire making use of a split core, and a terminal portion body for connecting the second wire-like carbon connecting member and the metal wire connecting member, and both the connecting members are connected to the cylindrical core.

All the series of electric connecting systems including the heater member arranged on the quartz glass sealed member, the terminal wire formed of a plurality of wire-like carbons, the second wire-like carbon connecting member, the terminal portion body, the metal wire connecting member, and the metal inscribed wire connecting member can be cut off from open air by the above constitution and the constitution in which the heater members and the second terminal device are sealed into the quartz glass tube having a plurality of wire-like carbons or wire-like carbon which is woven and having at least an end divided into a plurality of parts, arrayed therein and the quartz glass tube, respectively, and as a result, there can be provided a carbon heater capable of preventing all the member constituting the series of electric connecting systems from being oxidized and securing the long life and the stabilized heat-equaling property.

For making the carbon heater according to the invention of the 4th-1 group optimum, it is further important to provide the constitution in which the metal inscribed wire arranged internally of the quartz glass tube and the circumscribed wire on the power supply side are connected through the Mo foil and the Mo foil is fused by the pinch seal portion made of quartz glass.

On the other hand, in the case where the inscribed wire is taken out and pinched as it is, there occurs an inconvenience that cracks or the like occur in the pinch seal made of quartz glass due to a difference in thermal expansion coefficient between Mo and quartz to impair the sealing property. In order to overcome such inconvenience as noted above, the inscribed wire is pinched by quartz glass and sealed through a Mo foil element.

In the carbon heater according to the invention of the fourth group, a quartz glass container can be made into a flat plate doughnut shape having an opening in the center thereof. Further, there can be formed a doughnut-like flat plate heater by combining split molds which are wholly flat plate semicircular and have a cut in the center portion. This is for of providing a construction for inserting a shaft for supporting an article to be processed into a doughnut-shaped center opening.

Furthermore, preferably, heat generating elements are linear-symmetrically arranged within the quartz glass container, a gas inlet and outlet is formed on the symmetrical axis, the container is assembled by welding while introducing non-oxidizing gas from the gas inlet and outlet, and the container is reduced and fused at normal temperature while discharging gases from the gas inlet and outlet.

Preferably, the quartz glass container is fused under the reduced or non-oxidizing gas atmosphere less than 0.2 atmospheric pressure at normal temperature.

One form of the carbon heater according to the invention of the fourth group has the constitution in which the terminal members are connected on both ends of the heater member is drawn vertically with respect to the heater surface formed by said the heater member (this will be described in detail hereinafter as the invention of the 4th-2 group). In this case, preferably, the terminal members are connected to both ends of the heater member and projected to the opposite side of the heater surface, and the quartz glass tube covers the terminal member to seal the quartz glass member.

In the carbon heater according to the invention of the 4th-2 group, more preferably, in addition to the aforementioned form, the constitution in which the terminal portion body is arranged on the free end side of the quartz glass tube is provided, and the terminal member and the terminal portion body are connected by a plurality of wire-like carbons or wire-like carbon which is woven and having at least an end that can be divided into plurality of parts. Thereby, the resistance at the terminal wire portion can be lowered to suppress heat generation at there. Furthermore, it is possible to suppress the heat transmission to the lower sealing terminal by heat transfer due to the small heat conduction.

Furthermore, preferably, the heater members are linear-symmetrically arranged in the sealed type member, and a gas inlet and outlet are formed on the symmetrical axis so that non-oxidizing gas is introduced from the gas inlet and outlet when the container is welded, and the gas is discharged from the gas inlet and outlet when the container is fused. Thereby, the prevention of oxidization of carbon and the heater in-plane temperature distribution can be made uniform.

Furthermore, in the carbon heater according to the invention of the 4-2 group, preferably, the terminal member connects the heater member and the plurality of wire-like carbons, a first wire-like carbon connecting member for forming a heater member connecting portion and collectively connecting a plurality of wire-like carbons or wire-like carbon which is woven and having at least an end divided into a plurality of ends is provided on one end side thereof the first wire-like carbon member is connected to the other end side of the terminal member, the first wire-like carbon connecting member is made hollow to arrange a core member internally thereof and the plurality of wire-like carbons are pressed by the core member and connected. More preferably, the terminal member and the connecting end side of the other party of the first wire-like carbon connecting member are formed with internal threads, an intermediate member is formed with internal threads, and both the members are connected through the intermediate member.

In more preferable forms, the other end side of the wire-like carbon is connected to a second wire-like carbon connecting member formed with a hollow portion and having a core member internally thereof by the pressing of the core member, a metal inscribed wire is connected by a metal wire connecting member making use of a split core, both the connecting members are connected by a terminal portion body positioned in the middle thereof a tapered portion in engagement with a tapered surface is formed on the terminal portion body, the metal inscribed wire is placed between support portions formed on the split core, and the metal inscribed wire connected to the terminal portion body while pressing it to provide a Mo-made metal rod; and the wire-like carbon connecting member and the terminal portion body, and the terminal portion body and the metal wire connecting member are respectively connected in the thread manner.

Furthermore, in the carbon heater according to the invention of the 4th-2 group, a carbon heater formed from carbon wires and a wire-like carbon are connected by the first terminal device, the wire-like carbon and the metal inscribed wire on the power supply side are connected by the second terminal device, the first terminal device comprising a terminal member, the heater member being connected to a heater member connecting portion formed on one end side thereof, a first wire-like carbon connecting member for connecting a plurality of wire-like carbons or wire-like carbon which is woven and having at least an end divided into a plurality of parts, the first wire-like carbon connecting member being connected to the other end side of the terminal member, the first wire-like carbon connecting member being connected, the first wire-like carbon connecting member being formed to be hollow and having a core member arranged internally thereof and the divided wire-like carbon is connected by the pressing of the core member; and the second terminal device comprising a second wire-like carbon connecting member for connecting a plurality of wire-like carbons or wire-like carbon which is woven and having at least an end divided into a plurality of parts, and a metal wire connecting member for connecting the metal inscribed wire making use of a split core, and a terminal portion body for connecting the second wire-like carbon connecting member and the metal wire connecting member, and both the connecting members are connected to one end side and the other end side of the terminal portion body. In the optimum example, a third terminal device is provided in which the heater member and the first and second terminal devices are sealed into the quartz glass tube, the metal inscribed wire arranged internally of the quartz glass tube and the circumscribed wire on the power supply side are connected through a Mo foil, the Mo foil being sealed by a pinch seal portion made of quartz glass.

The carbon heater according to the invention of the 4th-2 group has substantially the same operation and effect as the carbon heater according to the invention of the 4th-2 group except for the provision of the first wire-like carbon connecting member.

The summary of the invention according to the fifth group will be described hereinafter.

It is an objective of the invention according to the fifth group to provide a carbon heater for, for example, a semiconductor manufacturing apparatus, which is excellent in heat-equaling property and flexibility, and which can be manufactured at low costs.

A further objective thereof is to provide a carbon heater capable of reducing an uneven heat generation and improving the durable life.

The carbon heater according to the invention of the fifth group is a carbon heater constructed such that a plurality of heater member each having a plurality of carbon fiber bundles with a plurality of carbon fibers having a diameter of 5 to 15 $\mu$m are woven into a longitudinally elongated shape like a wire shape and a tape shape, and the impurity content thereof is less than 10 ppm in ashes, are sealed in parallel into a sealed type member made of quartz glass, said sealed type member having the heater member sealed therein being a flat plate-like container made of quartz glass or alumina.

Particularly, preferably, the heater member is supported and sealed in non-contact manner with the flat plate-like container by a plurality of terminal members and a wire support jig.

This is because the deterioration of the heater members is to the utmost prevented accompanied with the reaction of the carboneous heater members and a flat plate-like container made of quartz glass under high temperature.

Further, preferably, a substantially cylindrical hole portion for inserting a bolt is formed lengthwise of the terminal member, a substantially cylindrical lateral hole at least extending through the hole portion is formed, the heater members being inserted into the lateral hole, and a bolt having a length at least reaching a lower end of the lateral hole is rotatably inserted into the hole portion. With this, it is possible to easily and positively hold the elongated heater members.

Preferably, in the above construction, a diameter of substantially cylindrical hole portion for inserting a bolt is made larger than the width of the substantially cylindrical lateral hole, and the heater members inserted into the lateral hole is pressed by the bolt and deformed into flat so as to reach the hole portion. Thereby, the elongated heater members can be connected to the rod-like terminal member firmly and without electric loss. Preferably, in the above construction, an expansion graphite sheet is intervened between the bolt and the heater member. Thereby, cutting of the carbon fibers forming the heater members when the bolt is fastened can be reduced to the utmost.

Preferably, the wire support jig is formed from a single transparent alumina or an assembled member of high purity carbon and, transparent alumina. More preferably, in the assembled member, a portion in contact with the heater member is formed of a high purity carbon material, and a portion for arranging and connecting the assembled member to the flat plate-like container is formed of transparent alumina material. The transparent alumina is capable of maintaining high levels of non-reactive property and electric insulating property with respect to carbon material at a high temperature. Particularly, according to the assembled member of the latter, even if the rapid change in temperature of the heat generating element should occur, the life of parts is prolonged without giving rise to crack and break in the wire support jig.

More preferably, the construction in which a carbon-made reflecting plate is arranged under the heater member.

Particularly, by providing of a reflecting plate having an upper surface subjected to mirror-face processing, it is possible to reduce the transfer of heat toward the lower side of the carbon heater and considerably improve the heat-equalizing property and the temperature-rising rate above the carbon heater.

Furthermore, the heater member, the rod-like terminal portion, and the wire support jig are sealed into the sealed type quartz glass-made container or the transparent alumina-made container to thereby constitute a carbon heater effective particularly for a semiconductor manufacturing apparatus.

At that time, preferably, a branch pie is suitably mounted on the container so that nitrogen or another non-oxidizing gas is flown from the branch pipe, and the container is made at vacuum less than 20 Torr. This is because the heater members are prevented from being deteriorated to enable the maintenance of the long life and the heat-equalizing property for a long period of time.

Furthermore, preferably, in the carbon heater according to the invention of the fifth group, the heat generating surface of the flat plate-like container is formed with a gibbous portion which is semicircular or trapezoidal in section, and the surface thereof is subjected to glossing process to thereby obtain the prism effect in which heat generation upward the heater surface caused by a linear heat generating element such as a carbon wire can be made uniform by the scattering of light.

Normally, a method for sand-blasting the heater surface is employed in order to obtain the similar effect. In this case, however, since the surface is in the form of the meshes of sand, radiation from the surface is suppressed so that heat is accumulated on the quartz glass itself to lower the energy efficiency. In this sense, the glossing process is an important matter.

Further, the heater surface of the carbon heater can be made larger in diameter than the article to be processed. Since the carbon material is small in heat capacity, the heater surface is made large in diameter whereby the temperature-rising rate can be further increased and the equalizing property with respect to the article to be treated can be improved.

BRIEF DESCRIPTION OF THE DRAWINGS

FIG. 36 is a plan view showing a further modified example of the heater unit shown in FIG. 33;

FIG. 37 is a perspective view showing a sixth embodiment of a carbon heater according to the invention of a first group;

FIGS. 38(A) and (B) are respectively perspective views showing a heater unit shown in FIG. 37, (C) and (D) being side views thereof;

FIG. 39 is a perspective view showing a modified example of the heater unit shown in FIG. 38;

FIG. 60(A) shows, in the embodiment according to the invention of the fifth group, a state that a wire heat-generating element is put into a lateral hole of a terminal member, and a keep member is not put into an axial hole, (B) showing a state that after that, a keep member is fully screwed into an axial hole of a terminal member;

FIG. 61 is an explanatory view showing one arranging example of a carbon heater unit according to the invention of a fifth group;

DESCRIPTION OF THE PREFERRED EMBODIMENTS

Invention of a First Group

The preferred embodiments of the invention of a first group will be explained hereinafter with reference to FIGS. 29 to 40 and 96.

Figure 96:
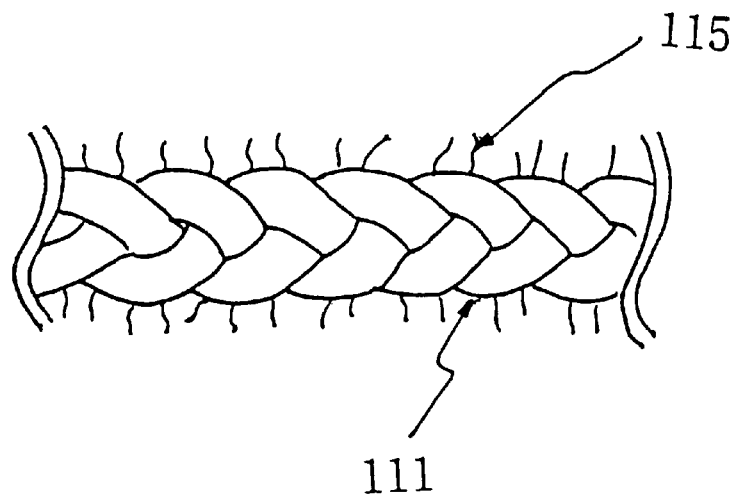
FIG. 96 shows one example of a heater member according to the invention of the 4th-1 group, showing a state that 3 carbon fiber bundles are 3-woven.

FIG. 96 is a cubic view showing a first embodiment of a carbon heater according to the invention of a first group. (This drawing shows the case where 3 carbon fiber bundles are used as described such that the woven state is most simplified.)

In this embodiment, a heater member 111 is obtained by using 3 carbon fiber bundles having 330 carbon fibers whose diameter is 7 $\mu$m bundled and weaving said bundles into a wire shape. The diameter of the carbon wire is approximately 1.2 mm.

The weaving span (this is a distance in which one wire bundle is twisted regularly with two other bundles in a longitudinal direction and returned to an original position) of the heater member having the carbon fibers woven into a wire shape is 5 to 7 mm.

Accordingly, for example, even if one carbon fiber is ruptured in the middle, the influence caused by this cut is merely limited to the length of 5 to 7 mm of the weaving span, and the full length of the heater member is not affected thereby. As a result, this effectively suppresses an unevenness of electric resistance value lengthwise of the heater member and an uneven heat generation.

Further, according to the above-described heater member, when 3 carbon fiber bundles are woven, the considerable number of carbon fibers out of 330×3 carbon fibers are cut here and there to thereby assume a state that as viewed wholly, a number of fluffs 115 of 3 to 6 mm are formed on the surface.

Figure 29:
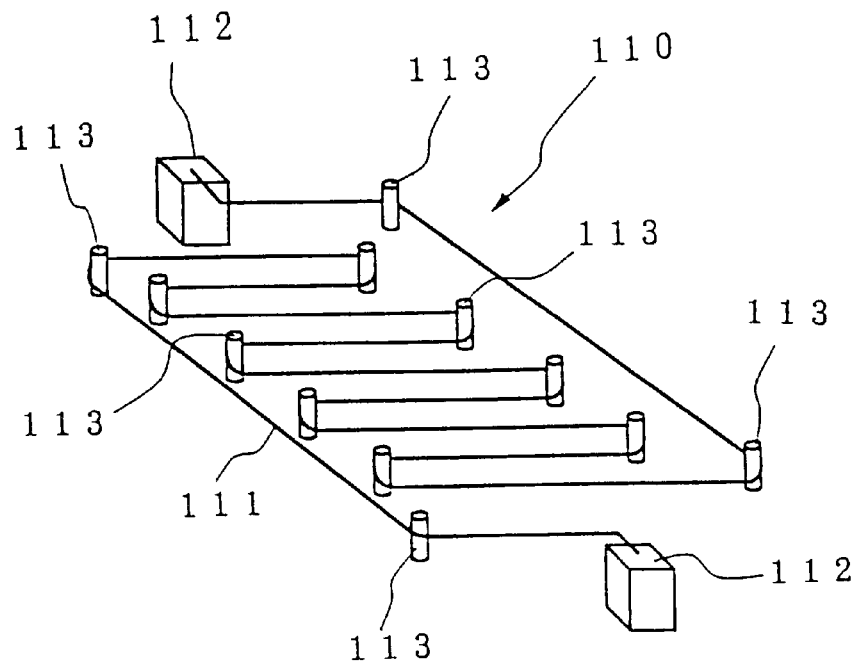
FIG. 29 is a perspective view showing a first embodiment of a carbon heater according to the invention of a first group.

FIG. 29 is a perspective view showing a second embodiment of the carbon heater for a semiconductor manufacturing apparatus according to the invention of a first group.

In this embodiment, a heater member 111 is formed from a carbon wire. The carbon wire is constituted such that 9 carbon fiber bundles having about 300 carbon fibers each having a diameter of 7 μm are woven into a wire shape. A diameter of the carbon wire is, for example, about 2 mm. The weaving span is about 3 mm, and the fluffs caused by the carbon fibers are approximately 0.5 to 2.5 mm.

Carbon electrodes 112 are connected to opposite ends of the heater member 111. The heater member 111 is supported by a plurality of alumina-made support members 113 and bended many times in one and the same plane. In this embodiment, a heating (uniform heating) zone is in the surface form.

The impurity content of the heater member 111 is less than 10 ppm in ashes. The resistance value of the heater member 111 at 1000° C. is 1 to 10 Ω/m.pce.

Figure 30:
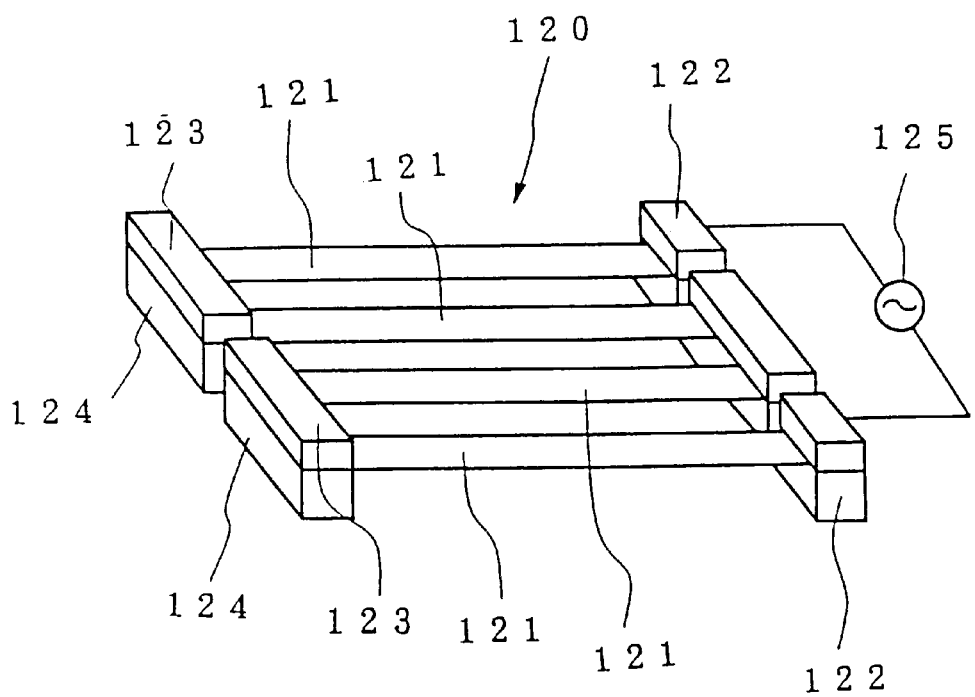
FIG. 30 is a perspective view showing a second embodiment of a carbon heater according to the invention of a first group.
Figure 31:
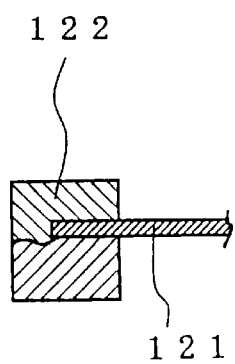
FIG. 31 is a sectional view showing the vicinity of a carbon electrode shown in FIG. 30.

FIG. 30 is a perspective view showing a third embodiment of the carbon heater. FIG. 31 is a sectional view showing the state in the vicinity of a carbon electrode 122 in the carbon heater shown in FIG. 30.

In this embodiment, a heater member 121 is formed from a carbon tape. The carbon tape is constituted such that a plurality of carbon fiber bundles having a plurality of carbon fibers are woven into a tape shape. The width of the carbon tape is, for example, about 10 mm, and the thickness thereof is, for example, about 1 mm. Also in this case, the fluffs caused by the carbon fibers is equal to the case of the above-described carbon wires.

Four heater members 121 are connected in series through support members 123, 124, and the carbon electrodes 122 are arranged on opposite ends thereof The support members 123, 124 comprise two flat plates, which are fixed with the heater member 121 sandwiched therebetween. The support member 124 on the lower side (on the foundation side) is made of quartz, and the support member 123 on the upper side is made of carbon. Also in this embodiment, the heating zone is in the surface form.

The impurity content of the heater member 121 is less than 10 ppm in ashes. The resistance value of the heater member 121 at 1000° C. is 1 to 20 Ω/m.pce.

Figure 32:
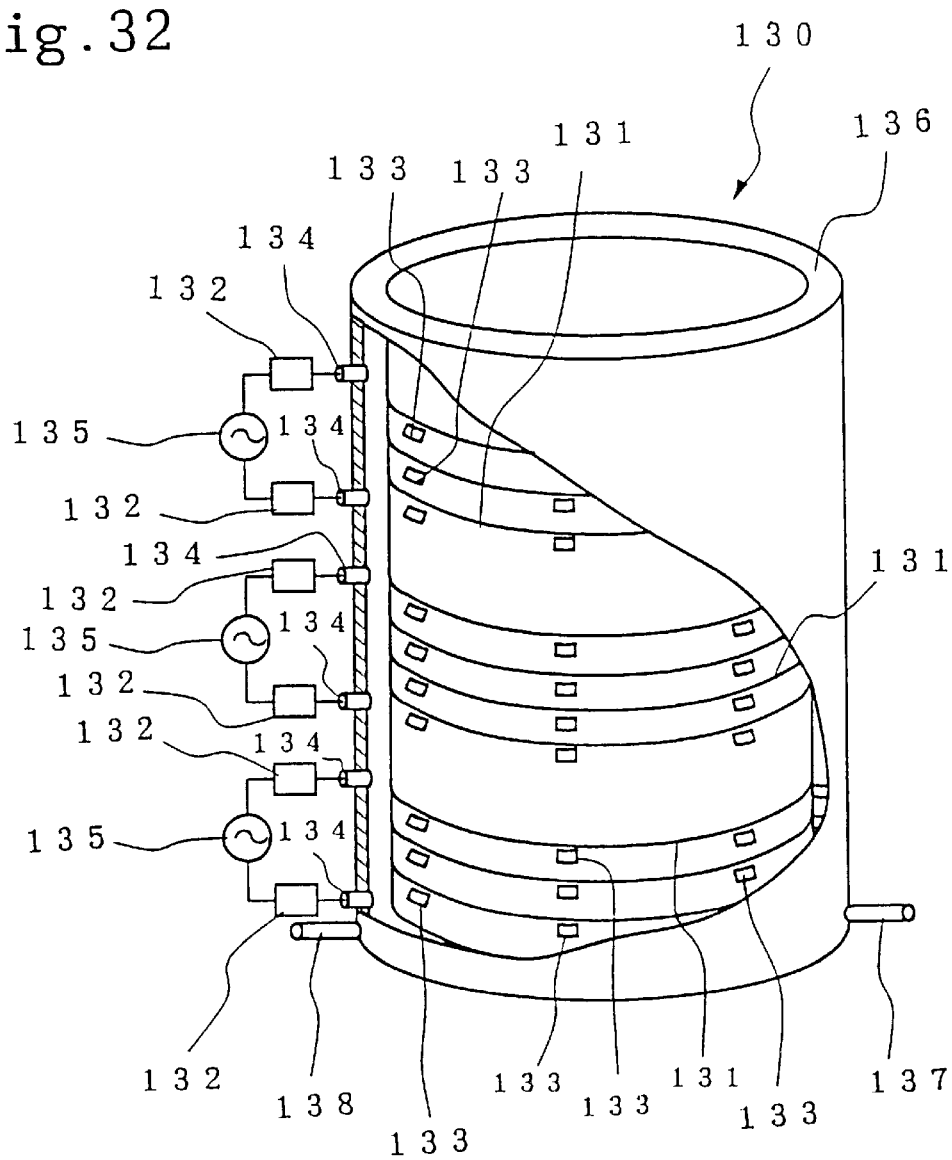
FIG. 32 is a perspective view showing a third embodiment of a carbon heater according to the invention of a first group.

FIG. 32 is a perspective view showing a fourth embodiment of a carbon heater particularly effective for a semiconductor manufacturing apparatus.

In this embodiment, a heater member 131 is spirally arranged within a quartz glass-made double pipe 136.

The heater member has the impurity concentration of less than 10 ppm in ashes to suppress oxidation and to prevent a loss of transparency of quartz glass.

The quartz glass double pipe 136 is of the sealed construction comprising an inner tube, an outer tube, and an upper and lower plates. Nitrogen gas is introduced therein or the pipe can be placed in a vacuum state of less than 20 Torr.

The heater member 131 is supported by small projections 133 made of alumina mounted on the inner tube. The projection 133 may be linear. The heater member 131 can be supported by grooves instead of the projections.

Preferably, the small projections made of alumina may be transparent alumina of high purity. Even the transparent alumina, if an attempt is made to increase a degree of rapid temperature rising, crack or break occurs in the projections due to the thermal shock, and the projection portion is preferably an assembled member of high purity carbon and transparent alumina. In this case, a portion in contact with the heater member is of high purity carbon. Quartz glass may be used in place of transparent alumina.

In this embodiment, three heater members 131 are spirally wound around the inner tube, and three heating zones are continuously formed. The temperatures in the heating regions can be balanced by forming two heating zones or more as described above. The width of zone and the number of zones can be determined suitably. The number of zones is advantageously 3 to 5 from an economical viewpoint.

The heater member 131 extends through the outer tube through mounting members 134 made of metal and is connected to a power supply 135 through graphite electrodes 132.

Figure 33:
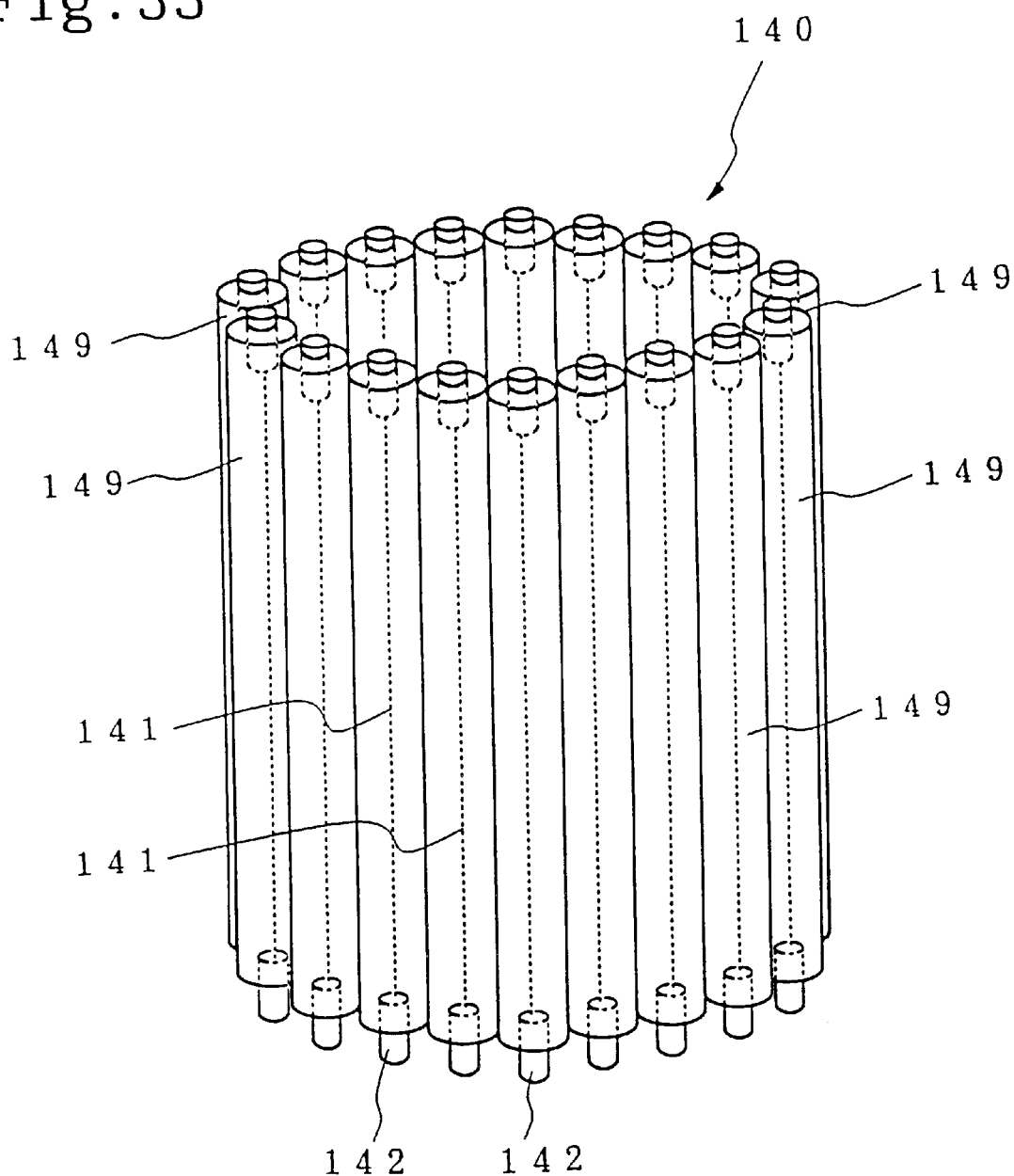
FIG. 33 is a perspective view showing a fourth embodiment of a carbon heater according to the invention of a first group.

FIG. 33 is a perspective view showing a fifth embodiment of a carbon heater particularly effective for a semiconductor manufacturing apparatus.

A carbon heater 140 is formed from a number of heater units 149.

Each heater unit 149 is constituted such that heater member 141 formed of a carbon wire is arranged on a sealed type straight tube made of quartz glass. A number of heater units 149 are cylindrically arranged so that as a whole, a cylindrical carbon heater 140 is formed.

The carbon heater 140 has a cylindrical heating zone. For heat treatment of semiconductor wafers, such a cylindrical shape as described is preferred, but a box shape may be also employed depending on articles to be heated, or from a viewpoint of determination of heating conditions.

In the case where a furnace body is constituted by using the carbon heaters 140, a plurality (for example, 3 to 5 zones) of carbon heaters 140 can be used in order to improve the temperature balance above and below the furnace body. In this case, carbon heaters different in shape and constitution can be used.

While in the above-described example, a description has been made of the case where a carbon heater unit constituting a part of the carbon heater is a tubular element, it is to be noted that the unit is not limited thereto but the carbon heater unit can be a rod-like element in which a quartz glass member is substantially integrated and a hollow space is formed around the peripheral portion of the heater member.

Figure 34:
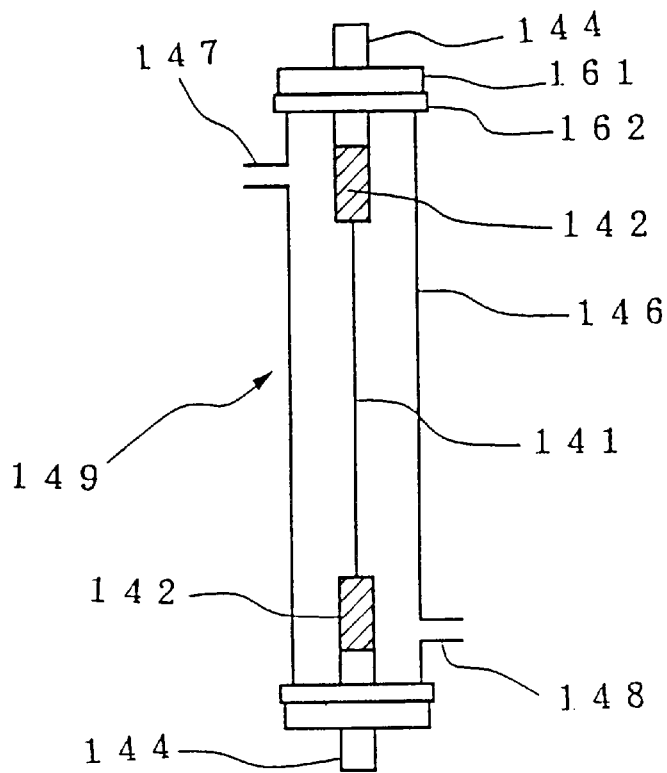
FIG. 34 is a plan view showing one example of a heater unit shown in FIG. 33.

FIG. 34 shows one example of a heater unit 149 constituting a part of the carbon heater 140.

The heater unit 149 is constituted such that opposite ends of a straight tube 146 made of quartz glass are sealed by a quartz flange 162 and a metal flange 161. A metal flange 144 provided extending through both the flanges 161 and 162, and carbon electrodes 142 are connected internally thereof. A heater member 141 is extended between two carbon electrodes 142.

Exits 147 and 148 used to introduce $N_2$ and for vacuum suction are formed in the vicinity of both ends of the straight tube 146 made of quartz glass.

Note, the metal electrode 144 may be an electrode made of carbon, but one made of metal is preferred to maintain the vacuum state.

Figure 35:
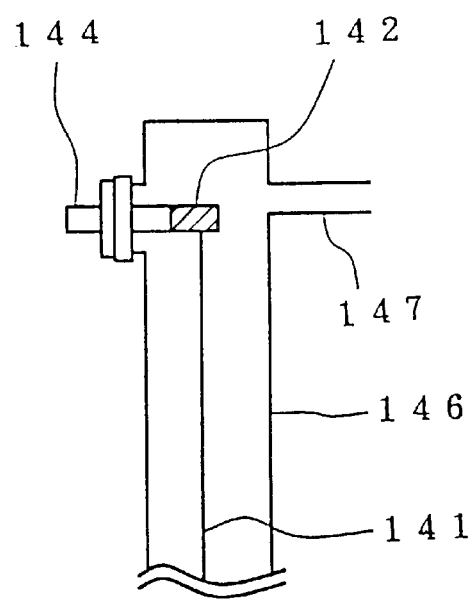
FIG. 35 is a plan view showing a modified example of the heater unit shown in FIG. 33.

FIGS. 35 and 36 show a modified example of the heater unit 149 constituting a part of the carbon heater 140.

In the heater unit 149 shown in FIG. 35, a metal electrode 144 and a carbon electrode 142 are inserted into a projecting portion from the side of a straight tube 146 made of quartz glass.

In the heater unit 149 shown in FIG. 36, the straight tube made of quartz glass is formed in the end with a wire supporting projection 143, and a heater member 141 is directed at the other end via the supporting projection 143. Because of this, the length of the heater can be made maximum to be useful in improving the heat equalization within the semiconductor manufacturing apparatus.

FIGS. 37(A) and (B) shows a sixth embodiment of a carbon heater particularly effective for a semiconductor manufacturing apparatus.

A carbon heater 150 is formed from a number of substantially annular heater units 159.

Each heater unit 159 is constituted such that a heater member 151 made from a carbon wire is arranged in a sealed type annular pipe 156 made of transparent alumina. A number of substantially annular heater units 150 are placed one upon one another in a cylindrical manner to form a heater 150 of a cylindrical type as a whole.

Examples of the heater unit 159 are shown in FIGS. 38(A), (C) and (B), (D).

In the heater unit 159 shown in FIGS. 38(A), (C), opposite ends are arranged on one and the same surface. On the other hand, in the heater unit 159 shown in FIGS. 38(B), (D), opposite ends are placed one upon one another.

The heater unit 159 is constituted such that the opposite ends of the annular tube 156 made of transparent alumina are sealed by flanges 163. The flange 163 is constituted such that transparent alumina and metal are pasted together. A metal electrode 154 extends through the flange 163, and a carbon electrode 142 is connected to the inside thereof A heater member 151 is connected between two carbon electrodes.

In the carbon heater 150 shown in FIG. 37(A), positions of electrodes 154 are in order in a longitudinal direction, and a phase occurs in the position of electrode terminals. On the other hand, in the carbon heater 150 shown in FIG. 37(B), positions of electrodes 154 can be set freely as shown.

The number of superposition of the heater units 159 can be suitably adjusted. Furthermore, each heater unit is power-controlled to thereby further improve the heat equalizing property.

In the heater unit 159 shown in FIG. 39, opposite ends of an annular tube 156 made of permeable alumina are in contact, and electrodes 154 are projected in a radial direction from the central portion in section of the tube. In the heater unit 159 of this type, the heater length can be made maximum, and the heat equalizing property of the semiconductor manufacturing apparatus body can be improved.

Although not shown in FIGS. 37 to 39, also in the annular tube 156 made of transparent alumina, piping systems are provided on opposite ends thereof so that nitrogen gases can be introduced into the tube, and the tube can also be made at vacuum.

While in the examples shown in FIGS. 37 to 39, a case has been described in which a carbon heater unit constituting a part of the carbon heater comprises a substantially annular or annular tube element, it is to be noted that the unit is not limited thereto, but a rod-like element can be employed in which the quartz glass member is substantially integrated and a hollow space is formed around the peripheral portion of the heater member.

Figure 40A:
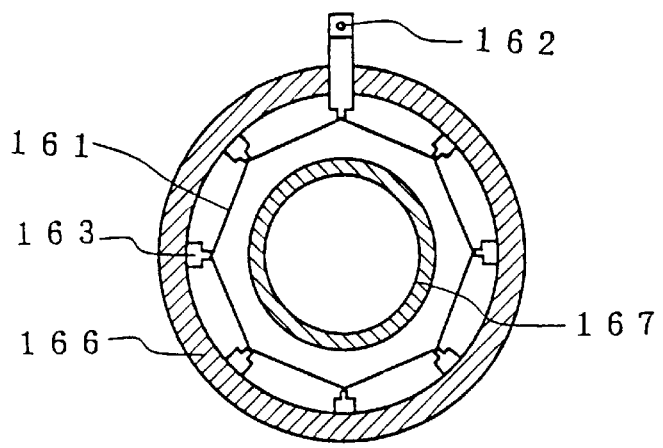
FIG. 40 shows another embodiment according to the invention of the first group, (A) being a cross sectional view, and (B) being a longitudinal sectional view.
Figure 40B:
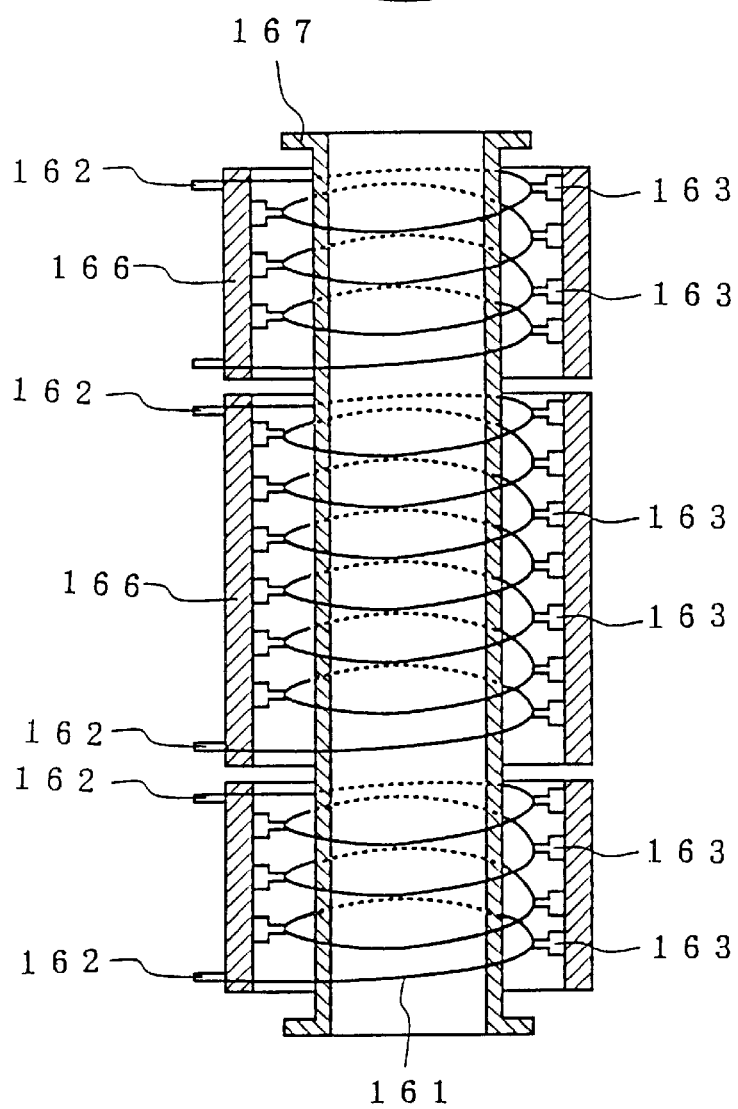

An embodiment shown in FIG. 40 will be described hereinafter.

Heater members 161 are spirally supported and sealed into a heat insulating container 166. Electrodes are installed on opposite ends of the heater member 161.

An electrode portion of the heater member 161 is formed of a carbon material. A support electrode portion 162 may be made of either metal or carbon, but preferably, an extreme end thereof in contact with the heater is made of high purity carbon in order to prevent impurity contamination.

A wire support member 163 is constituted of a non-conductive material for example, such as alumina and quartz glass.

A gap between a heater member-contained heat insulating container 166 and a furnace core tube 167 is of a sealed type, into which nitrogen can be introduced, or placing it at vacuum. The vacuum degree can be set, for example, to 20 or 10 torr or less.

A plurality of heater units can be used to provide a lengthy cylindrical heating zone.

As described above, the heater units can be placed one upon another to thereby improve the evenness of temperature distribution in the central portion. It has been confirmed that for example, in a single unit, a temperature difference of a central heater unit at 1000° C. is 50° C. or more, whereas if the heater units are of triple, the temperature difference is less than 5° C.

In a heater member in which a plurality of carbon fiber bundles having a plurality of carbon fibers are woven of the carbon heater, the thermal capacity can be made small compared to C/C, and through-put of rapid heating and rapid cooling could be materially improved. Furthermore, by using the above heater member, the uneven heat generation can be reduced compared to the case of only the carbon fibers.

Furthermore, in the conventional SiC heater, the electric load density could be raised merely to 30 W/cm$^2$, whereas in the case of using the above-described carbon wire heater, the electric load density can be raised to 30 W/cm$^2$, and as a result, the rate of heating can be tripled.

Furthermore, each heater unit is power-controlled to enable further enhancement of the heat-equalizing property.

The carbon heater particularly effective for a semiconductor manufacturing apparatus according to the invention of the first group is excellent in heat-equalizing property and flexibility, and can be manufactured at low costs.

Note, the invention of the first group is not limited to the aforementioned embodiments. The shape of the carbon heater shown is a mere illustration and can be variously modified. In the third embodiment shown in FIG. 30, a tape-like heater member can be used in place of a wire-like heater member. The carbon heater according to the present invention can be applied, not only for a sheet type heat treatment furnace for manufacturing and heating a semiconductor, but also for a longitudinal type furnace and a lateral type furnace as well Invention of the Second Group Preferred embodiments of the invention according to the second group will be described hereinafter with reference to FIGS. 1 to 28.

First, a first embodiment of the invention of a second group will be explained with reference to FIGS. 1 to 5.

Figure 1:
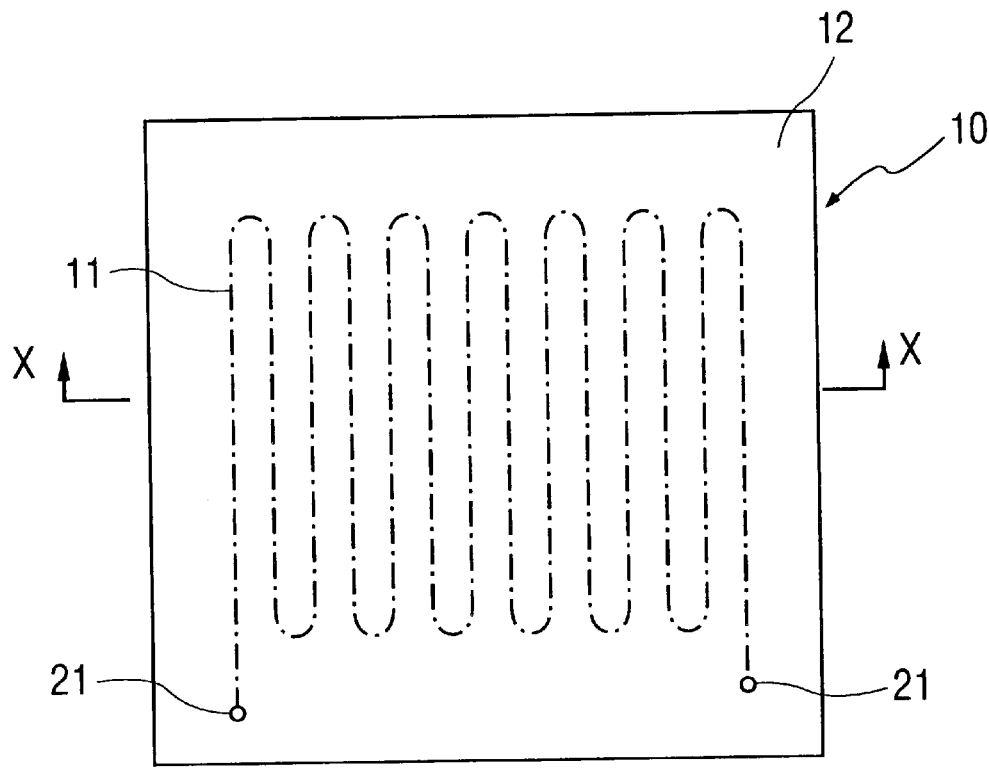
FIG. 1 is a plan view showing one embodiment of a carbon heater according to the invention of a second group.
Figure 2:
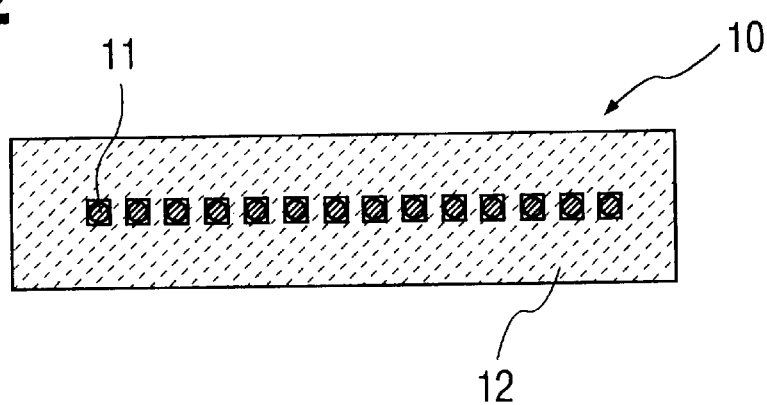
FIG. 2 is a sectional view taken on X—X of the carbon heater shown in FIG. 1.

This carbon heater 10 is a wholly rectangular flat plate-lie heater, which is constructed such that a heat member 11 is sealed into a quartz glass support element 12. The quartz glass support element 12 is substantially integrated and a hollow space is formed around a peripheral portion of the heater member 11, as shown in FIG. 2.

The heater member 11, a plurality of carbon fiber bundles comprising having a plurality of carbon fibers, are woven into a wire shape.

The heater member 11 is arranged in a zigzag fashion on substantially the center surface of the quartz glass support element 12. The wiring form may be volute or other shapes.

A specific example of the heater member is as follows. Nine (2970 in total) carbon fiber bundles having about 330 carbon fibers of a diameter 7 $\mu$m are used and woven into a wire shape with a diameter of about 2 mm. The weaving span is 3 mm, and the fluffs on the surface caused by carbon fibers are respectively 0.5 to 2.5 mm. A few or more heater members as described can be also used. When a plurality of heater members are used, the quality in connection with the heat generating properties can be stabilized.

Figure 3:
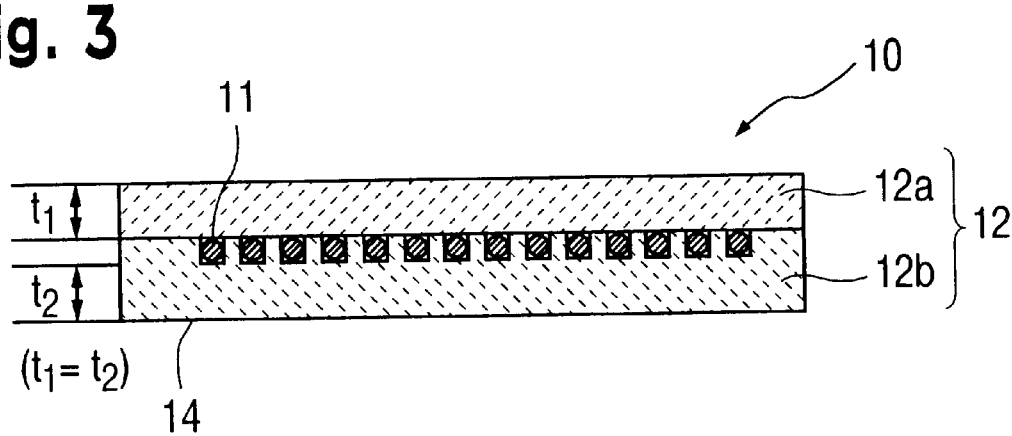
FIG. 3 is a sectional view showing an assembled state before the carbon heater shown in FIG. 1 is subjected to fusion processing.

The quartz glass support element 12 is an element in which two quartz plates 12a, 12b having a thickness in which a wire is positioned at a center are fused and integrated, as shown in FIG. 3. In a joining surface of one quartz glass plate 12b is formed a wiring groove 14 is formed for storing the heater member 11 in a groove rectangular shape in section. Thicknesses $t_1$, $t_2$ of the quartz glass plates 12a, 12b subtracting the wiring groove 14 are the same, and the heater member 11 is positioned at the center of the support element 12.

Terminal wires of the heater member 11 are drawn vertically with respect to a heater surface 13 from holes 21 with a diameter of 3 mm, for example.

Figure 4:
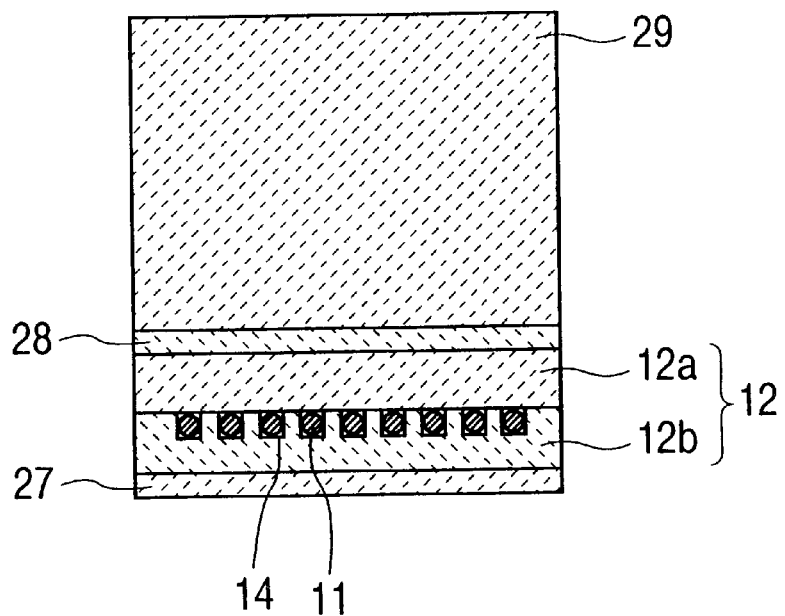
FIG. 4 is a sectional view showing a method of fusion processing the carbon heater shown in FIG. 1.

FIG. 4 shows a manner for fusion process. The quartz glass plates 12a, 12b are arranged on a lower member 27 made of carbon, an upper member 28 made of carbon is placed thereon, and a weight 29 formed of a carbon material is further placed thereon, which are subjected to setting within a heat treatment furnace.

The upper surface of the lower member 27 and the lower surface of the upper member 28 are subjected to mirror-surface processing. These carbon members are all purified articles in which impurities are less than 5 ppm.

In order to employ the constitution in which the quartz glass support element is substantially integrated the peripheral portion of the heater member as in the present carbon heater, homogeneousness of the carbon members and surface roughness of portions in contact with the quartz glass support element are particularly important. In order to obtain the adequate surface roughness and homogeneousness, it is important that the carbon members be made less than 15% in open porosity and materials having 1.8 to 2.0 g/cm$^2$ of bulk density properties are used to place them in a surface roughness state subjected to buffing or mirror-surface polishing. With this, uniform pressing to the whole quartz glass support element by the carbon members is enabled, and it is possible to prevent the heat strain from being remained into the quartz glass resulting from a difference in thermal expansion coefficient between the quartz glass and the carbon during manufacturing.

The joining surfaces of two quartz glass plates 12a, 12b are fused by maintaining at vacuum in the furnace at less than 1 torr and applying heat treatment for 0.5 to 5 hours at 1200 to 1600° C. This heat treatment is carried out longer when temperature is low and shorter when temperature is high, depending on circumstances. The joining is made so that the atmosphere of the heater member 11, that is, the atmosphere in the wiring groove is reduced or non-oxidizing atmosphere.

Cooling of the quartz glass plates is gently carried out in the vicinity of 1100° C. which is a strain point of quartz glass. The cooling rate in the vicinity of 1100° C. is set, for example, to 50 to 150° C./hr.

By such a heat treatment as described above, the whole joining surface of the quartz glass support element 12, that is, two quartz glass plates 12a, 12b can be fused and integrated. That is,the quartz glass support element is substantially integrated and a hollow space is formed around the peripheral portion of the heater member 11.

The fusion process employs a method for heating in a heat treatment furnace, that is, heating means from outside. However, not only this, but also a method for sandwiching a quartz glass plate between carbon members within a fixed furnace, energizing a carbon wire in the quartz glass plate to generate heat and fusing the quartz glass plate, or a method for sandwiching a quartz glass plate between members such as A1N or the like in place of the carbon members and heating a heater member in the quartz glass plate by high frequency induction heating can also be employed.

If such a heating means from interior is used, the fusion proceeds not from the outer periphery of the quartz glass plate but from the center side. Therefore, gases present between the quartz glass plates are taken less in at the time of fusion to cause bubbles to remain.

Figure 5:
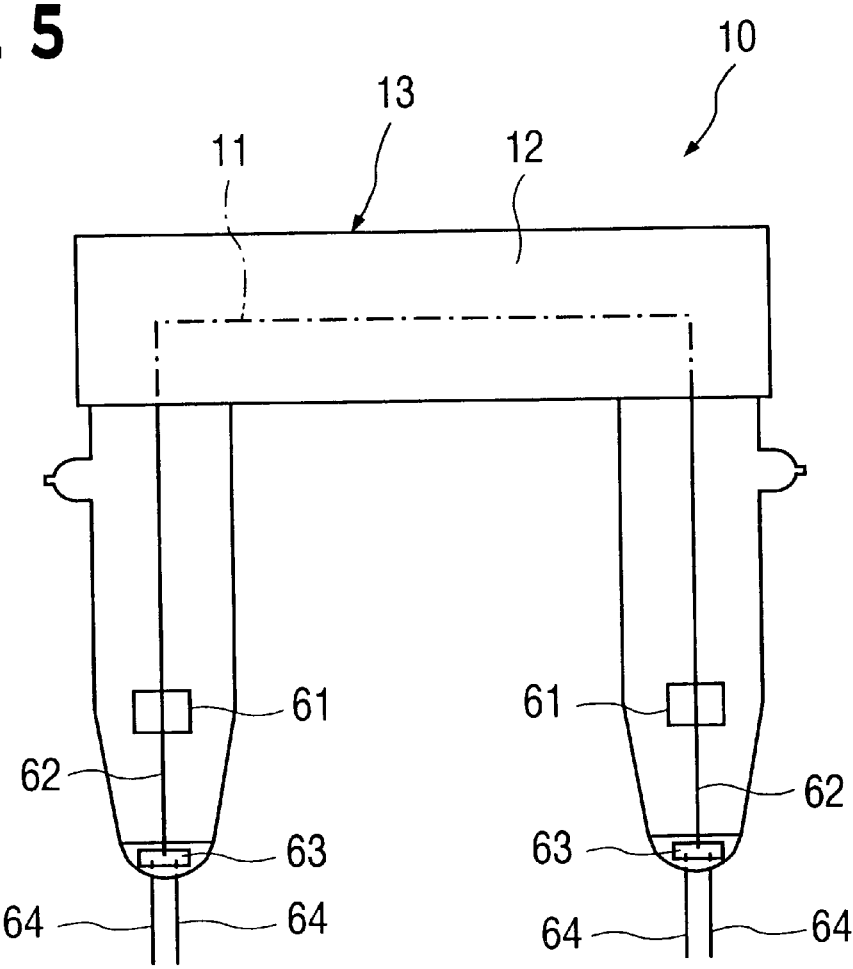
FIG. 5 is a side view showing a using state of the carbon heater shown in FIG. 1.

FIG. 5 shows one example of the operation circumstances of the carbon heater. Ends of a heater member 11 are drawn substantially vertically from the heater member 11 to a heater surface 13 and connected to Mo terminal wires 62 through carbon terminals 61. These are arranged in a glass pipe. The Mo terminal wires 62 are connected to two Mo circumscribed wires 64 through Mo foils 63. The Mo foils 63 are pinch-sealed.

A carbon heater according to a second embodiment will be explained with reference to FIGS. 6 and 7. In the thereafter embodiments, the points different from that of the first embodiment are mainly explained.

Figure 7:
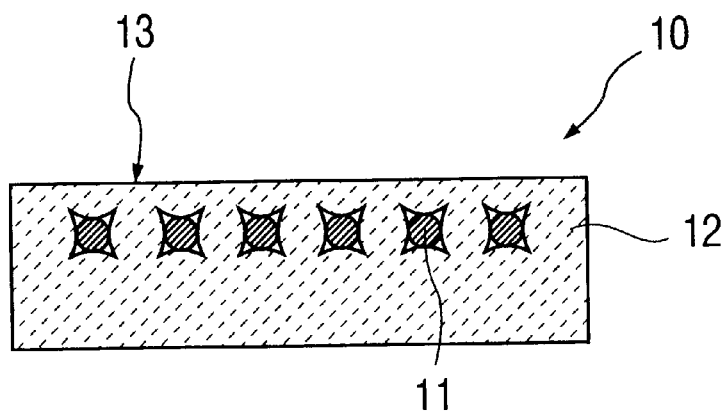
FIG. 7 is a sectional view showing a further embodiment of the carbon heater according to the invention of the second group.

In a carbon heater 10 shown in FIG. 7, a heater member 11 is arranged on the side close to a heater surface 13 as viewed thicknesswise of a quartz glass support element 12.

Figure 6:
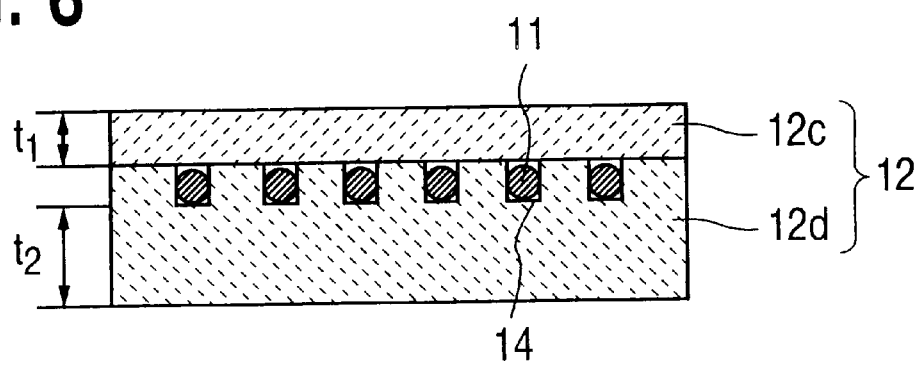
FIG. 6 is a sectional view showing an assembled state before a carbon heater shown in FIG. 7 is subjected to fusion processing.

This carbon heater 10 is formed using two quartz glass plates 12c, 12d different in thickness, as shown in FIG. 6. For example, a thickness $t_1$ of one quartz glass plate 12c can be set to less than ½ of a thickness $t_2$ of the other 12d. A groove 14 for storing the carbon heat generating element 11 is formed in the thicker quartz glass plate 12d. Here, the thickness of the quartz glass plate is a thickness not including a portion of a wiring groove.

The upper quartz glass plate 12c and the lower quartz glass plate 12d can be formed in dimensions, for example, of 100×100×3 and 100×100×7, respectively.

A carbon heater according to a third embodiment will be explained with reference to FIGS. 8 to 10.

This carbon heater 10 has an opaque (or foam) quartz glass layer 12e having a number of fine closed pore.

The opaque quartz glass layer 12e is arranged on the side opposite to the heater surface to prevent radiant heat from being transmitted downward of the heater.

Figure 8:
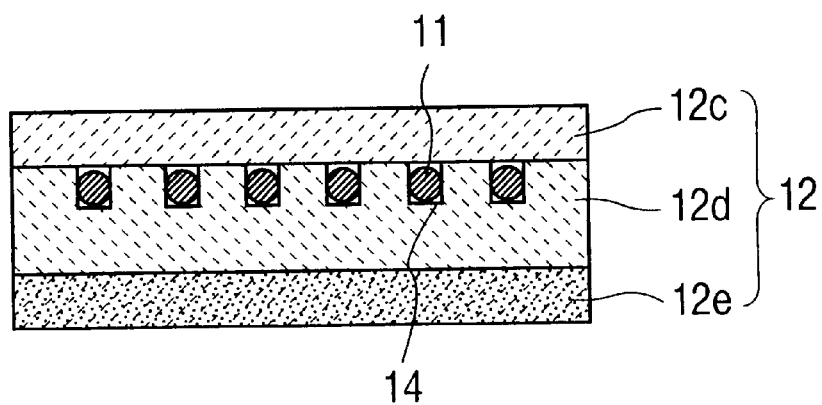
FIG. 8 is a sectional view showing an assembled state before a carbon heater shown in FIG. 9 is subjected to fusion processing.

As shown in FIG. 8, a thin quartz glass plate 12c and opaque quartz glass plate 12e are arranged above and below, respectively, a quartz glass plate 12d having a heater member 11 wired, to which is applied the fusion process. Thereby, it is possible to obtain a quarts glass support element 12 including the opaque quartz glass layer 12e and substantially integrated and a hollow space is formed around the periphery of the heater member 11, as shown in FIG. 9.

Figure 9:
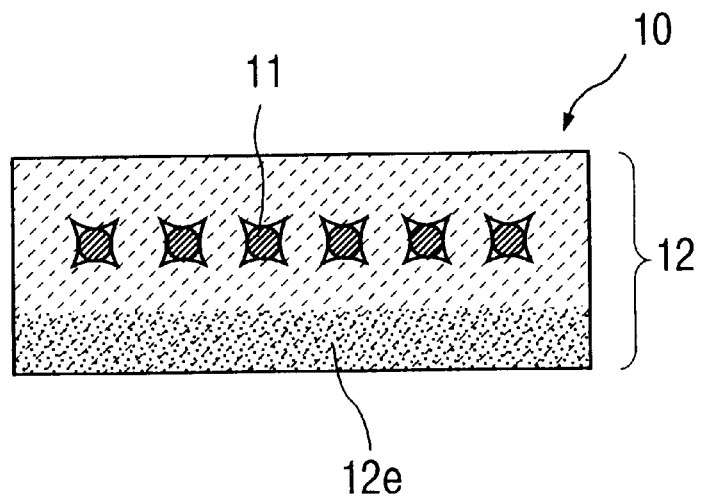
FIG. 9 is a sectional view showing another embodiment of the carbon heater according to the invention of the second group.
Figure 10:
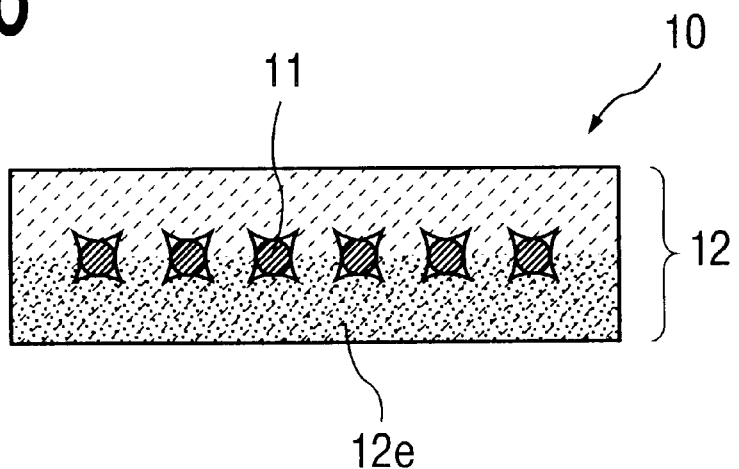
FIG. 10 is a sectional view showing still another embodiment of the carbon heater according to the invention of the second group.

FIG. 10 shows a modified example of the carbon heater 10 shown in FIG. 9. In this carbon heater 10, the opaque quartz glass layer 12e occupies about ½ of the whole thickness of the quartz glass support element 12. Further, the heater member 11 is arranged across between the opaque quartz glass layer 12e and the transparent quartz glass layer.

It is possible to improve the function for preventing radiant heat from being transmitted downward of the heater by thickening the opaque quartz glass layer 12e.

A fourth embodiment will be explained hereinafter with reference to FIGS. 11 to 13.

This carbon heater 10 has the constitution in which a heater member 11 formed of carbon fibers and a carbon-made reflecting plate 15 at least one side of which is a mirror surface are sealed into a plate-like quartz glass support element 12. The quartz glass support element 12 is substantially integrated and a hollow space is formed around the peripheral portion of the heater member 11 and the carbon-made reflecting plate 15.

Figure 11:
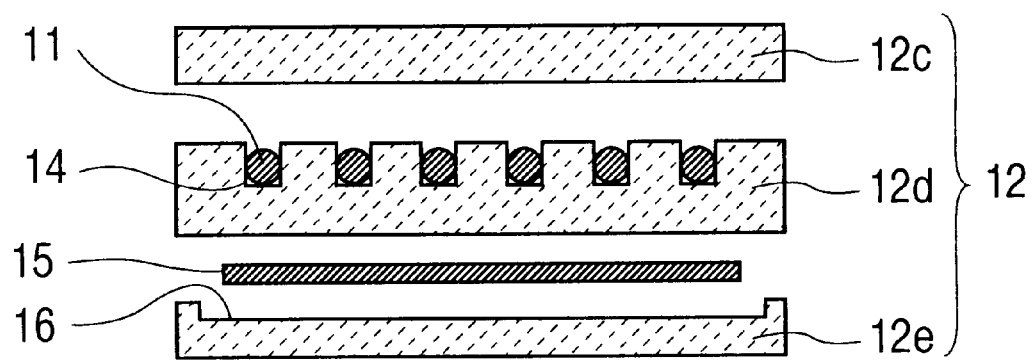
FIG. 11 is an assembly view of a carbon heater shown in FIG. 12.

A quartz glass upper plate 12c, a quartz glass middle plate 12d, a heater member 11, a carbon reflecting plate 15, and a quartz glass lower plate 12e are assembled as shown in FIG. 11, which is applied with the fusion process to thereby integrate the quartz glass support element 12 (12c, 12d, and 12e).

The quartz glass lower plate 12e is provided with a facing 16 for a carbon reflecting plate. The facing 16 is formed to be somewhat larger than the reflecting plate to absorb a heat expansion difference.

By providing of the carbon-made reflecting plate downward of the carbon heat generating element, it is possible to improve the function for preventing radiant heat from being transmitted downward of the heater and to further improve radiation upward of the heater.

A fifth embodiment will be explained hereinafter with reference to FIGS. 14 to 16.

Figure 12:
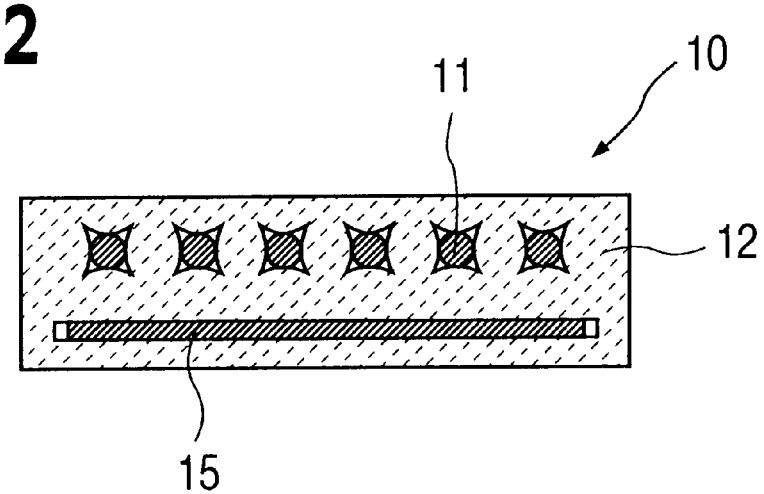
FIG. 12 is a sectional view showing still another embodiment of the carbon heater according to the invention of the second group.
Figure 13:
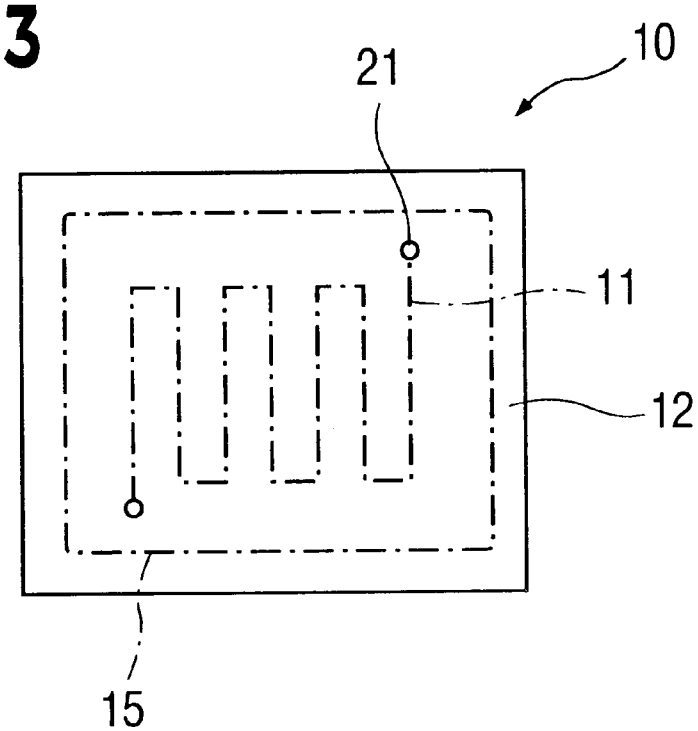
FIG. 13 is a plan view of a carbon heater shown in FIG. 12.

This embodiment shows a reflecting plate 20 for a carbon heater, which corresponds to one in which a portion of the reflecting plate is singly removed from the carbon heater 10 provided with a reflecting plate (FIGS. 11 to 13).

That is, the reflecting plate 20 for a carbon heater has the constitution in which a carbon-made reflecting plate 15, at least one side of which is a mirror surface is sealed into a plate-like quartz glass support element 22. The quartz glass support element 22 is substantially integrated and a hollow space is formed around the peripheral portion of the reflecting plate 15.

Figure 14:
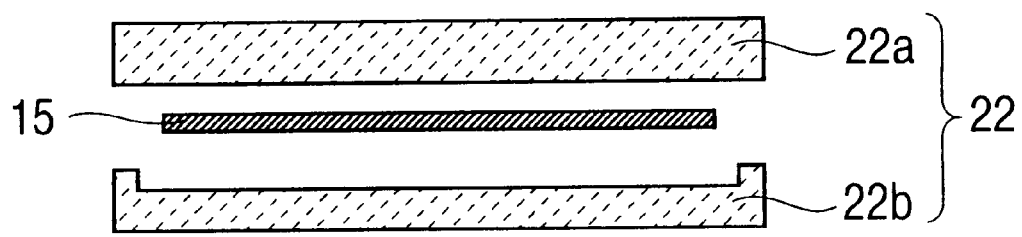
FIG. 14 is an assembly view of a reflecting plate for a carbon heater shown in FIG. 15.

A quartz glass upper plate 22a, a carbon-made reflecting plate 15, one side of which is a mirror surface, and a quartz glass lower plate 22b having a setting groove for a reflecting plate are assembled as shown in FIG. 14, which is applied with the fusion process to thereby integrate the quartz glass support element 22 (22a, 22b).

Figure 17:
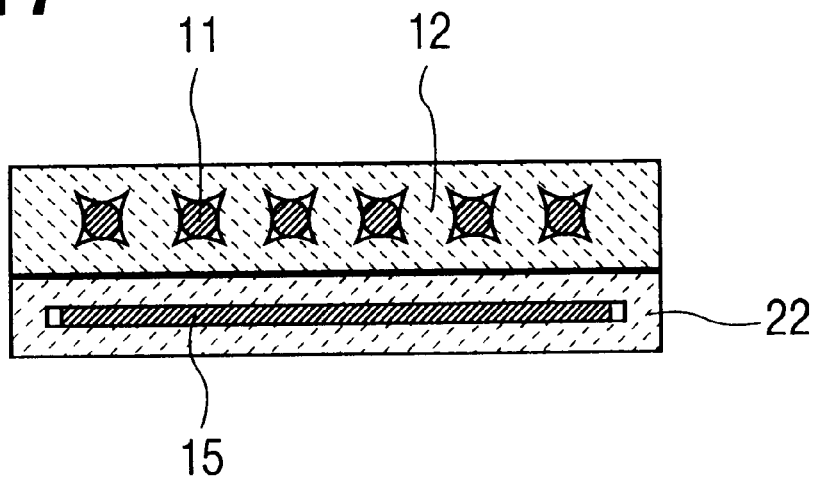
FIG. 17 is a sectional view showing one example of a manner for arranging the carbon heater and the reflecting plate for the carbon heater according to the invention of the second group.

The quartz glass support element 22 sealing the reflecting plate 20 for a heater, takes one form of the carbon heater according to the present invention, for example, by superposing it on the lower surface of the carbon heater shown in FIG. 7, as shown in FIG. 17.

Figure 15:
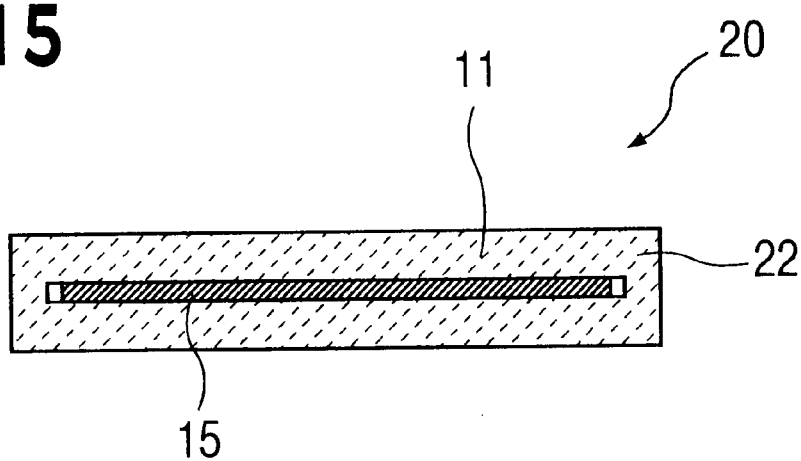
FIG. 15 is a sectional view showing one embodiment of a reflecting plate for the carbon heater according to the invention of the second group.

The setting facing for a reflecting plate of the quartz glass lower plate 22b is somewhat larger than the reflecting plate in order to absorb a thermal expansion difference, and a space therefore is formed as shown in FIG. 15.

The carbon-made reflecting plate 15 is formed from a thermal expansion graphite sheet, a capton baked sheet, a glassy carbon sheet or the like, having a thickness of 20 to 2000 μm.

The above-described sheets are preferably of the construction having a thin thickness of 20 to 200 μm in order to make the carbon heater more compact. For obtaining such a construction simply and at low cost, the capton baked sheet manufactured by baking a capton sheet is most preferable.

The above explanation in connection with the reflecting plate made of carbon is common to the reflecting plate made of carbon described in the present invention.

The reflecting plate 20 for a carbon heater is suitable for a heat reflecting plate arranged under or externally of the heater because it is clean and excellent in heat resistance.

Figure 16:
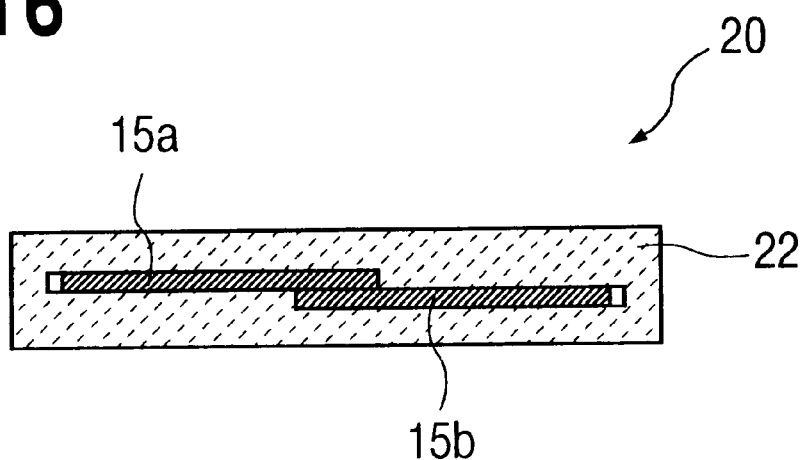
FIG. 16 is a sectional view showing a further embodiment of a reflecting plate for the carbon heater according to the invention of the second group.

FIG. 16 shows a modified example of the reflecting plate 20 for a carbon heater shown in FIG. 15. In this reflecting plate 20 for a carbon heater, two carbon-made reflecting plates 16a, 15b are sealed into a quartz glass support element 22. A plurality of carbon-made reflecting plates having a small area as described above are arrayed to enable more effective suppression of occurrence of crack resulting from thermal expansion of the carbon material. While in FIG. 16, the construction is employed in which two carbon reflecting plates are merely partly superposed, it is noted that the whole two carbon reflecting plates can be superposed. In this case, more effective heat insulating property can be obtained.

Figure 18:
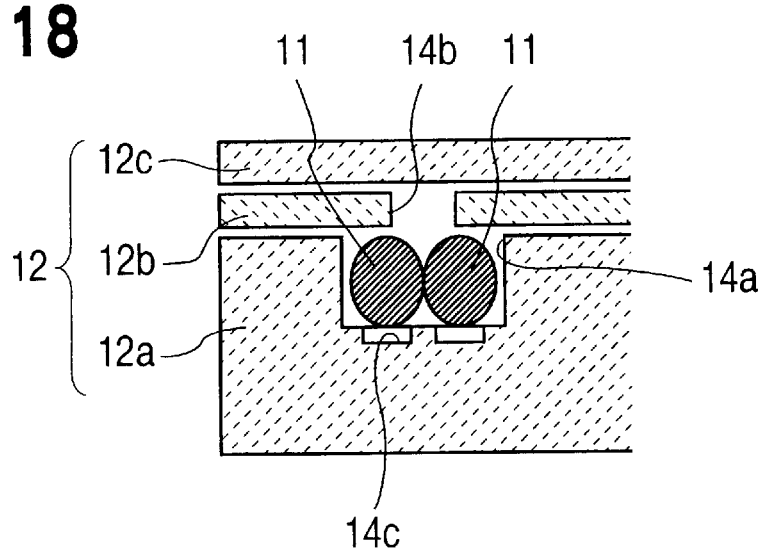
FIG. 18 is a sectional view showing a state before fusion processing in another embodiment of the carbon heater according to the invention of the second group.
Figure 19:
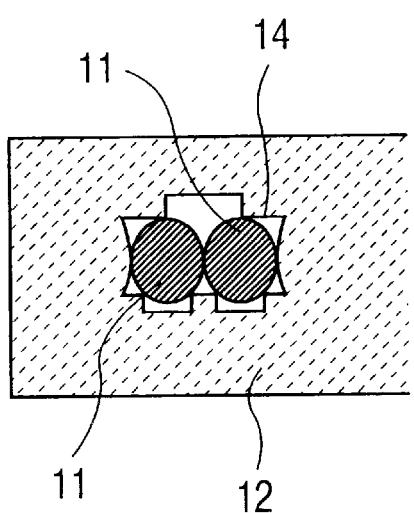
FIG. 19 is a sectional view showing a state after fusion processing of the carbon heater shown in FIG. 18.

In embodiments shown in FIGS. 18 and 19, two (possibly be, more than three) heater members 11 formed of carbon fibers are arrayed within the wiring groove 14. The wiring groove 14 is formed on the bottom with two auxiliary grooves 14c adjusting to the number of heater members. Thereby, the heater members can be supported in line contact at three places to overcome an inconvenience resulting from the face contact as described above.

Figure 20:
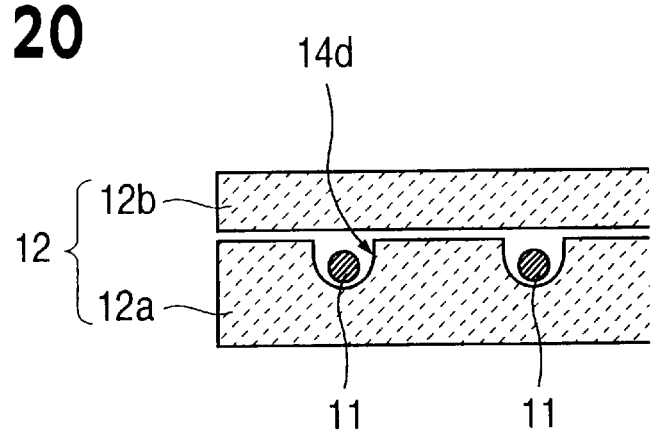
FIG. 20 is a sectional view showing a state before fusion processing in still another embodiment of the carbon heater according to the invention of the second group.
Figure 21:
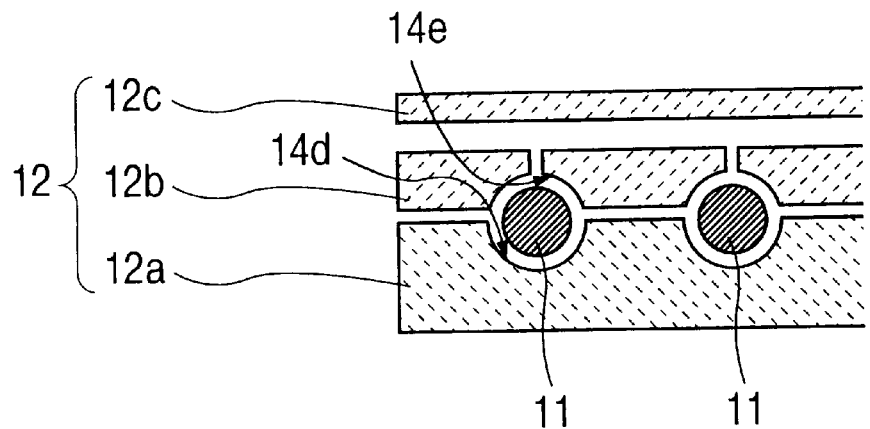
FIG. 21 is a sectional view showing a state before fusion processing in another embodiment of the carbon heater according to the invention of the second group.

In embodiments shown in FIGS. 20 and 21, a bottom 14d and entireties 14d, 14e in cross section of the wiring groove have a curved shape in section. With this, when a plurality of quartz glass plates are fused and integrated, it is possible to prevent, to the utmost, the cross sectional shape of the wiring groove from being thermally deformed to come into face contact with the carbon wires, and prevent the deterioration of the carbon wires resulting from reaction between the quartz glass and the carbon. Further, it is possible to suppress the accumulation of internal strain of the quartz glass support element resulting from the thermal deformation and prevent an inconvenience such as crevices. Furthermore, it is possible to prevent uneven heat generation due to the absorption of heat generated from the heater members, which results from the face contact.

Figure 22A:
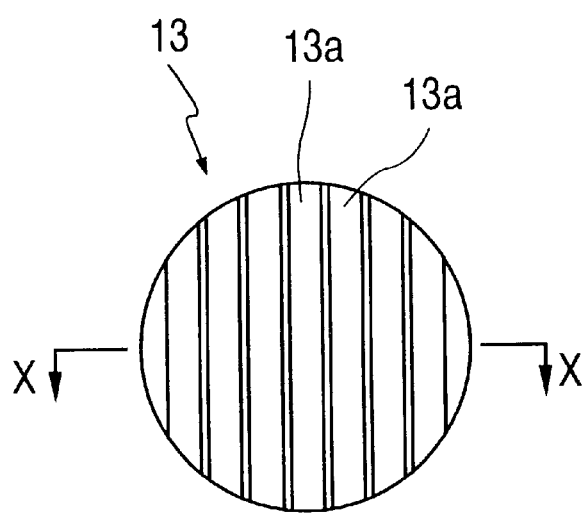
FIG. 22 is a view showing another embodiment of the carbon heater according to the invention of the second group, (A) being a top view, (B) being a sectional view taken on X—X in case of having a semicircular gibbous portion in section, and (C) being a sectional view taken on X—X in case of having a trapezoidal gibbous portion in section.
Figure 22B:
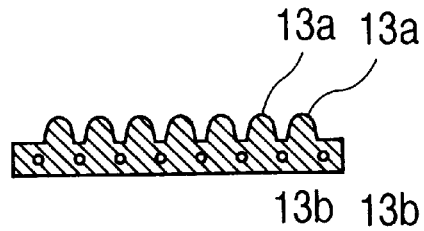
Figure 22C:
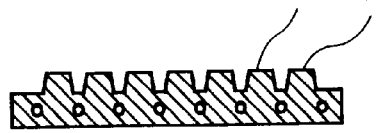
Figure 23A:
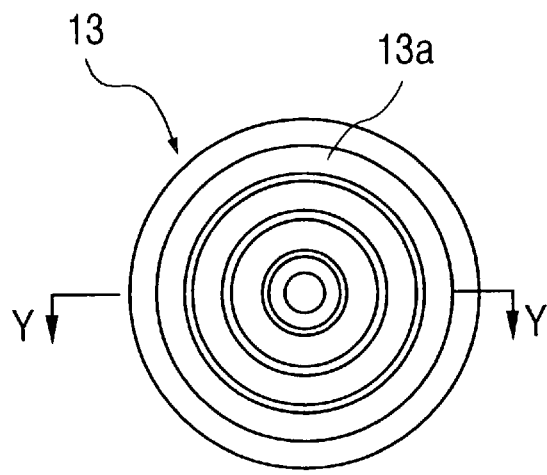
FIG. 23 is a view showing still another embodiment of the carbon heater according to the invention of the second group, (A) being a top view, (B) being a sectional view taken on Y—Y in case of having a semicircular gibbous portion in section, and (C) being a sectional view taken on Y—Y in case of having a trapezoidal gibbous portion in section.
Figure 23B:
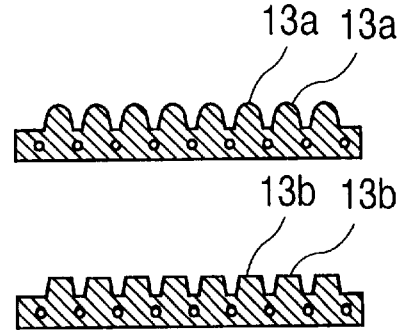
Figure 23C:
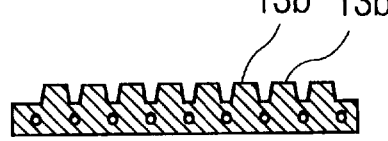
Figure 24A:
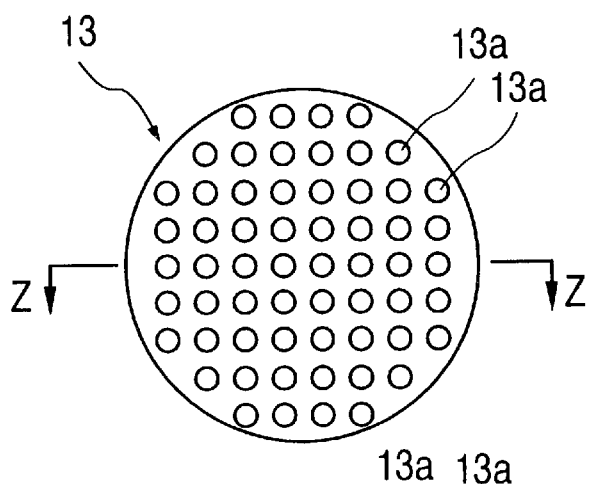
FIG. 24 is a view showing still another embodiment of the carbon heater according to the invention of the second group, (A) being a top view, (B) being a sectional view taken on Z—Z in case of having a semicircular gibbous portion in section, and (C) being a sectional view taken on Z—Z in case of having a trapezoidal gibbous portion in section.
Figure 24B:
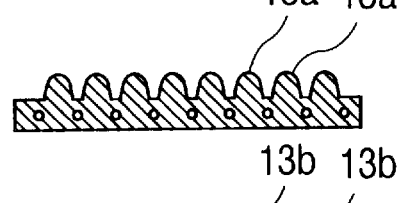
Figure 24C:
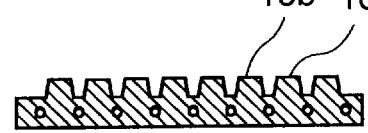

In embodiments shown in FIGS. 22A to 24C, the heater surface (outer surface) is formed with gibbous portions 13a or 13b which are semicircular or trapezoidal in section. In FIG. 22, the gibbous portions are formed in a stripe pattern, as viewed from the top of the heater surface; in FIG. 23, the gibbous portions are formed in a concentric circular pattern; and in FIG. 24, a number of the gibbous portions are formed in a lattice-like pattern. The surfaces of these gibbous portions 13a and 13b are subjected to glossing process caused by heating by an oxygen-hydrogen burner.

By employment of such a constitution as described, a prism effect is obtained by which heat generation upward of the heater surface by wire-like heat generating elements such as the heater members is made even by the scattering of light.

For obtaining the similar effect, normally, there is employed a method for subjecting the heater surface to sand-blasting. In this case, however, the surface is in the form of the meshes of sand. Radiation from the surface is suppressed and heat is accumulated in the quartz glass itself to lower the energy efficiency. In this sense, the glossing process is an important matter.

Furthermore, it is possible to prevent generation of dust by the same constitution as above.

The radius and bottom length of the gibbous portion 13a or 13b are preferably 0.5 to 5 mm. If the bottom length is less than 0.5 mm, the manufacturing cost considerably increases because fire processing is required. Furthermore, sufficient glossing cannot be applied. Moreover, sufficient prism effect cannot be obtained. Conversely, if the bottom length exceeds 5 mm, uneven heat generation possibly occurs.

The spacing between two gibbous portions can be set to 0.2 to 1 mm.

One example of the methods for manufacturing a carbon heater will be explained hereinafter with reference to FIGS. 25(A) to C)).

Figure 25A:
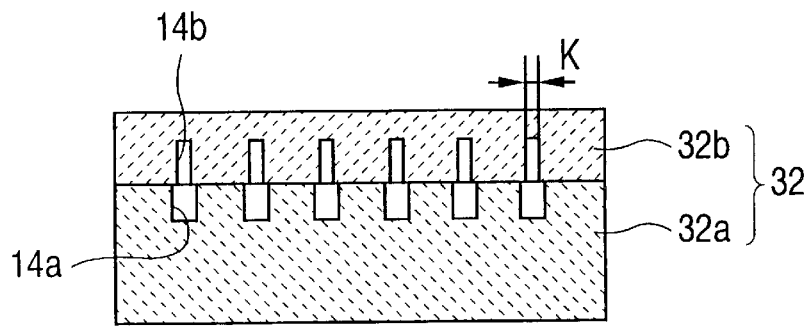
FIG. 25 is a process view showing one example of a method for manufacturing the carbon heater according to the invention of the second group.

First, as shown in FIG. 25(A), a first quartz glass plate 323a formed with wiring grooves 14a (groove width: 2 to 4 mm) and subjected to glossing process employing oxygen-hydrogen burner and a second quartz glass plate 32b formed with inserting grooves 14b (groove width: 1.5 to 2.5 mm which is smaller than the width of the 14a) paired with the groove 14a are joined so that the grooves 14a, 14b are opposed (communicated) to each other. This joining may include the fusion for integrating two quartz glass plates 32a, 32b, and the fixedly mounting to a degree that can withstand the succeeding or grinding process. Note that the inserting groove 14b can also be regarded as one kind of the wiring grooves.

Figure 25B:
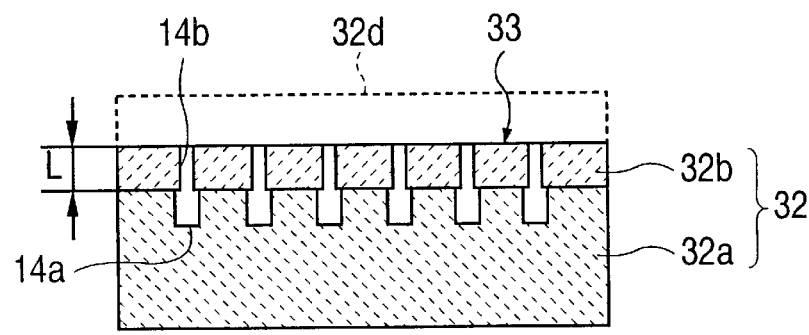
Figure 25C:
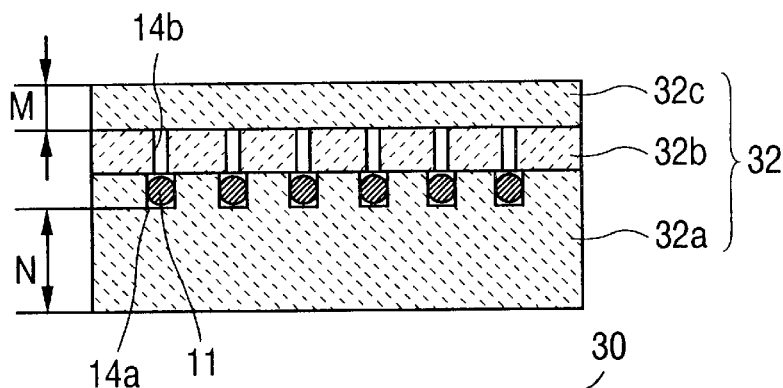
Figure 25D:
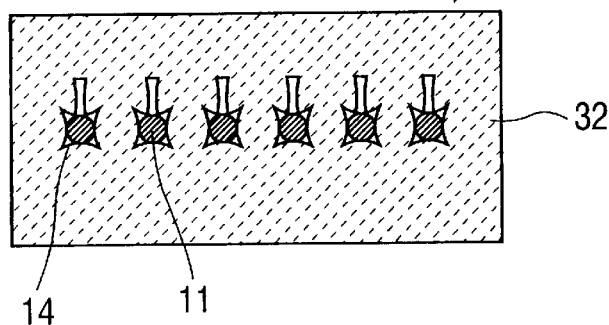

As shown in FIG. 25(B), a surface layer 32d of the second quartz glass plate 32b is eliminated by polishing or grinding so that the inserting groove 14b is exposed. Thereby, the inserting groove 14b functions as an inserting groove for inserting a heater member 11. The heater member 11 is inserted through the inserting window and forced into the internal wiring groove 14a.

Since the groove is a wholly "gibbous shape" in section shape vertical to lengthwise thereof, it is possible to positively prevent the heater member 11 such as a carbon wire from being risen and jumped out of the groove after the heater member 11 has been inserted. Then, the fusion of the quartz glass plate can be carried out evenly and positively over the whole joining surface.

After wiring, dust on the surface 33 of the quartz glass plate is removed. As shown in FIG. 25(C), a third quartz glass plate 32c is put on the polished surface 33 of the second quartz glass plate 32b, and the fusion processing is carried out.

By the fusion processing, the joining surfaces of three quartz glass plates are welded, and the portions are substantially integrated except for the groove 14 (14a, 14b).

In this embodiment, the wiring grooves 14a, 14b before fusion are wholly in the shape of gibbosity. After fusion, the "gibbous shape" is deformed into a somewhat collapsed shape.

By making the wiring groove into the "gibbous shape" before fusion, it is possible to relieve a thermal stain resulting from flexure or the like caused by own weight of the peripheral portion of the groove. Since the flexure caused by own weight becomes increased particularly in the upper side of the groove, the residual thermal strain can be lessened by making the groove the "gibbous" shape. Therefore, in the present embodiment, it is possible to considerably reduce the probability of occurrence of crevices or cracks generated in the upper plate due to the thermal hystresis during use.

One example of dimensions of parts in FIG. 25 is as follows: L is 0.5 to 1.5 mm, M is about 2 mm, and N is about 3 mm.

As the heater members, one to three wires whose diameter is about 2 mm can be used in parallel. The thickness of the whole carbon heater can be, for example, 5 to 10 mm.

Figure 26:
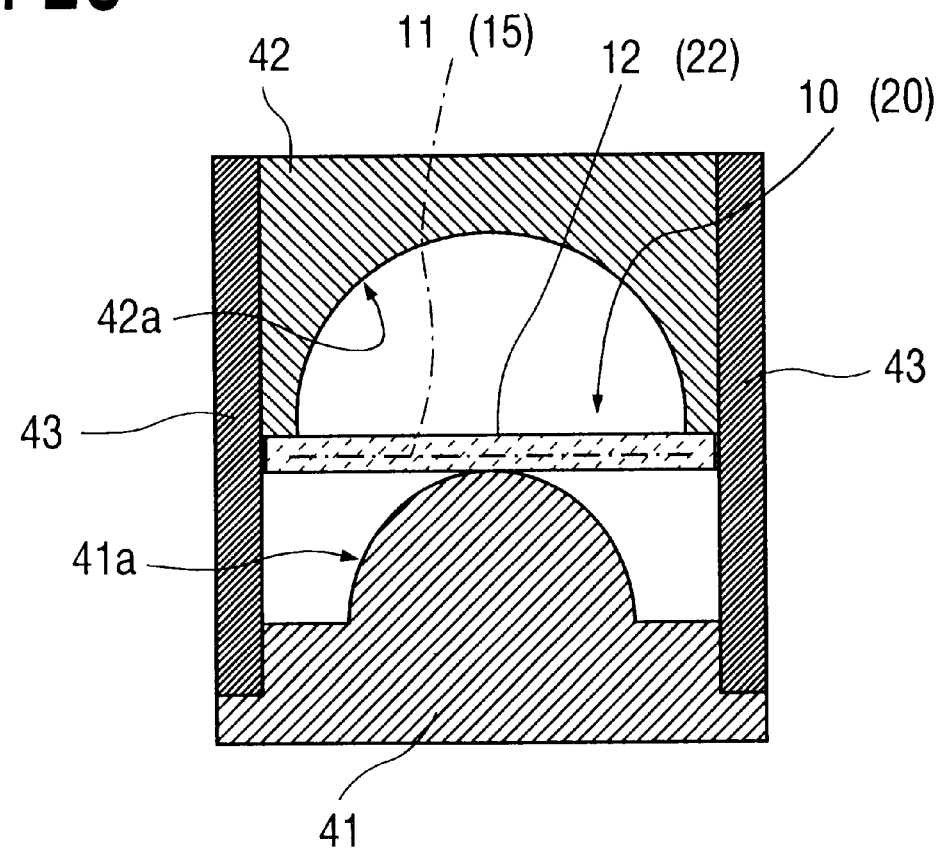
FIG. 26 is a process view showing a further example of a method for manufacturing the carbon heater (or the reflecting plate for a carbon heater) according to the invention of the second group.

A method for manufacturing a carbon heater or a reflecting plate for a carbon heater having an arch shape in section will be explained hereinafter with reference to FIG. 26.

This manufacturing method is a method for curving the carbon heater 10 into a fixed shape.

A flat plate-like carbon heater 10 is inserted between a carbon die 41 having a gibbous shape semicircular section and a carbon-made female die 42 having a concave shape semicircular section corresponding thereto. The female die 42 functions as a carbon load. Of course, a carbon load separately from the female die can also be used.

Deviation preventive dies 43 are arranged on the sides of the die 41 and female die 42. The deviation preventive die 43 guides the female die 42 so that the latter moves directly below.

One subjected to setting as described above is put into a heat treatment furnace and heated for 1 to 5 hours at 1500 to 1600° C. whereby the flat plate-like carbon heater 10 having a thickness of 5 to 15 mm can be deformed into an arch shape in section.

Figure 27:
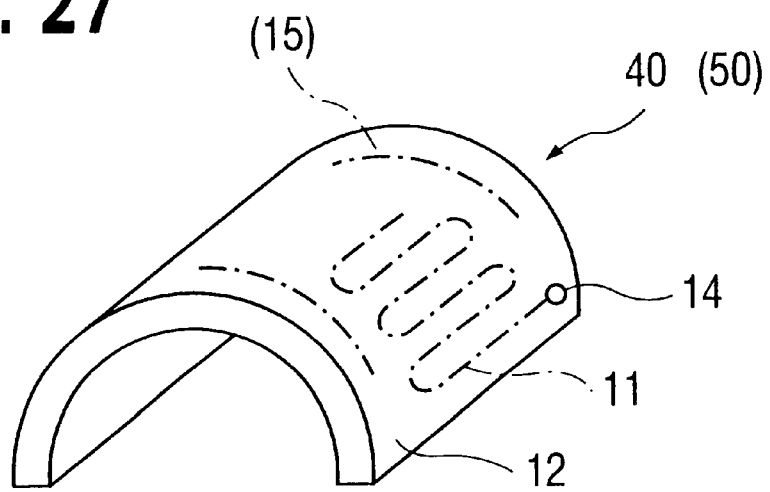
FIG. 27 is a perspective view showing one example of a carbon heater (or a reflecting plate for a carbon heater) manufactured by the manufacturing method shown in FIG. 26.

Examples of the arches in section include a ⅓ arch and a ½ arch. The carbon heater 40 shown in FIG. 27 is semicircular in section (½ arch).

Figure 28:
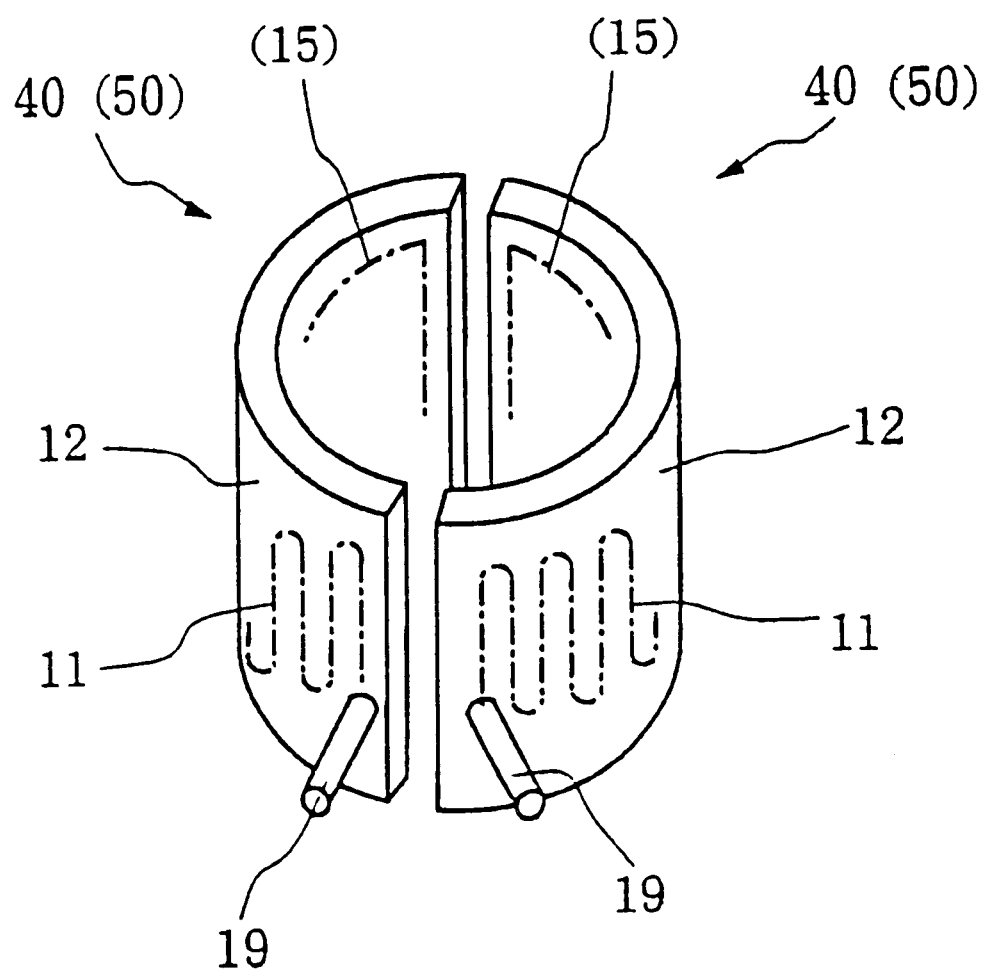
FIG. 28 is a perspective view showing a using state of the carbon heater (or the reflecting plate for a carbon heater) shown in FIG. 27.

A carbon heater shown in FIG. 28 is a cylindrical heater comprising a combination of two carbon heaters 40 shown in FIG. 19 formed with a substantially cylindrical heater surface. A quartz glass tube 19 covers a terminal wire.

On the other hand, a reflecting plate for a carbon heater, if a sheet-like carbon-made reflecting plate which can be deformed flexibly is used, can also be deformed into an arch shape similar to the carbon heater. FIG. 26 shows it by reference numerals with parentheses.

A carbon-made reflecting plate deformed into an arch shape as described above, can be used integrally by arranging adjacent to the carbon heater deformed similarly.

EXAMPLE 2-1

The carbon heater shown in FIG. 8 was manufactured by the following procedure.

The upper quartz glass plate of 100×100×3t was prepared, and mirror-surface finishing was applied to the fused surface. Further, chamfering of $CO.2$ was carried out for prevention of pitching.

Further, the lower quartz glass plate of 100×100×7t was prepared, and the wiring groove of depth 4 mm and width 2 mm was processed. Then, the groove was subjected to glossing process employing the oxygen-hydrogen burner. Similarly, mirror-surface finishing was applied to the fused surface, and chamfering of $CO.2$ was carried out.

Polishing by a flame can be carried out in place of a mirror-surface processing.

Similar to FIG. 4, the heater member formed of carbon fibers was arranged in the wiring groove of the lower quartz glass plate within the heat treatment furnace, and the upper quartz glass plate was put thereon. These were set on the glassy carbon mirror-surface plate. A carbon block weight of 10 kg was put thereon.

For all these carbon members, purified articles with impurities of less 5 ppm were used. If the carbon materials are not purified, the quartz glass spice may possibly lose transparency is the impurities adhere to the quartz glass impurities and they can possibly diffuse within a semiconductor manufacturing apparatus.

Then, the pressure within the apparatus reduced to 1 torr or less, and the heat treatment was carried out for three hours at 1450° C. The cooling of the quartz glass was gently carried out in the vicinity of 1100° C., which is a strain point of quartz glass. That is, the cooling rate at 1450 to 1000° C. was set at 100° C./hr. The cooling rate in other temperature regions was not particularly controlled By the aforementioned fusion process, the contact portion between the upper and lower quartz glass plates was completely fused, and in appearance, there was obtained the construction in which the carbon wire heat generating elements were wired within the integral quartz glass.

The heater members were somewhat oppressed by loads.

The wiring groove provided in the quartz glass plate was also deformed and oppressed during fusion so that the groove width as well as the groove depth became small. The gap in the groove was hardly seen in appearance, and the heat generating elements were moved into the quartz glass support element.

Of course, even if the gap is present to some extent, there is no problem.

This carbon heater is used, and a carbon wire in the terminal portion was inserted into a quartz glass pipe and connected to a power supply, as shown in FIG. 5. Then, a heating test was conducted.

As a result, heating could be done without any problem up to 1350° C. at a heater temperature.

Furthermore, heating and cooling of the heater were repeated between room temperature and 1200° C., but there was no problem such as an occurrence of crack.

In the carbon heater according to the invention of the second group, since the quartz glass support element is integrated by fusion, no concentration of stress occurs, thereby enjoying a long service life.

Further, since the quartz glass support element for supporting a heater member is substantially integrated and a hollow space is formed around the peripheral portion of the heater member, the quartz glass support element can be made thin to decrease the thermal capacity. Therefore, it can cope with the rapid heating and cooling temperature.

The reflecting plate for a carbon heater according to the invention of the second group is suitable as a heat reflecting plate arranged under or externally of the heater because the former is clean and excellent in heat resistance. Furthermore, for the above-described reason, the carbon heater can be made thin in wall thickness and made lower, heat capacity, and is suitable as a heater used particularly for a semiconductor heat treatment apparatus.

According to the method of manufacturing a carbon heater and a reflecting plate therefore according to the invention of the second group, it is possible to manufacture the carbon heater and the reflecting plate of high quality having the effects as described above efficiently and at low cost.

It is noted that the invention of the second group is not limited to the aforementioned embodiments. For example, the shape of the carbon heater and the reflecting plate used is not limited only to rectangle but circles and other various shapes can also be employed. Furthermore, the carbon heat generating elements can be arranged in two stages or more.

Invention of the Third Group

Preferred embodiments of the invention of a third group will be explained hereinafter with reference to FIGS. 70 to 77.

Figure 70:
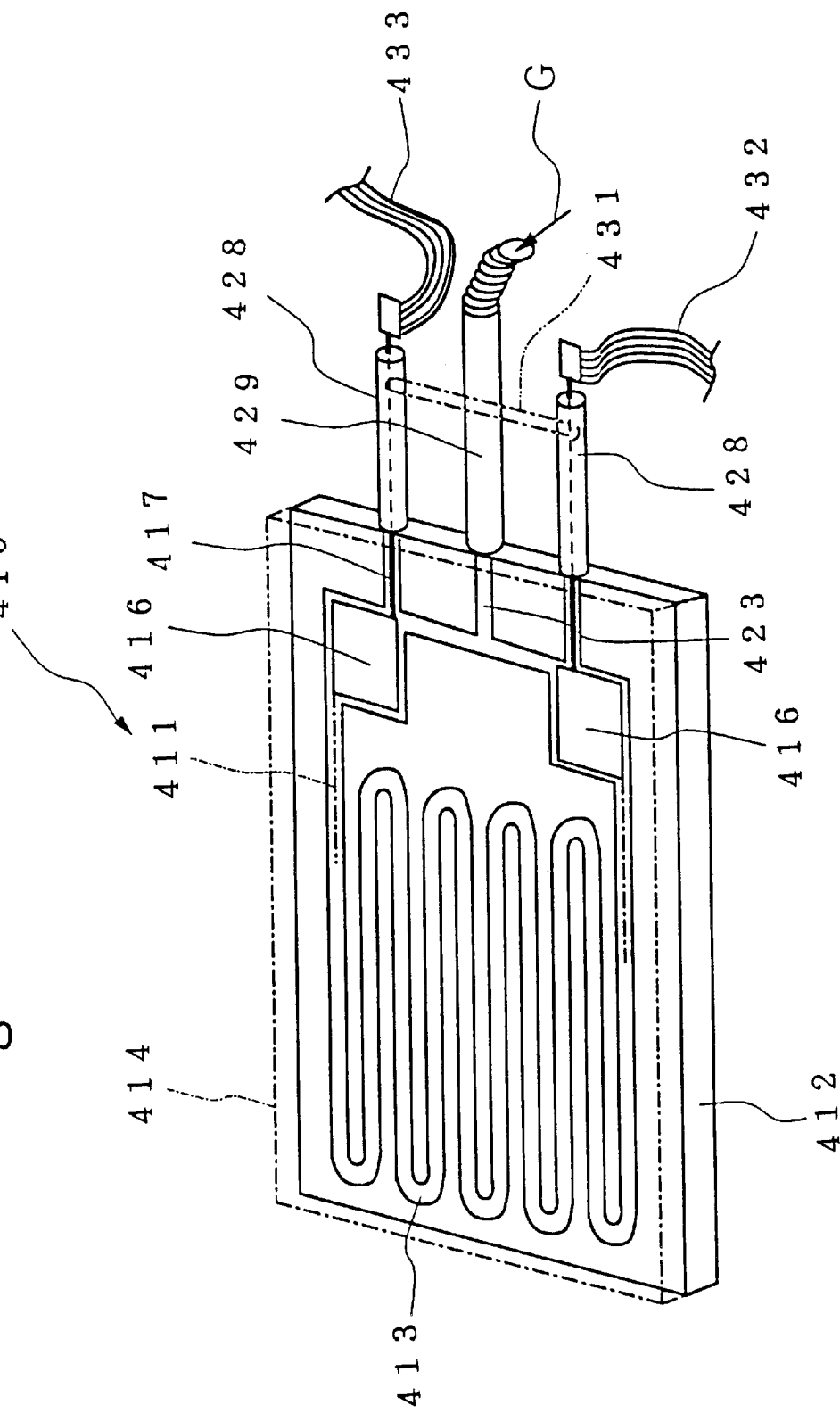
FIG. 70 is a schematic view showing another a carbon heater according to the invention of the third group.

FIG. 70 is a schematic view showing a carbon heater for a semiconductor manufacturing apparatus according to the invention of a third group.

A carbon heater 410 is formed into a wholly flat plate-shape, and utilized, for example, for a sheet type semiconductor manufacturing apparatus.

The carbon heater 410 is constituted such that a heater member 411 formed of carbon fibers as a heat generating element is arranged in a set recess 413 of a setting member 412 made of quartz glass, a lid member 414 made of quartz glass is placed thereover. Accordingly, the heater member 411 is in the form sandwiched between the quartz glasses.

As a specific example of the heater member 411, 9 carbon fiber bundles having 400 carbon fibers whose diameter is 7 $\mu$m are used and woven into a wire shape having a diameter of about 2 mm. The weaving span is about 3.2 mm and the fluffs caused by the carbon fibers is about 1.0 to 3.0 mm.

A suitable wiring form of the heater member 411 may be employed In the illustration, a zigzag form is shown, but volute or other shapes can be used. Further, it can be divided into a plurality of zones. In that case, a plurality of terminals are necessary.

Figure 71:
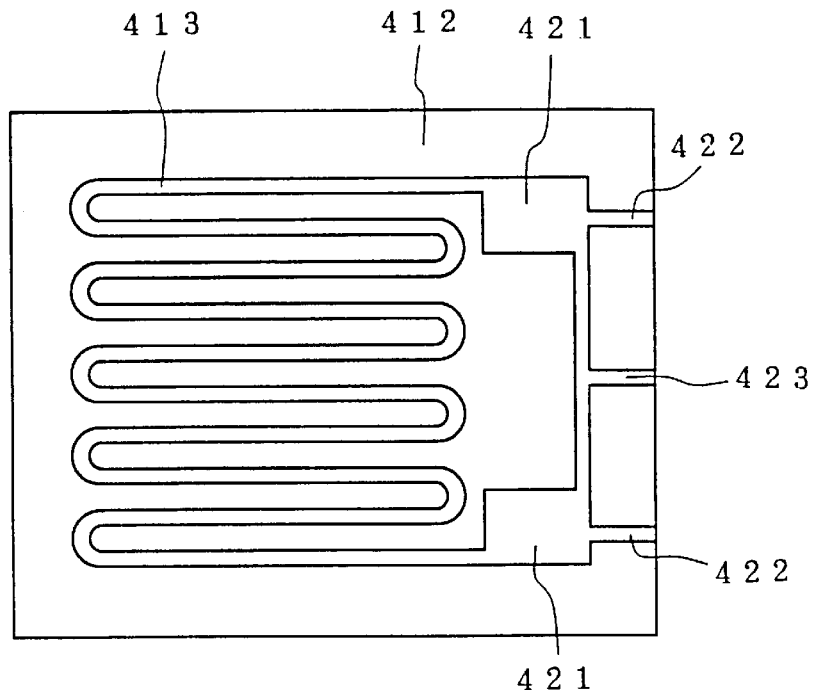
FIG. 71 is a top view showing a setting member of a carbon heater according to the invention of third group.
Figure 72:
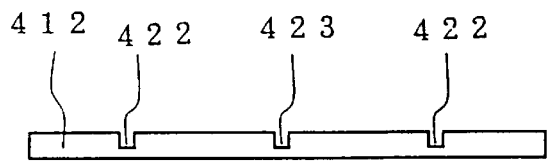
FIG. 72 is an end view of the setting member shown in FIG. 71.

As shown in FIGS. 71 and 72, the setting member 412 is a wholly rectangular quartz glass plate. The setting member 412 is formed with a zigzag groove 413 constituting set recesses of the heater member 411. Wide terminal setting portions 421 are provided on opposite ends of the groove 413. A metal electrode through-groove 422 extends from the carbon terminal setting portion 421 to outside.

The setting member 412 is also formed with a gas introducing groove 423 for introducing a non-oxidizing gas.

A quartz glass pipe 428 for a metal electrode and a quartz glass pipe 429 for introducing a gas are connected to the metal electrode through-groove 422 and the gas introducing groove 423. The quartz glass pipes 428 and 429 are welded by the setting member 412 and after welded, are subjected to annealing process in order to prevent an occurrence of crack.

These quartz glass pipes 428 and 429 can be reinforced by a reinforcing rod 431.

The groove 413 is formed by digging the plate-like setting member 412 by way of machining using a diamond drill and smoothing the processed surface. A countless chipping are present on the cut surface. This brings forth an occurrence of crack resulting from heat shock, and therefore, the cut surface is smoothed by mirror surface grinding or polishing process. Particularly, in order to prevent the uneven heat generation as described above, it is optimum to carry out the polishing process by way of heating using an oxygen-hydrogen burner. However, in the case where alumina powder 415 is filled in the groove, as described later, the smoothing is not always necessary.

The mirror surface termed herein is a surface whose surface roughness Rmax eased on the maximum height JIS B0601-1982) is less than 1 $\mu$m.

In the case where the surface roughness Rmax of the surface of the groove 413 is larger than 1 $\mu$m, the local contact with the heater member occurs so that the reaction property at that area increases to shorten the life of the heater member. That is, quartz glass and carbon give rise to reaction $SiO_2 + 3C \rightarrow SiC + 2CO$ or $SiO_2 + 2C \rightarrow SiC + CO_2$ to give a damage to the heater member 411. It has been confirmed that there occurs a 10% increase in resistance resulting from silicifying in 300 hours at 1200° C., for example.

One or a plurality of heater members 411 can be arranged with the groove 413, but the depth of the groove 413 is preferably deeper than the net diameter thereof. Further, it is important that the heater member 411 is not in contact with the lid member 414.

Figure 76:
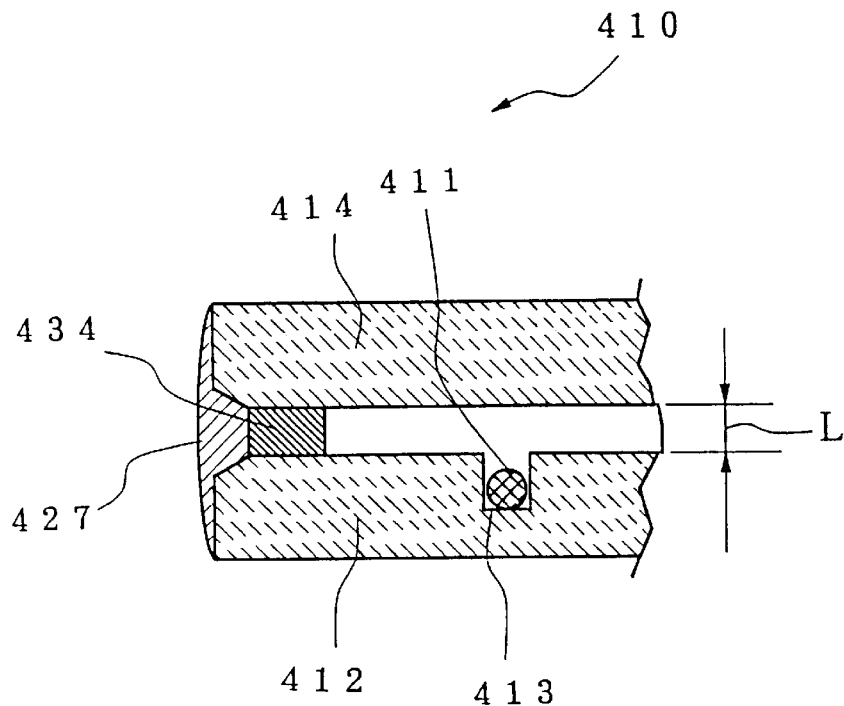
FIG. 76 is a sectional view showing the vicinity of the outer peripheral portion in the embodiment of a carbon heater according to the invention of the third group.
Figure 77:
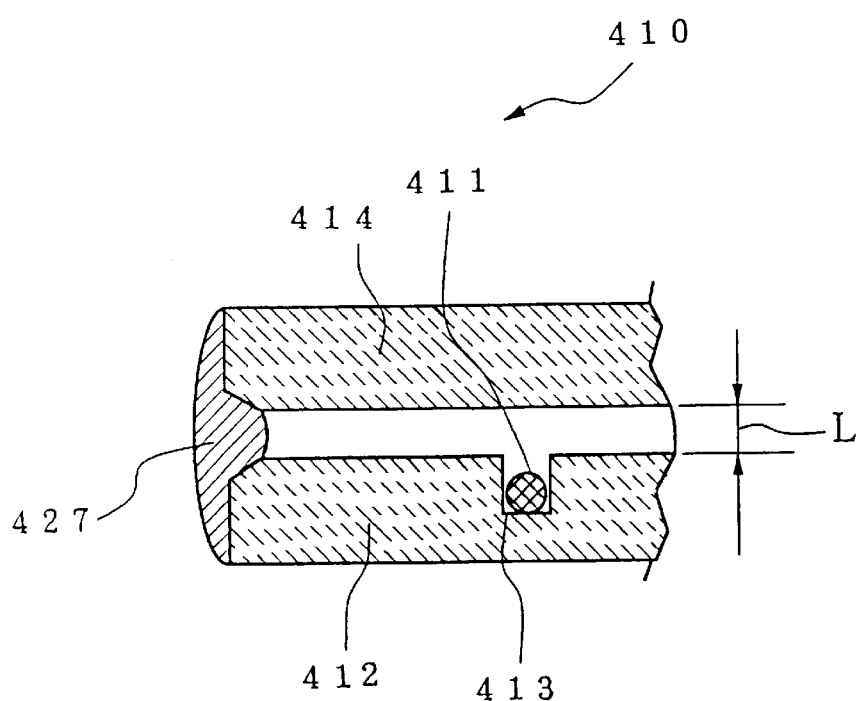
FIG. 77 is a sectional view showing a further mode of the vicinity of the outer peripheral portion in the embodiment of a carbon heater according to the invention of the third group.

As shown in FIGS. 76 and 77, the setting member 412 and the lid member 414 are sealed and fixed by welding 427 using an oxygen-hydrogen burner. The opposed surfaces of the setting member 412 and the lid member 414 are opposed with a distance L. The distance L is 0.2 to 1 mm.

For shortening the length L (in the vicinity of 0.2 mm), it is preferable to apply the mirror-surface processing to the surfaces of setting member 412 and the lid member 414 that are facing each other. This is because when a surface drip occurs due to glossing, the opposed surfaces becomes contact each other to possibly bring forth a break. When the distance L is less than 0.2 mm, a possibility of break becomes large.

When the distance L is taken to be longer (in the vicinity of 1 mm), there is no possible surface contact, and the mirror surface processing is not necessary. When the distance L exceeds 1 mm, a flame for welding enters, and the heat generating element 411 can possibly be oxidized.

A beveling is provided in the periphery of the setting member 412 and the lid member 414. Thereby, the welding strength of the setting member 412 and the lid member 414 can be improved greatly. When only the right-angled corner is welded without provision of the beveling, the side weld results and sufficient welding strength can not be obtained.

For example, when the wall-thickness of the setting member 412 and the lid member 414 is 6 mm, a chamfering of beveling is C5. Generally, preferably, width of C: y is selected by y≦t−1 mm (t is wall-thickness). This is because chipping is prevented by leaving about 1 mm of the upper end the lower end of the setting member 412 and the lid member 414. Preferably, as shown in numeral 427, welding is applied not to only a beveling portion but also to build-up welding of about 1 mm. In this case, the strength can be further enhanced.

It is noted that the provision of the spacing between the setting member 412 and the lid member 414 is useful in preventing a break due to a local difference in temperature during welding.

Welding of the setting member 412 and the lid member 414 with the spacing provided therebetween may be achieved, in case of FIG. 77, by placing a spacer having a thickness of 0.2 to 1 mm, 3 to 4-point build-up welding the outer peripheral portions of the setting member 412 and the lid member 414, removing the spacer, and build-up welding the whole area of the outer peripheral portions. Further, as shown in FIG. 76, a flame weir 434 having a height of 0.2 to 1 mm and a width of 0.1 to 9 mm is formed in advance, over the whole outer peripheral side of the lid member 414, on the lid member 414 by integral molding or welding, the setting member 412 and the lid member 414 are placed top of each other, after which a fixed quartz glass rod is applied to a beveling and heated by an oxygen-hydrogen burner to deposit the flame weir portion, and a build-up portion 427 is formed and welded.

Particularly, according to the latter method, (1) it is possible to prevent, to the utmost, the heater member from being oxidized due to the burner heating, (2) it is possible to make more uniform the dimension of the spacing between the setting member and the lid member, and (3) it is possible to prevent a while cloud caused by $SiO_2$ fine powder from occurring on the outer peripheral portions of the setting member and the lid member to enhance the equalizing property of the present carbon heater.

The flame weir 434 may be provided on the lid member 414 at a height of 0.2 to 1 mm, and further on both the setting member 412 and the lid member 414 at a total height of 0.2 to 1 mm.

Figure 73:
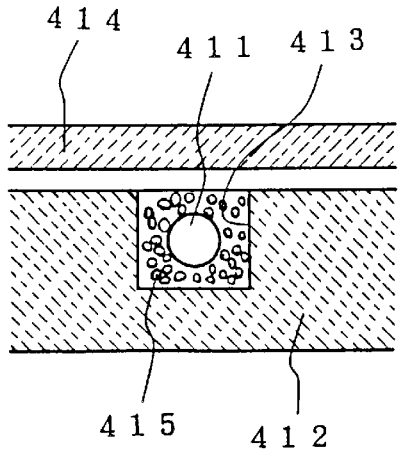
FIG. 73 is a sectional view showing a manner for setting a heater member in the embodiment according to the invention of the third group.

As shown in FIG. 73, advantageously, the setting portion 413 is filled with alumina powder 415 and the heater member 411 is supported by the alumina powder 415. The alumina powder 415 is sintered by heat treatment at about 130° C. after the alumina powder 415 and the heater member 411 have been arranged on the setting portion 413.

Thereby, it is possible to raise the maximum temperature of the carbon heater up to about 1350° C. more positively.

The alumina powder is arranged, for example, by the following procedure. Quartz glass pipes 428 and 429 are welded and annealed, paste having the alumina powder dissolved with pure water is then flown into the alumina powder into the groove 413 of the setting member 412 to set the heater member 411, after which the alumina paste is also introduced into the upper portion of the heater member. Moisture is removed by a dryer for 3 hours at 200° C.

A carbon terminal 416 is arranged on a carbon terminal setting portion 421, to which both ends of the heater member 411 are connected.

Figure 74:
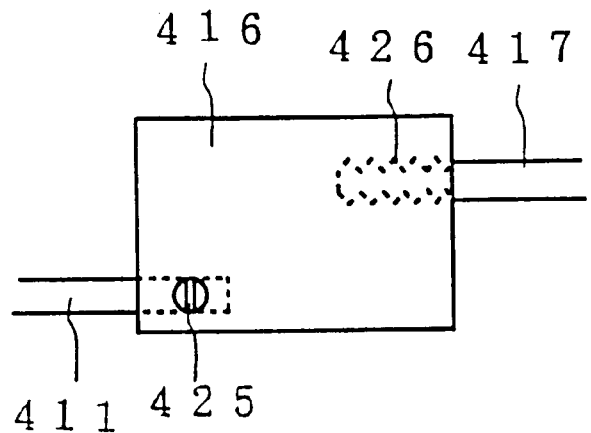
FIG. 74 is a top view showing a carbon terminal in the embodiment according to the invention of the third group.
Figure 75:
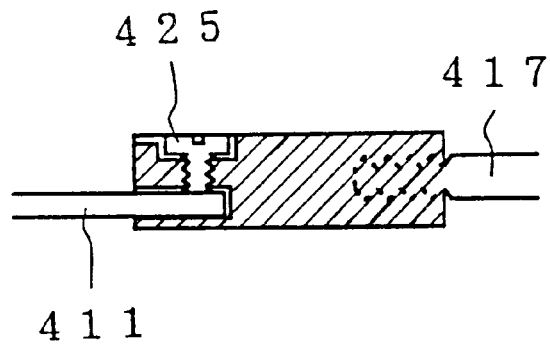
FIG. 75 is a sectional view showing a carbon terminal in the embodiment according to the invention of the third group.

As shown in FIGS. 74 and 75, the heater member 411 is inserted into a hole of the carbon terminal 416 and secured by means of a screw 425.

A metal electrode 417 made of Mo is also connected to the carbon terminal 416. The extreme end of the metal electrode 417 is formed with threads 426, which are threaded into the tapped hole of the carbon terminal 416.

The metal electrode 417 is drawn outside through the quartz glass pipe 428 and connected to an electrode 432.

And, the setting member 412 and the lid member 414 are welded and sealed similarly to that mentioned previously, and after this, the strain of the quartz glass is overcome by the heat treatment at 1150° C. The alumina powder dried by the heat treatment assumes a calcination state. This is further subjected to heat treatment at 1300° C. to form a sintered element. A spacing of 0.2 to 1.0 mm is provided between the setting member 412 and the lid member 414.

A flexible tube 433 is connected to a gas introducing tube 429, from which a non-oxidized gas such as a nitrogen gas is introduced (arrow G). The brown gas passes through a gas inert 423 and flows into the peripheral portion of the carbon terminal. Then, the gas is discharged through the quartz pipe 428 for a metal electrode.

Further, gas can be supplied to the heater member 411, but at that time, an uneven temperature tends to occur. This needs the care.

EXAMPLE 3-1

A carbon heater in the form shown in FIG. 70 was prepared without using alumina powder.

Heating test was conducted while introducing nitrogen gas into the carbon heater. A temperature of a carbon wire heater was 850° C. The electric voltage and current were 51V and 10.6 A, respectively. Even if the heater was used for 100 hours, no change in resistance occurred, and heating was carried out in a stable manner. Furthermore, even if a temperature of the carbon heater was 1300° C., the heater could be used without problem for 2000 hours or more.

EXAMPLE 3-2

A carbon heater was prepared similarly to Example 3-1 except that the carbon wire was supported using alumina powder.

Heating test was conducted while introducing nitrogen gas into the heater. The heater was used continuously for 200 hours at a temperature of 1350° C. (a surface temperature of alumina powder). No inconvenience such as an increase in resistance occurred. Thereafter, when the temperature was raised, the surface of the alumina powder was 1550° C., and the heater member was broken.

The carbon heater particularly effective for a semiconductor manufacturing apparatus according to the invention of the third group is considerably long in durable life as compared with the conventional heaters, and the rapid temperature rising and decreasing are enabled.

Note, the invention according to the third group is not limited to the aforementioned embodiments. For example, the whole shape of the heater is not limited to a rectangular flat plate, but a circular or cylindrical shape can also be employed. Furthermore, the groove can be formed not only in the setting member but in the lid member.

Invention of the 4th-1 Group

Preferred embodiments of the invention according to the 4th-1 group will be explained hereinafter with reference to FIGS. 95, and 97 to 100.

Figure 95:
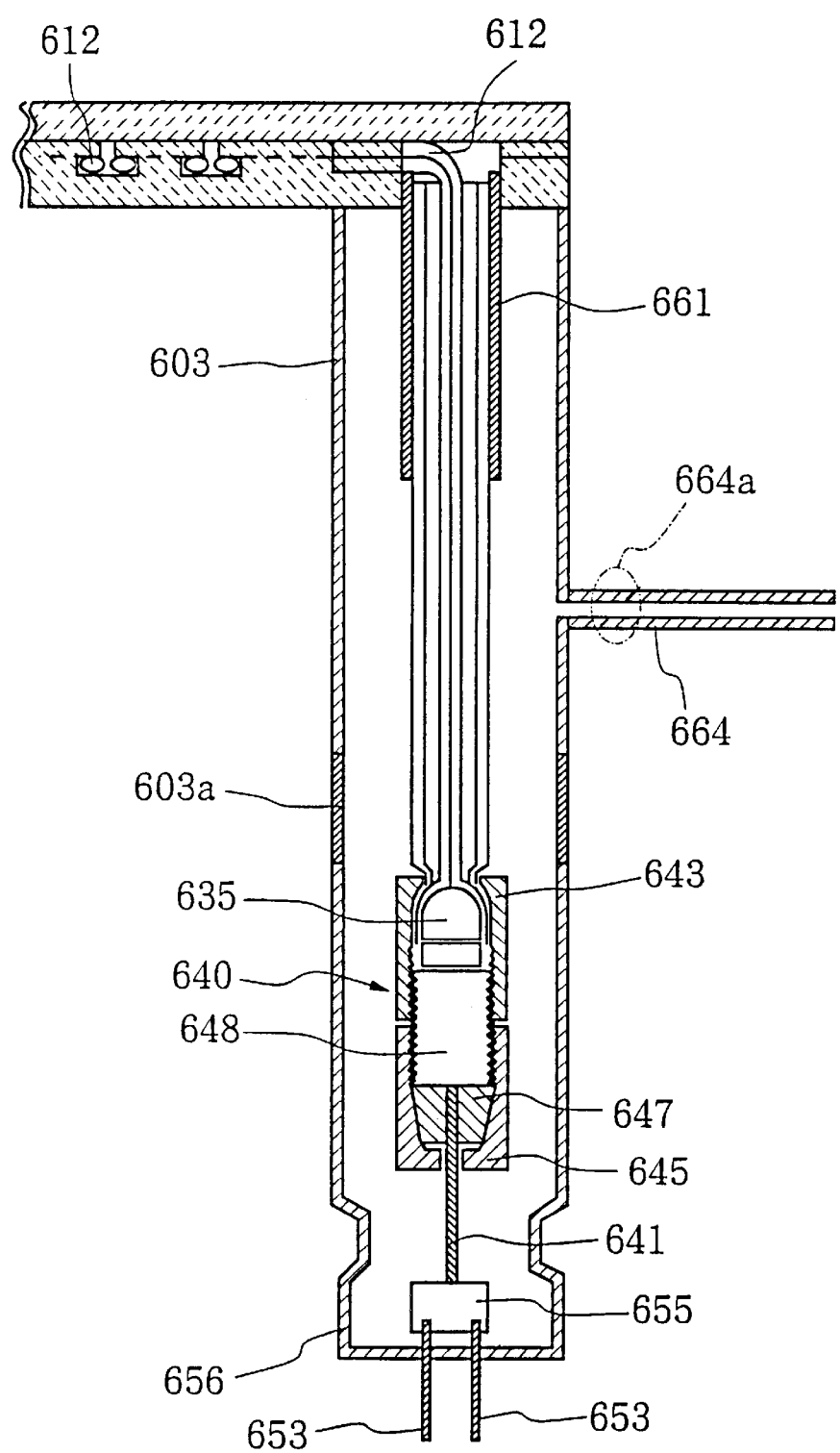
FIG. 95 is a sectional view showing another embodiment according to the invention of the 4th-1 group.
Figure 97:
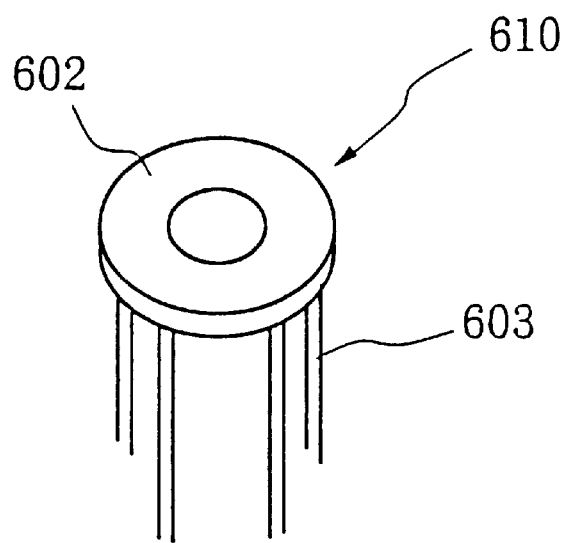
FIG. 97 is a perspective view showing the using state of the carbon heater according to the invention of the 4th-1 group.
Figure 98:
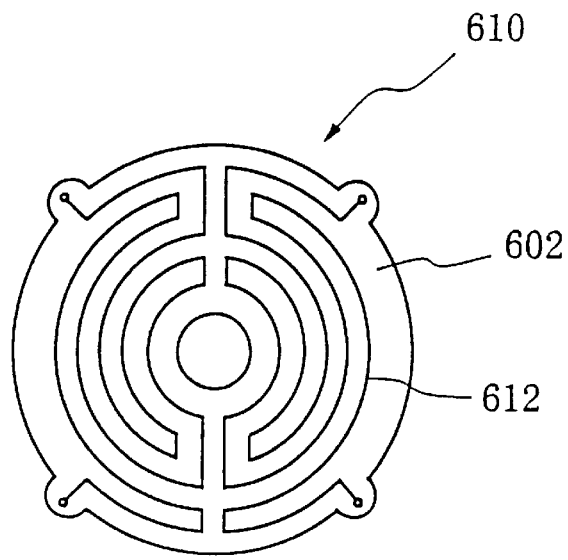
FIG. 98 is a top view showing the details of the carbon heater shown in FIG. 97.
Figure 99:
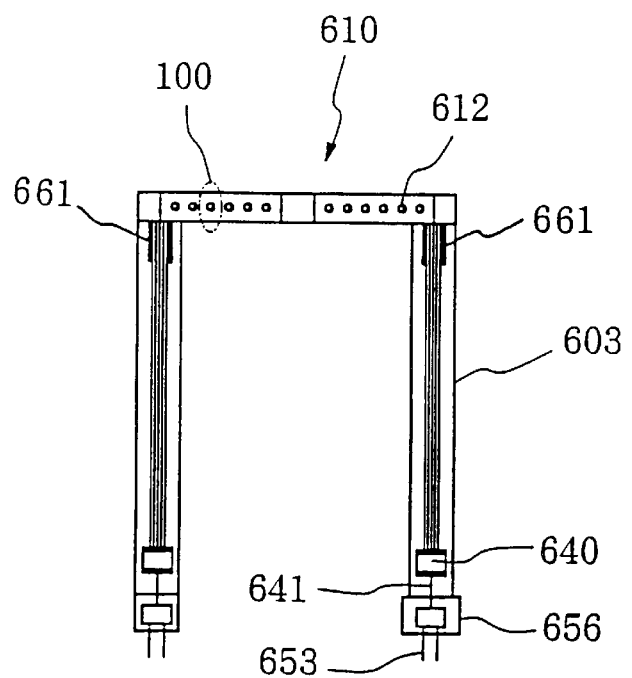
FIG. 99 is a side view schematically showing the carbon heater shown in FIG. 97.
Figure 100:
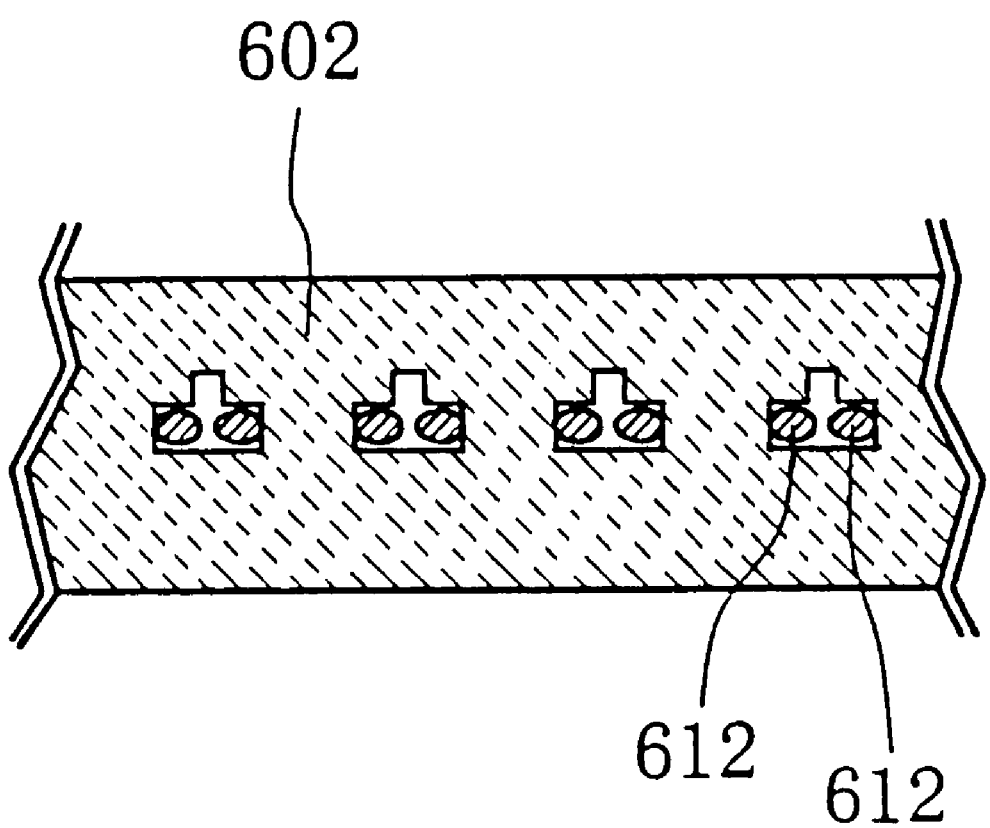
FIG. 100 is an enlarged sectional view of a portion indicated at numeral 100 in FIG. 99.

FIG. 97 is a perspective view showing the service state of the carbon heater particularly effective for a semiconductor manufacturing apparatus according to the invention of the 4th-1 group. FIG. 98 is a top view showing the details of the carbon heater. FIG. 99 is a side view partly omitted. FIG. 95 is an enlarged view of a part shown in FIG. 99.

In a carbon heater 610 according to the invention of the 4th-1 group, heater members 612 are used in which a plurality of carbon fiber bundles comprising a plurality of carbon fibers are woven into a wire shape.

As a specific example of a carbon wire used as the heater members 612, for example, 9 carbon fiber bundles having 300 carbon fibers whose diameter is 7 μm are woven into a wire shape whose diameter is about 2 mm. The weaving span is about 3 mm, and the fluffs on the surface caused by the carbon fibers are 0.5 to 2.5 mm.

The heater members 612 are concentrically and circularly arranged in a zigzag manner substantially on the center surface of the quartz glass support element 12. The wiring form may be volute or other shapes.

The terminal wire of the heater member 612 is drawn vertically to the heater surface 13 from the hole 21 whose diameter is 3 mm, for example.

The wiring groove is formed into a "gibbous" shape.

The whole joining surface of the quartz glass support element 602, that is, two quartz glass plates, is fused and integrated by heat treatment. That is, the quartz glass support element is substantially integrated and a hollow space is formed around the peripheral portion of the heater member 612.

The method for preparing the terminal portion of this embodiment will be explained.

1) A quartz transparent pipe 603 having a large diameter (for example, a diameter is 19 mm) is welded to a flat plate-like quartz container while flowing $N_2$. Annealing process (for example, gradual cooling for 1 hour at 1150° C.) is carried out suitably to prevent crack.

2) A plurality of wire-like carbons are stretched into a quartz pipe 661 having a small diameter (for example, a diameter is 9 mm) using a string. This quartz pipe is inserted into the set hole of the quartz container. The wire is tightly arranged in the small-diameter quartz pipe 661.

3) Various members are arranged as shown in FIG. 95 to assemble a connecting member 640. At that time, cut of the carbon wire can be prevented by the action of a carbon material 662 for running idle.

4) A transparent pipe is welded to the lower part of an opaque pipe 603a joined in advance by welding. At that time, $N_2$ gas is introduced from a branch pipe 664 to prevent oxidization of the heater member.

5) A seal terminal is mounted to the lower side of a lower transparent pipe while introducing $N_2$.

6) The branch pipe 664 is vacuumed to reduce pressure in the heater. After this, a root 664a of the branch pipe 664 is rounded by flame to take the branch pipe 664.

The end of the heater member 612 is drawn substantially vertically to the heater surface from the heater member and connected to the Mo terminal wire 641 through the carbon terminal. These are arranged in the glass pipe. The Mo terminal wire 641 is connected to two Mo circumscribed wires 653 through a Mo foil 655. The Mo foil 655 is pinch-sealed.

The carbon heater according to the invention of the 4th-1 group can be formed into the same construction as the carbon heater according to the invention of the 4th-2 group described later except for the terminal portion and the quartz glass support element (fusing method).

By the provision of the constitution as described above, an uneven temperature on the surface of a semiconductor wafer arranged parted about 100 mm above the present carbon heater can be maintained at less than ±0.5° C. Further, the heater can be made compact, and the manufacturing is easy. The merit is great in terms of cost.

The opaque quartz glass pipe 603a arranged in the middle of the quartz transparent glass pipe 603 has the effect of reducing heat radiation of the interior of the quartz transparent glass pipe 603 transmitted from the heater portion and heat conduction caused by itself Thereby, the Mo rods 641 and 653 can be prevented from being oxidized, and the break of the quartz pinch portion 656 can be effectively prevented.

Further, according to the experimental example, since the carbon material 662 for running idle is intervened between the core 635 and the cylindrical core 648, it is possible to overcome an inconvenience in which when the wire-like carbon is pressed by the core, the core is rotated to cut the carbon wire.

Invention of the 4th-2 Group

Preferred embodiments of the invention according to the 4th-2 group will be explained hereinafter with reference to FIGS. 78 to 83.

Figure 78:
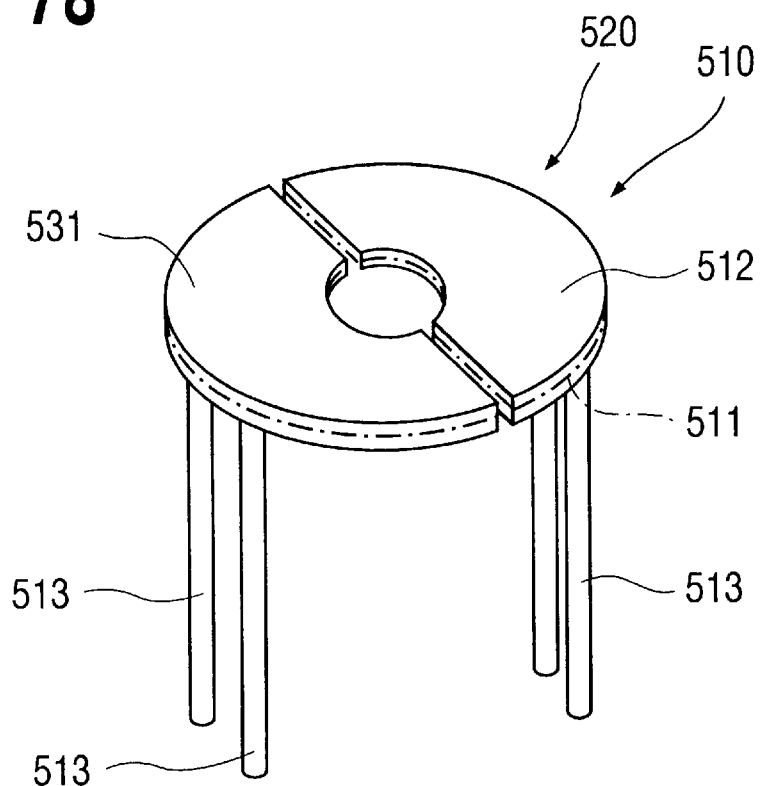
FIG. 78 is a perspective view showing a using state of a carbon heater according to the invention of a fourth group.
Figure 79:
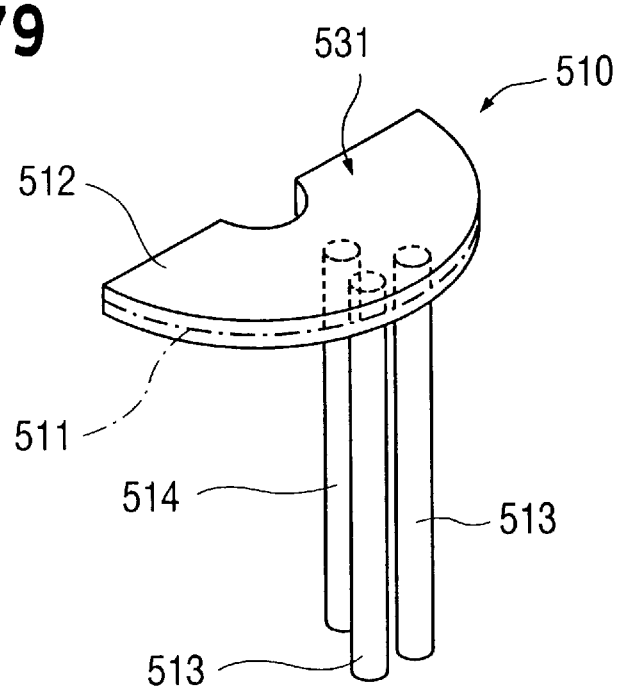
FIG. 79 is a perspective view showing a single element of a carbon heater according to the invention of the fourth group.
Figure 80:
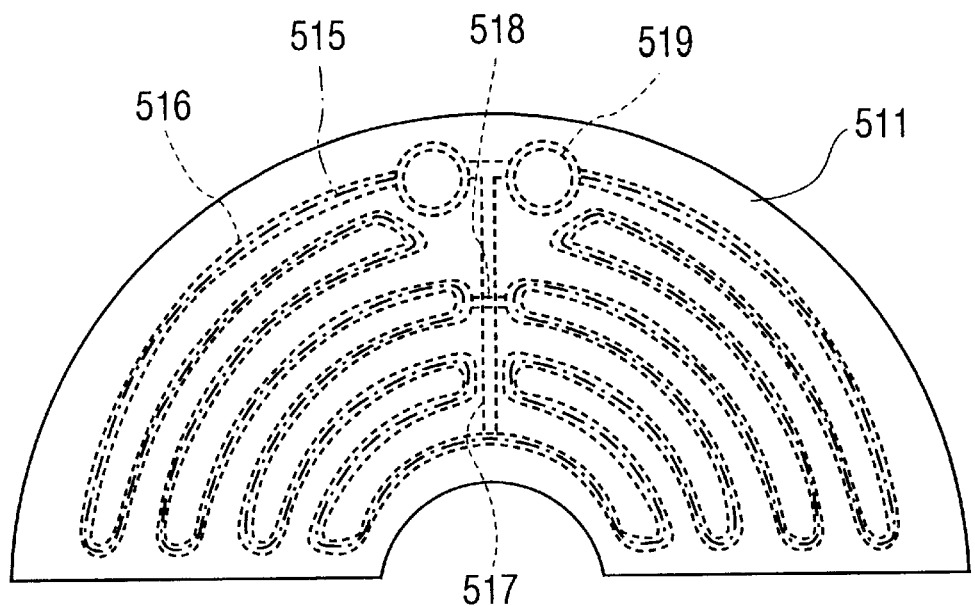
FIG. 80 is a top view showing the detail of a carbon heater according to the invention of the 4th-2 group.
Figure 81:
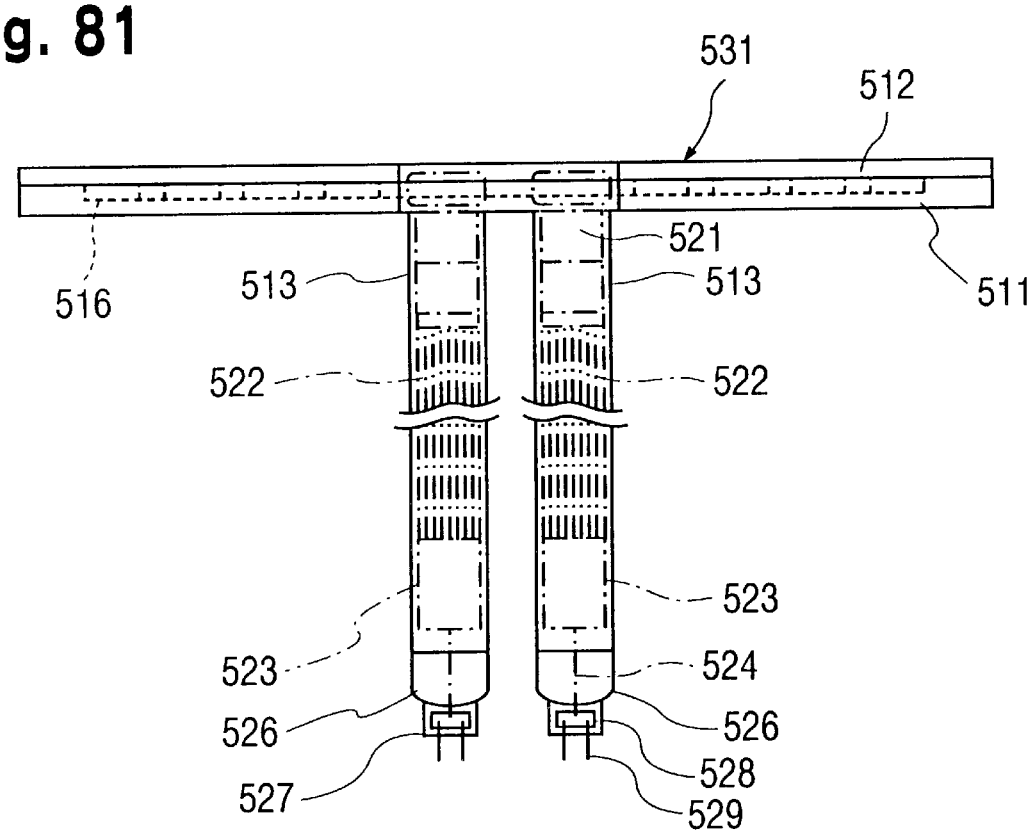
FIG. 81 is a side view with a part of a carbon heater according to the invention of the 4th-2 group omitted.

FIG. 78 is a perspective view showing a using state of a carbon heater effective particularly for a semiconductor processing apparatus according to the invention of the 4th-2 group; and FIG. 79 is a perspective view showing a single element of a carbon heater. FIG. 80 is a top view showing the detail of a carbon heater shown in FIG. 79; and FIG. 81 is a side view with a part omitted.

In a carbon heater 510 according to the invention of the 4th-2 group, a heater member 515 is used in which a plurality of carbon fibers comprising a plurality of carbon fibers are woven into a wire shape. A section of a heat generating element 515 is not only circular, but may also be a flat shape.

As a specific example of the heater member 515, for example, nine carbon fiber bundles having 300 carbon fibers whose diameter is 7 μm are used and woven into a wire-shape whose diameter is about 2 mm. The weaving span is about 3 mm, and the fluffs on the surface caused by the carbon fibers are about 0.5 to 2.5 mm.

By using the heater member 515 as described above, the current load density can be enhanced about 1.5 times of the conventional Mo—Si wire, and the rapid heating is enabled.

The heater member 515 is arranged within a set recess 516 of a lower container 511 of a quartz glass flat-plate container, and an upper container 512 is put thereover. The heater member 515 is sealed into the container in the form placed that the former is covered between the lower container 511 and the upper container 512 of the quartz glass flat-plate container.

The upper surface of the upper container 512 constitutes the heater surface 512. In this embodiment, the heater surface 512 has a semicircular plane.

Set recesses 516 are arranged symmetrically to left and right in the plane shown in FIG. 80, and a gas passage 517 for guiding gases and a gas inlet and outlet 518 are formed on the symmetrical axis.

The wiring form of the heater member 515, that is, the shape of the set recess 516 is suitable. In the illustration, the shape is a zigzag form, but volute or other shapes can be also employed.

The quartz glass containers 511 and 512 are in the form of a split mold which is semicircular and has a semicircular cut in the center portion thereof. Therefore, if two of them are combined, a circular heater 520 can be formed, as shown in FIG. 78.

Opposite ends of the set recess 516 are formed with rod-like terminal inserting portions 519, and a rod-like terminal 521 is arranged vertically to the heater surface 531. The end of the heat generating element 515 is connected to the rod-like terminal 521. A groove for a rod-like terminal is also formed in a corresponding position of the upper container 512.

The quartz glass pipe 513 is connected to the rod-like terminal inserting portion 519. The quartz glass pipe 513 is sealed and secured, vertically to the heater surface 531, to the lower surface of the lower container 511.

An opaque quartz can be used for a part of the quartz glass pipe 513. In this case, it is possible to suppress the heat transfer and the heat conduction caused by radiation from the heater side. It is then possible to suppress the rise of temperature of members arranged therebelow to protect the members and prevent the heat loss.

Within the quartz glass pipe 513, a terminal portion body 523 and a rod-like terminal 521 are connected by a plurality of terminal wires 522 formed of wire-like carbon. A Mo-made inscribed wire 524 is induced downward from the terminal portion body 523. In this manner, it is possible to lower the resistance to suppress heat generation by using the terminal wire 522 formed from a plurality of wire-like carbons as a conductor.

A cap 526 made of quartz glass is connected to the lower end of the quartz glass pipe 513. The inscribed wire 524 is drawn out downward passing through the cap 526.

The lower end of the drawn inscribed wire 524 is connected to the upper part of a foil element 528. A circumscribed wire 529 made of Mo is connected to the lower part of the foil element 528. The circumscribed wire 529 has two poles in FIG. 81 but sometimes has one pole. The foil element 528 made of Mo is sealed by a quartz seal terminal 527. The quartz seal terminal 527 heats and softens the extreme end of the cap 526 made of quartz to pinch and seal it.

Incidentally, in the case where inscribed wire 524 is moved out of the cap and pinched, there occurs an inconvenience that crevices occur in the quartz seal terminal 527 due to a difference in thermal expansion coefficient between Mo and quartz to impair the sealing properties. In order to overcome such an inconvenience as noted above, the foil element 528 is provided and the cap is pinched by the quartz seal terminal 527 to seal it.

Figure 82:
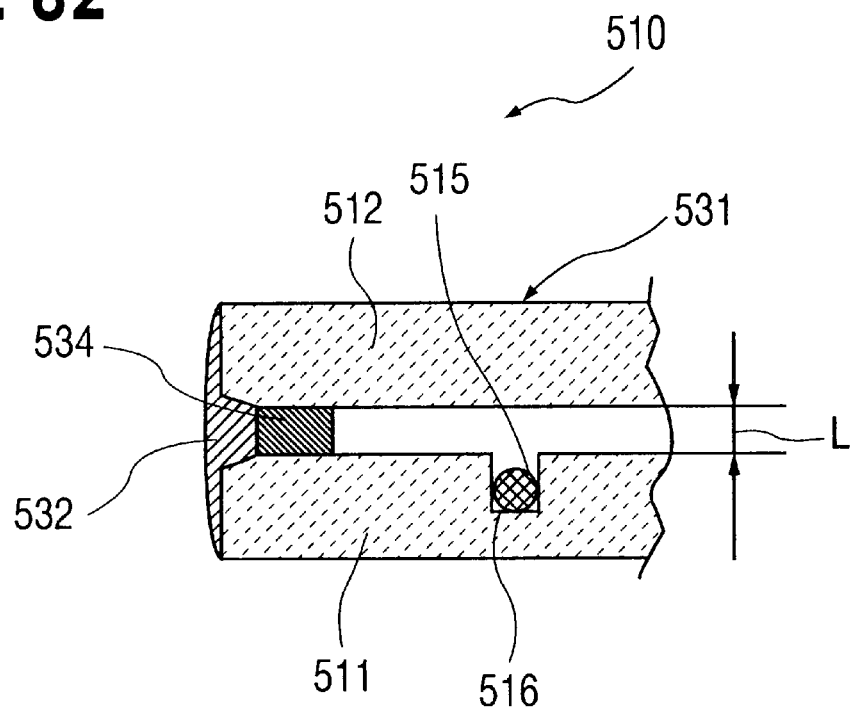
FIG. 82 is a fragmentary sectional view showing the outer peripheral portion of a carbon heater according to the invention of the 4th-2 group.
Figure 83:
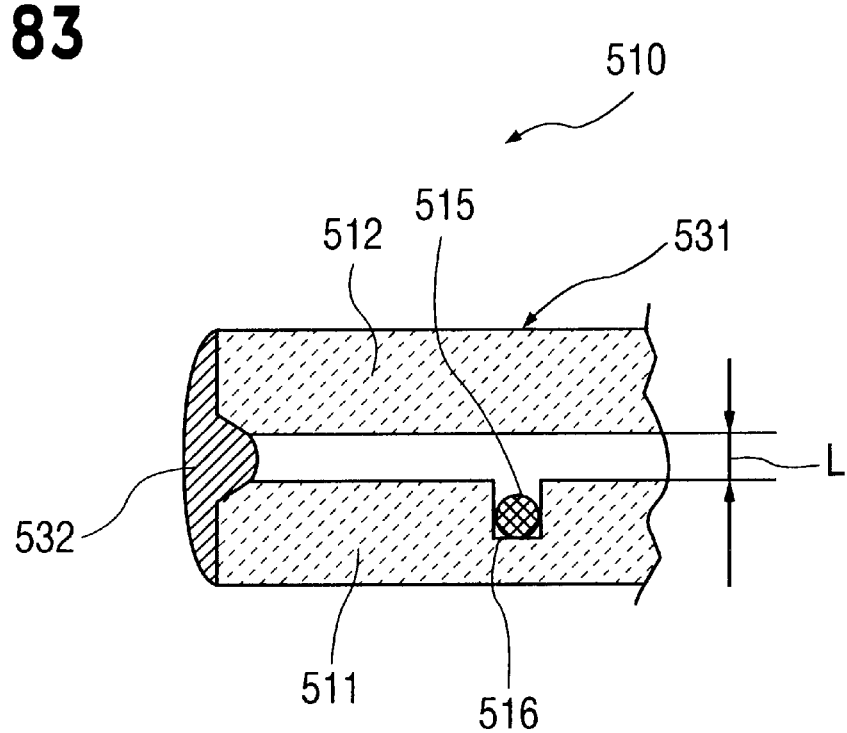
FIG. 83 is a fragmentary sectional view showing the outer peripheral portion of a carbon heater according to the invention of the 4th-2 group.

As shown in FIGS. 82 and 83, the opposed surfaces between the upper container 512 and the lower container 511 are opposed apart by distance L. The distance L is 0.2 to 1 mm.

When the distance L is shortened (in the vicinity of 0.2 mm), preferably, the opposed surfaces between the upper and lower containers 511 and 512 are subjected to mirror-surface processing. This is because when the face drip occurs due to polishing, the opposed surfaces may contact with each other to possibly bring forth a break. When the distance L is less than 0.2 mm, the possibility of break increases.

In the case where the distance L is taken long (in the vicinity of 1 mm), there is no possibility of the surface contact, thus requiring no mirror-surface processing. When the distance L exceeds 1 mm, however, welding flame enters to increase the possibility that the heat generating element 515 is oxidized.

The beveling is provided around the upper and lower containers 511 and 512. Thereby, the welding strength of the upper and lower containers 511 and 512 can be greatly enhanced. When only the right-angled corner is welded without providing the beveling, the side weld results to fail and a sufficient welding strength can not be obtained.

For example, when the wall-thickness of the upper and lower containers 511 and 512 is 6 mm, the chamfering of the beveling is C5. Generally, the width of C: y is preferably selected by $y \leq t-1$ mm (t is wall-thickness). This is because the chipping is prevented by leaving the upper end and the lower end of the upper and lower containers 511 and 512 about 1 mm. Preferably, welding is applied to not only the beveling but the build-up welding of about 1 mm is applied as indicated by numeral 532. In this case, the strength is further increased.

The provision of the spacing between the upper and lower containers 511 and 512 is also useful in preventing a break caused by a local difference in temperature during welding.

Welding of the upper and lower containers 511 and 512 with the spacing provided therebetween may be achieved, in case of FIG. 83, by placing a spacer having a thickness of 0.2 to 1 mm, 3 to 4-point build-up welding the outer peripheral portions of the upper and lower containers 511 and 512, removing the spacer, and then build-up welding the whole area of the outer peripheral portions. Furthermore, as shown in FIG. 82, a flame weir 534 having a height of 0.2 to 1 mm and a width of 0.1 to 9 mm is formed in advance, over the whole outer peripheral side of the upper container 512, on the upper container 512 by integral molding or welding, the upper container 512 and the lower container 511 are placed on top of other, after which a fixed quartz glass rod is applied to a beveling and heated by an oxygen-hydrogen burner to deposit the flame weir portion, and a build-up portion 532 is formed and welded.

Particularly, according to the latter method, (1) it is possible to prevent, to the utmost, the heater member from being oxidized due to the burner heating, (2) it is possible to make more uniform the dimension of the spacing between the upper and lower containers, and (3) it is possible to prevent a while cloud caused by $SiO_2$ fine powder from occurring on the outer peripheral portions of the upper and lower containers to enhance the heat-equalizing property of the present carbon heater.

The flame weir 534 may be provided on the lower container 511 at a height of 0.2 to 1 mm, and further on both the upper container 512 and the lower container 511 at a total height of 0.2 to 1 mm.

Welding of the upper and lower containers 511 and 512 is carried out while introducing the nitrogen gas from the gas introducing pipe 514 connected to the gas inlet and outlet 518. The nitrogen gas is introduced to discharge it from the periphery so as to push back the oxygen-hydrogen flame for welding whereby the heat generating element 515 arranged on the set recess 516 is prevented from being oxidized. The gas passage 517 need be arranged so as to be suitable for the action of the nitrogen gas as described. Furthermore, the introduction of the nitrogen gas is also useful in preventing the terminals in the quartz glass pipe and the wire-like carbon of the terminal wire from being oxidized.

Also in the annealing process carried out after welding, work progresses while introducing the nitrogen gas.

Thereafter, the wire-like carbon 522 is set to the quartz glass pipe 513 and a sealing terminal 523 is mounted, while introducing nitrogen.

The annealing process after the terminal portion body has been set is also carried out while introducing the nitrogen gas.

The gases introduced includes non-oxidizing gases such as helium, argon, neon and so on. However, nitrogen is reasonable from a viewpoint of economy.

After the quartz glass container has been assembled, the container is exhausted and the container is set to a fixed pressure. Thereby, the quartz glass pipe 513 assumes a fixed reduced state.

Generally, since the carbon material tends to be oxidized, it is necessary that the non-oxidizing gas such as nitrogen is filled in the container or the container is vacuumed.

However, since in the vacuum state, the reaction between the carbon material and the quartz glass is accelerated, the present invention employs a method for filling the container with the non-oxidizing gas.

In the method for heating the heater while introducing the nitrogen gas, the construction of the heat treatment apparatus becomes complicated due to the installation of a nitrogen gas line. Therefore, in the preferred embodiment of the present invention, the container is of the sealed type and some nitrogen gas is sealed therein. The sealing pressure is determined in the following manner.

For example, in the case where the pressure in the heat treatment furnace comprises both vacuum and normal pressure at 1000° C., the pressure in the heater is set to approximately 0.5 atm which is a middle between 0 and 1 atm. For achieving 0.5 atm at 1000° C., at normal temperature 20° C., 0.5 atm×293K/1273K×760 Torr/atm is equal to 87 Torr, and sealing is made after the interior of the heater is reduced so as to be 87 Torr at room temperature. The interior of the heater is set, for example, to about 0.1 atmospheric pressure.

That is, the assembling work is carried out while introducing nitrogen gas, and the nitrogen gas is removed from the gas introducing pipe 514 after completion of assembly to adjust the interior of the container at a fixed pressure.

The reduction in pressure of the container is advantageous from a viewpoint of durable life of the quartz glass container. The result of computer simulation shows that the quartz glass container for the heater is weaker with respect to pressure from interior than pressure from exterior. When the nitrogen gas is sealed to one atmospheric pressure at normal temperature, the internal nitrogen expands when the heater is heated so that pressure from the interior of the quartz glass container acts.

Finally, the gas introducing pipe 514 is sealed and removed by flame at a position near the lower surface of the lower container 511. Therefore, the gas introducing pipe 514 and the quartz glass pipe 513 are arranged at intervals to an extent capable of performing the dosing work.

The carbon heater effective particularly for a semiconductor treatment apparatus according to the present invention can be applied not only to the heat treatment apparatus as described above, but also to a washing apparatus for washing semiconductors at high temperatures.

EXAMPLE 4TH-2-1

A quartz glass plate having a thickness of 8.0 mm was applied with groove process and outside-diameter process and then the processed surface was subjected to polishing process by oxygen-hydrogen flame to obtain a lower container made of quartz glass which has an outside diameter of 240 mm and is semicircular. Further, a quartz glass plate having a thickness of 8.0 mm was used to form an upper container corresponding to the lower container.

A quartz glass pipe for introducing gas and a quartz glass pipe for terminal were welded to the lower container. The outside diameter of the former was 6.5 mm, and the outside diameter of the latter was 25.4 mm.

A set of heater members and terminals were arranged within the groove of the lower container and within the glass pipe for terminal and the upper container was put thereover, and the outer peripheries of the upper and lower containers were welded while introducing the nitrogen gas from the glass pipe for introducing gas. The beveling was C5, and the weld build-up was 1 mm. The thereafter processes were also carried out while introducing the nitrogen gas, as a rule.

The terminal portion body on the other end of the heater member was arranged and sealed on the open end of the quartz glass pipe. The annealing process was carried out.

Finally, the nitrogen gas was exhausted from the quartz glass pipe for introducing gas, the pressure in the container was set to 180 Torr, and the gas introducing pipe was sealed and removed.

The heating test was conducted using the carbon heater in the T-shape in section fabricated in the aforementioned procedure.

When a current is applied to the heat generating element and a temperature of the heater reached 1100° C., measured by way of a radiation thermometer, the pressure in the heater was measured. The pressure was about one atmospheric pressure. A temperature of a plurality of carbon wire bundles was 105° C.

With respect to the temperature of the heater, the time required from room temperature to 1100° C. was about 10 seconds.

The heater was used for 1000 hours at a heater temperature of 1100° C. No abnormal condition was found.

Further, the heating at a temperature of 1300° C. was also carried out without problem.

More preferred embodiments of the invention according to the 4th.-2 group will be described hereinafter with reference to FIGS. 84 to 94.

Figure 84:
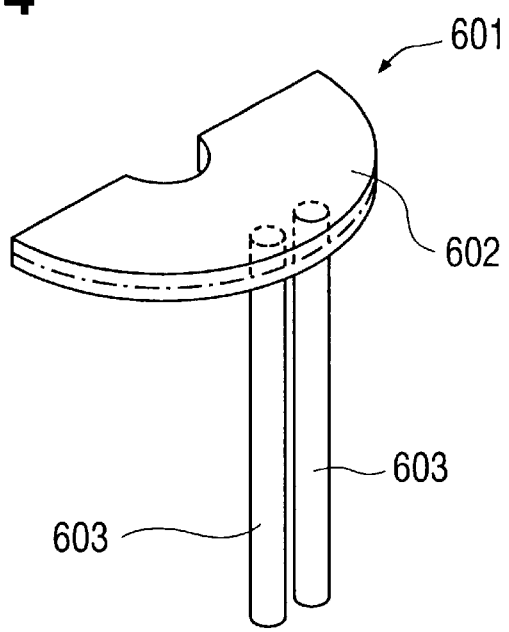
FIG. 84 is a perspective view showing a carbon heater to which is applied a terminal device according to the invention of the 4th-2 group.
Figure 85:
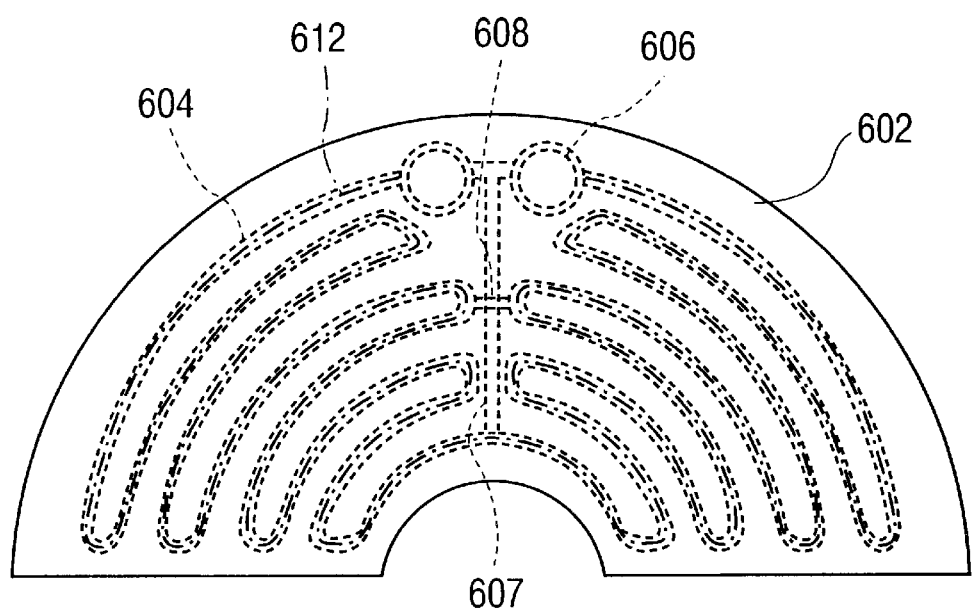
FIG. 85 is a top view of a carbon heater shown in FIG. 84.

FIG. 84 is a perspective view showing a carbon heater to which is applied a terminal device according to the present invention. FIG. 85 is a top view of the same.

A carbon heater 601 has a semi-doughnut shaped quartz glass container 602, and quartz glass pipes 603 are connected vertically to the lower portion thereof.

The quartz glass container 602 is composed of a container body and a lid member. The container body is formed with a groove 604 for arranging a heater member 612. Recesses 606 for terminals for arranging a terminal device are provided on both ends of the groove 604. Also, a gas inlet and outlet 608 for placing the container 602 in the non-oxidized atmosphere and a gas passage 607 are formed.

Two carbon heaters 601 are combined to form a circular heater surface, which can be used as a heater for a semiconductor heat treatment apparatus.

The terminal devices according to the present invention are arranged within the recess 606 for terminal and the quartz glass pipe 603.

The terminal devices according to the present invention include three kinds of terminal devices, that is, first terminal devices 610 and 600 for connecting a heater member 612 and a plurality of wire-like carbon terminal wires 613, a second terminal device 640 for connecting a plurality of wire-like carbon terminal wires 613 and a metal terminal wire 641, and a third terminal device 650 for connecting a metal terminal wire (inscribed wire) 641 internally of the quartz glass pipe 603 and a metal terminal wire (circumscribed wire) 653 on the power supply side.

First, the first terminal device will be explained with reference to FIGS. 86 to 91.

The terminal device 620 is constructed such that a terminal member 611 and a terminal wire connecting member 616 are connected using an intermediate member 634.

Figure 88:
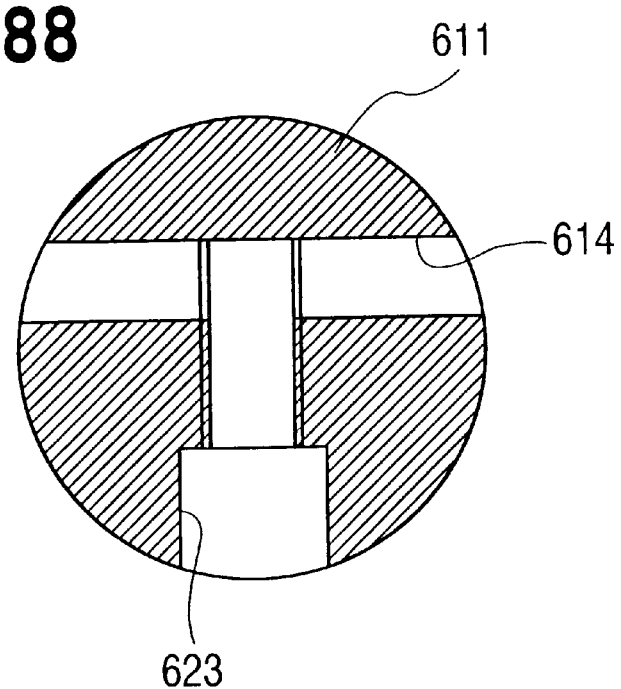
FIG. 88 is a sectional view taken on A—A of the terminal member shown in FIG. 87.
Figure 89:
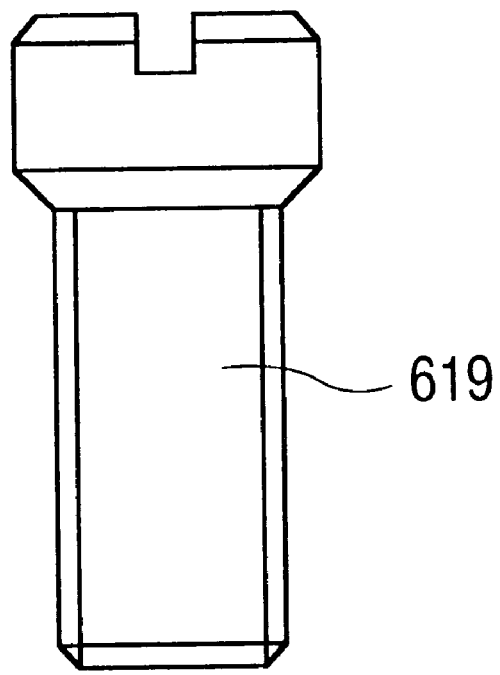
FIG. 89 is a side view showing a screw used for the terminal device shown in FIG. 86.
Figure 90:
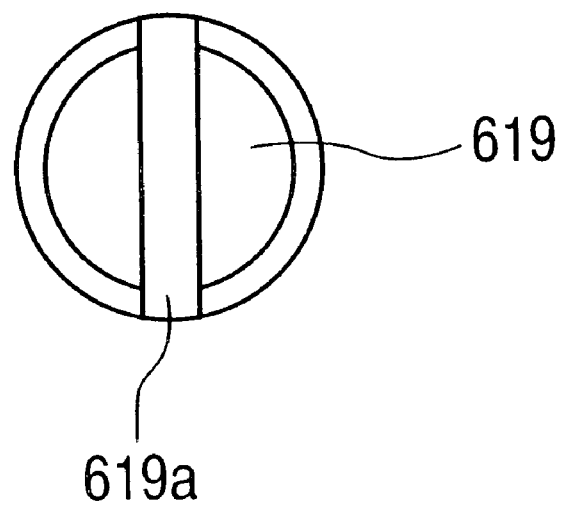
FIG. 90 is a top view showing the screw shown in FIG. 89.
Figure 91:
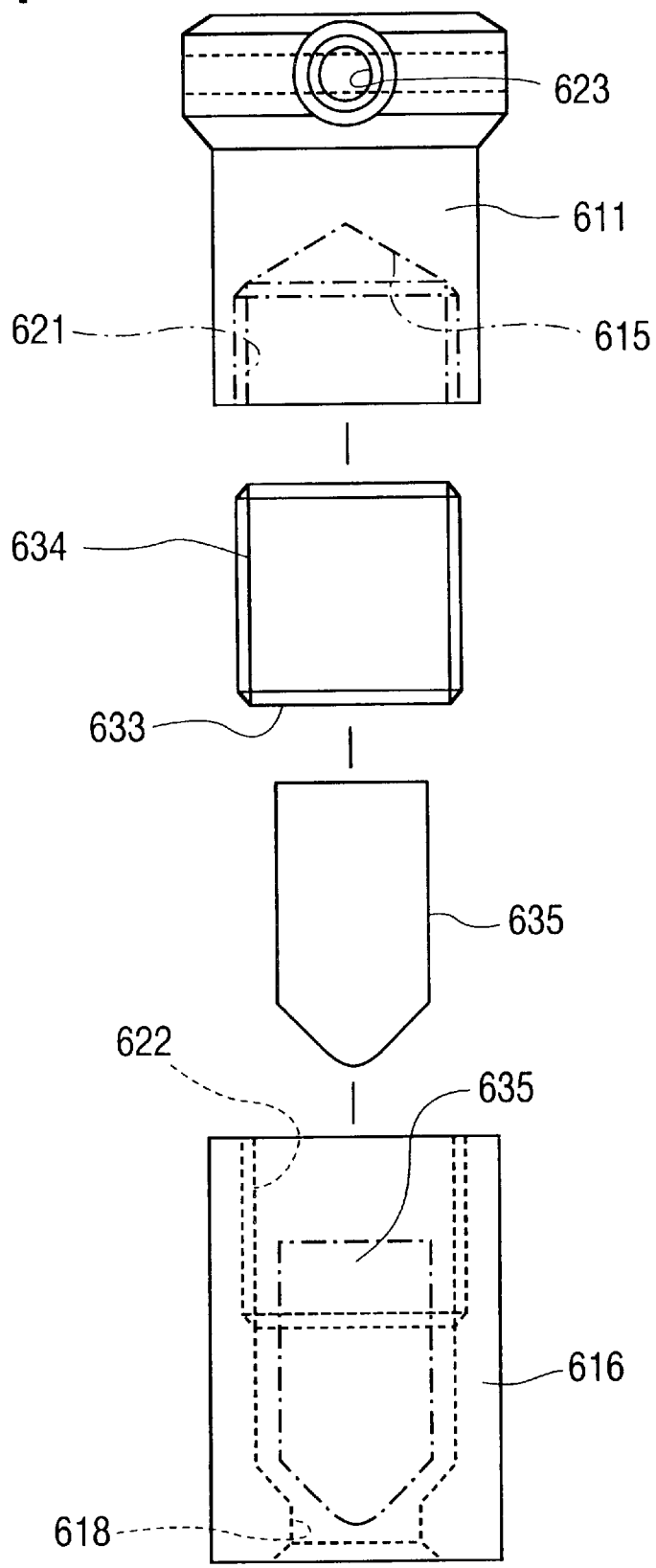
FIG. 91 is an assembly view of the terminal device shown in FIG. 86.

The contour of the rod-like terminal member 611 is wholly in the form of a columnar rod. The rod-like terminal member 611 is formed on one end with a through-hole 614 for inserting the heater member 612 parallel with the end. A tapped hole 623 is provided in communication with the through-hole 614. The through-hole 614 and the tapped hole 623 cross in the T-shape in the central portion of the through-hole 614 as shown in FIG. 88.

The heater member 612 is inserted into the through-hole 614, and a fixing screw 619 is screwed into the tapped hole 623 to lock the heat generating element 612. In this way, they are locked positively and firmly. Electric power can be supplied from the rod-like terminal member 611 to the heat generating element 612 without generation of spark.

The rod-like terminal member 611 is formed on the other end with a large-diameter blind tapped hole 615 for connecting a terminal wire guide member 616. The blind tapped hole is arranged on the axis. The terminal wire guide member 616 is connected to the terminal member 611 through an intermediate member 633.

The intermediate member 633 is a cylindrical member having an external thread portion 634 in the outer periphery thereof.

The terminal wire connecting member 616 is wholly formed to be cylindrical. The through-hole is conically narrowed in the vicinity of the lower end. In the inner periphery on the connecting end side opposite thereto is formed an internal thread portion 622 corresponding to the external thread portion 634 of the intermediate member 633.

A core member 635 is inserted into the through-hole of the terminal wire connecting member 616. The core member 635 is plane cylindrical, and the end on the terminal wire side is conically projected.

Only a part of the core member 635 can be inserted into the through-hole of the terminal wire connecting member 616. To this end, a recess may be formed in the intermediate member 633.

The terminal wire 613 formed from wire-like carbon is pressed and locked in the state that the former is sandwiched between the terminal wire connecting member 616 and the core member 635, and distributed. Alternatively, a plurality of shallow grooves may be provided on the outside of the core member 635 so as to guide divided wires.

Figure 86:
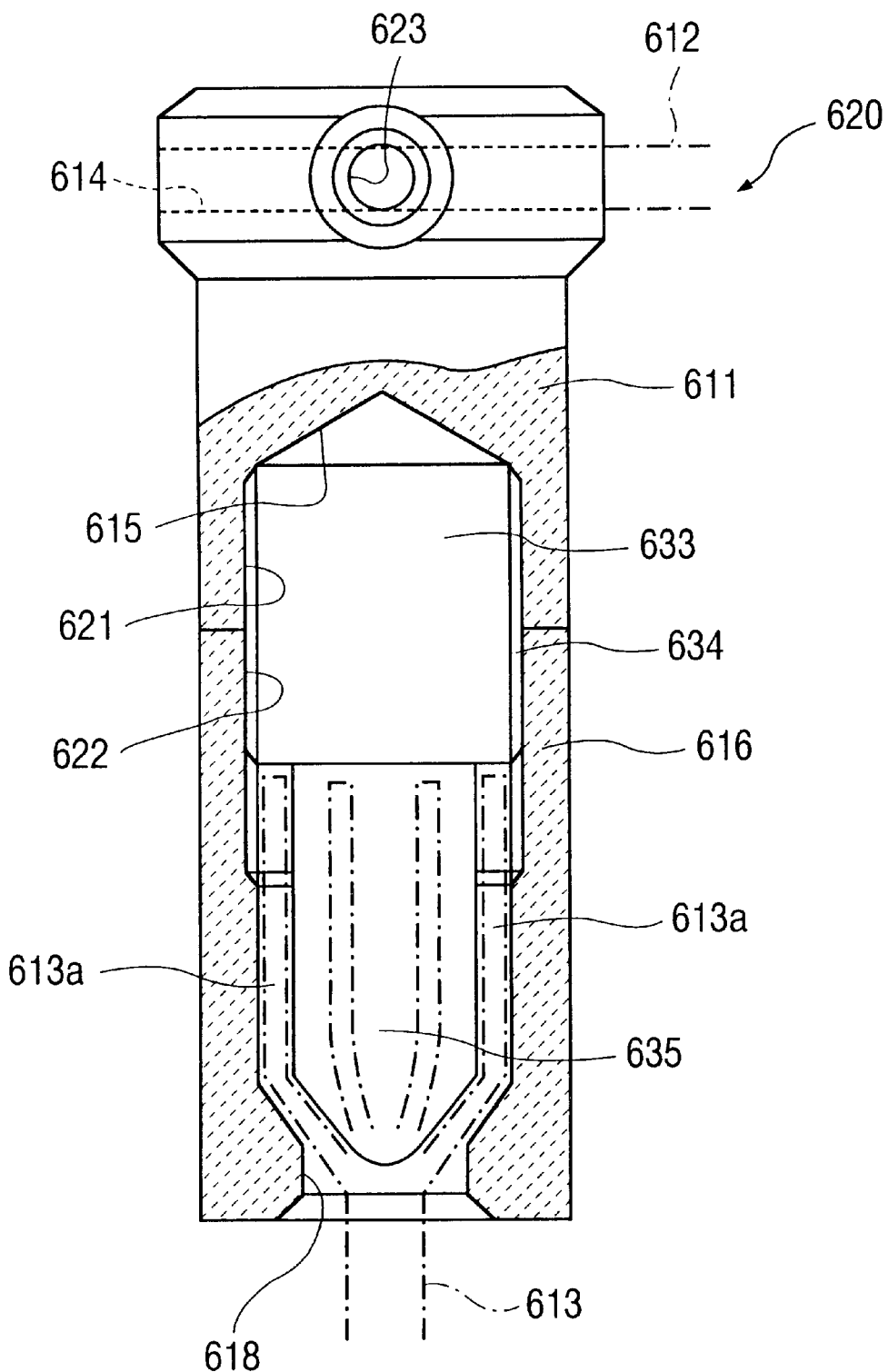
FIG. 86 is a fragmentary sectional view showing an embodiment of a first terminal device according to the invention of the 4th-2 group.
Figure 87:
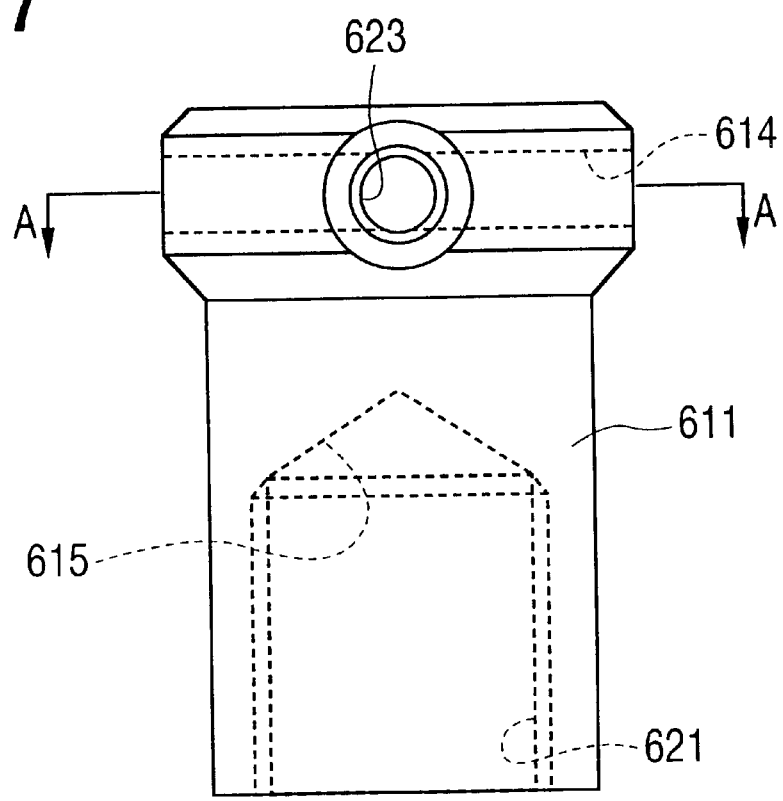
FIG. 87 is a side view showing a terminal member of the terminal device shown in FIG. 86.

In assembly, as shown in FIG. 86, a plurality of wire-like carbon terminal wires 613 are suitably distributed to a plurality of wires 613a and lightly held by the core member 635, the intermediate member 635 is screwed, so as not to be slipped out.

The set of the connecting member 618 having a plurality of wire-like carbon terminal wires 613 and the core member 631 is screwed into the terminal member 611 through the intermediate member 633 whereby the terminal wire 613a arranged in the groove-like region can be connected to the terminal member 611 firmly. Accordingly, the excellent conduction is assured.

Furthermore, it is possible to connect flexible carbon wires without generating abnormal stress within the carbon heater with respect to thermal expansion and thermal deformation.

Preferably, the wire-like carbon terminal wire 613 is formed of the same material as the heater member 612. In the case where materials are different, the resistance value per unit length of a plurality of wire-like carbon terminal wires 613 is made smaller than that of the heater member 612 to sufficiently suppress the heat generation of the terminal wires.

The temperatures of the wire-like carbon terminal wire 613 and the heater member 612 were generally in the ratio of resistance value. For example, in the case where the resistance value of the heater member 612 is 10 $\Omega$/m.pce. and that of the terminal wire 613 was 1 $\Omega$/m.pce., if the temperature of the heater member 612 is 1000° C. then, that of the terminal wire is approximately 100° C.

In the case where wire-like carbon terminal wire 613 is the same in material as the heater member 612, it is desirable that the number of wires for the terminal wire is made five times or more of that of the heater. Suppose that the number of wires for the terminal wire is four relative to one heater, when the temperature of the heater is 1100° C. as in the normal semiconductor processing, the temperature of the terminal wire was approximately 275° C. The temperature of 275° C. is a temperature at which a vacuum material such as biton is deteriorated. On the other hand, when the number of wires is five, the temperature of the terminal wire is approximately 220° C. which was below the heat resistant temperature 230° C.

In this way, the deterioration of biton can be prevented by lowering the temperature of the wire-like carbon terminal wire 613 for transmitting power.

Furthermore, since the wire-like carbon itself is composed of carbon fibers, it is possible to suppress the heat conduction from the heater. For example, the heat conductivity of normal special carbon material is 100 W/mK while that of the wire-like carbon is less than 1 W/mK.

The second terminal device will be explained hereinafter with reference to FIGS. 92 and 93.

In the terminal device 640, a terminal wire 613 formed of wire-like carbon and a metal terminal wire 641 are connected using the wire-like carbon connect member 643, the terminal portion body 642, and the metal wire connecting member 645.

The wire-like carbon connecting member 643 has generally the same shape as the terminal wire connecting member 616 in the first terminal device described previously and is similar in function thereof also.

The terminal portion body 642 is wholly a cylindrical member, and one end side thereof is provided a connecting portion 644 for connecting a wire bundle guide means 643. On the other end side is provided a connecting portion 646 for connecting the metal wire connecting member 645.

The connecting portion 644 is a large-diameter tapped hole having an internal thread portion.

The connecting portion 646 is formed with a tapered portion (hole) 642b for storing a core member 647. The tapered hole extends through the large-diameter taped hole. The connecting portion 646 is formed in the outer periphery thereof with an external thread portion.

The metal wire connecting member 645 is constituted as a cup-like member, which is placed over a connecting portion 46 of the terminal portion body 642 and screwed.

Figure 93:
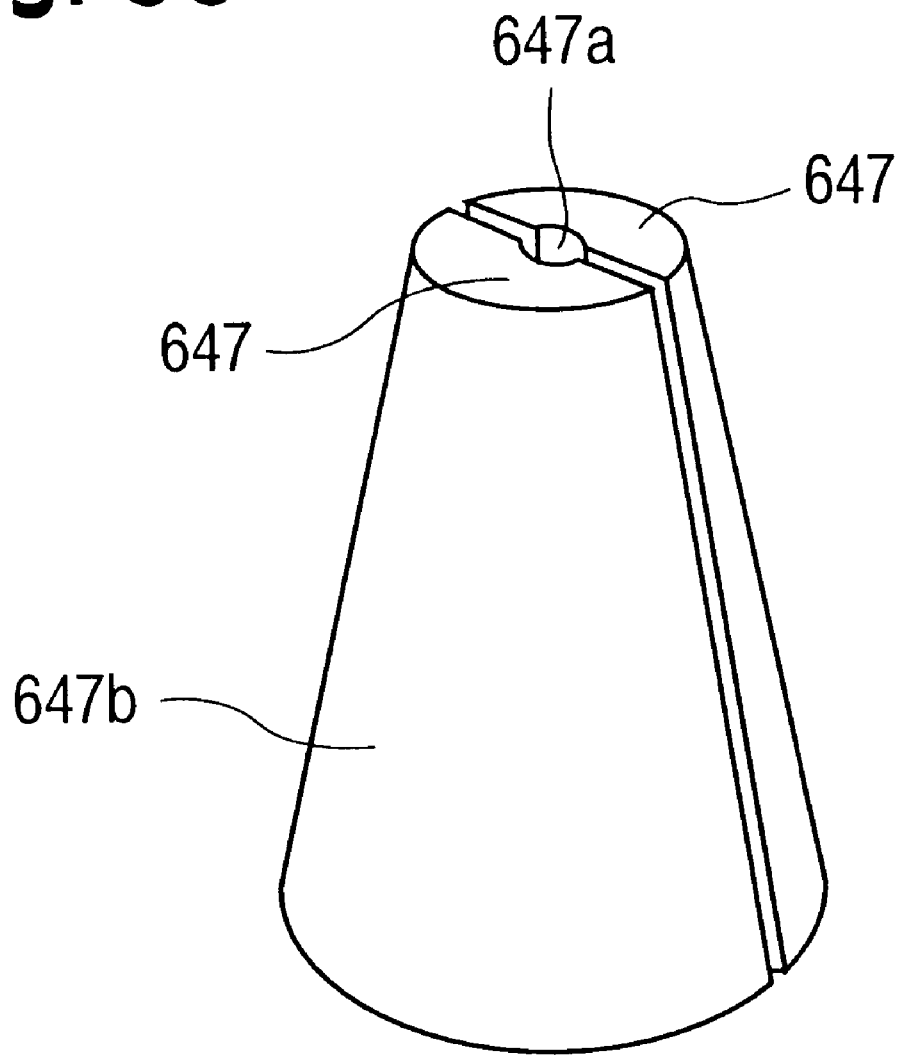
FIG. 93 is a perspective view showing a split mold core member of the terminal device shown in FIG. 92.

As shown in FIG. 93, the core member 647 comprises two split molds, and when they are joined together, a truncated cone results. The tapered surface of the outer periphery corresponds to the tapered portion 642b of the terminal portion body 642. A groove-like holding portion 647a for holding a metal wire is provided on the opposed surface of each split mold.

The connecting portion 644 of the terminal portion body 642 and the bottom of a plurality of wire-like carbon connecting members 643 (on the side opposite to the wire bundle 613) are connected through a cylindrical core 648 having a thread portion in the outer periphery thereof.

Figure 92:
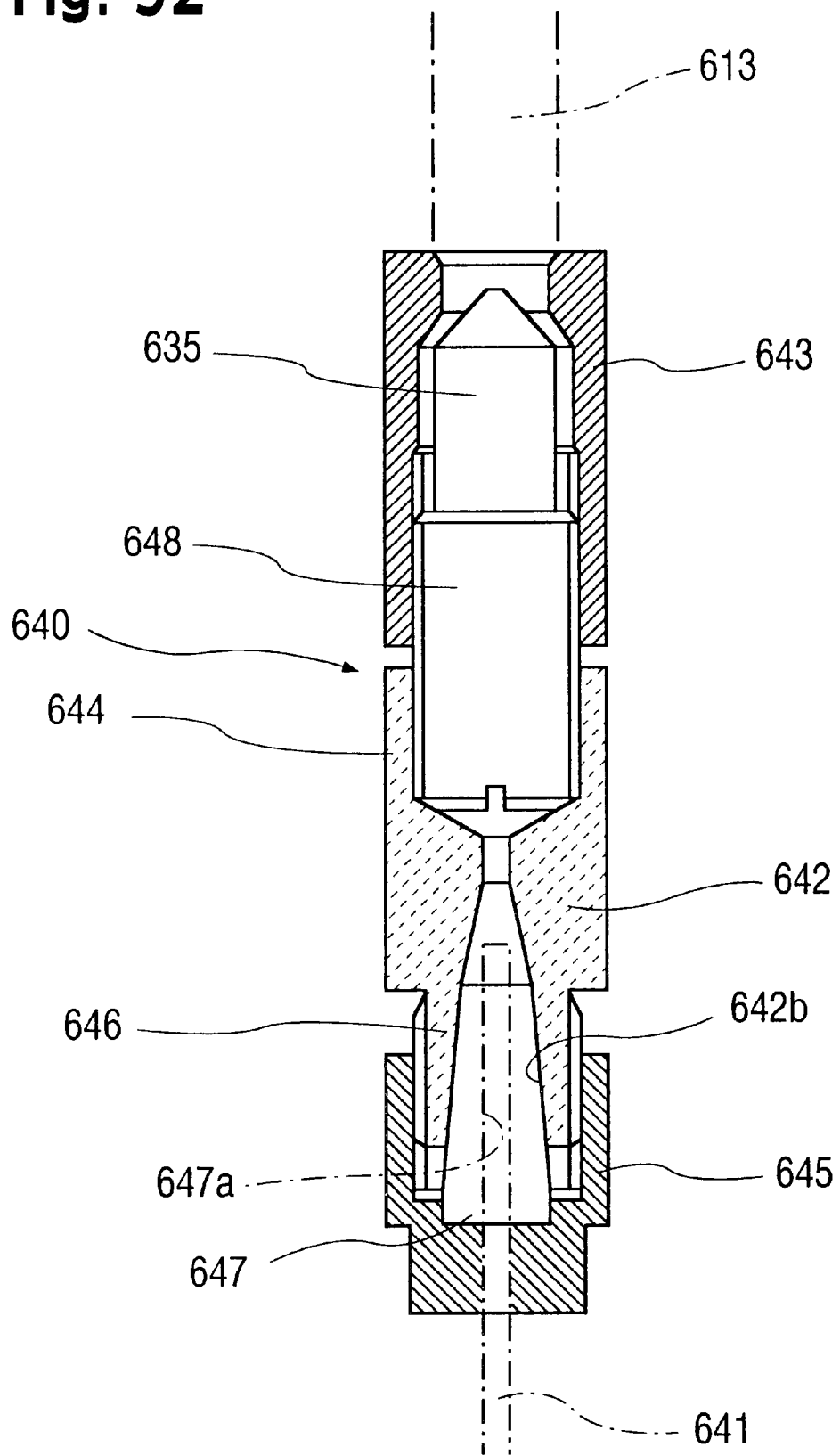
FIG. 92 is a sectional view showing a second terminal device according to the invention of a 4th-2 group.

As shown in FIG. 92, the metal wire connecting member 645 is screwed into the connecting portion 646 of the terminal portion body 642 in the state of holding the metal wire 641 whereby the metal wire 641 can be connected to the terminal portion body 642 positively to prevent generation of spark. This results from the tape engaging action between the split core 647 and the taper hole of the terminal portion body 642.

As the metal terminal wire 641, a metal rod 641 made of Mo (molybdenum) is preferably used, but W can be also used.

Since Mo has the thermal expansion coefficient extremely close to carbon material the crevice such as crack can be prevented due to the thermal hysteresis of the carbon-made terminal body.

Further, since Mo is high, approximately 2100° C., in melting point, it is possible to suppress generation of metallic impurities. Therefore, the Mo-made metal rod is suitable as an inscribed wire (a terminal wire on the heater side) of a seal terminal made of quartz.

Preferably, the terminal portion body 642 and the core member 647 are formed of carbon material. The carbon material is convenient because it tends to be purified and can withstand a high temperature of 3000° C. Further, since the core member 647 supports a molybdenum rod, carbon material having the thermal expansion coefficient close to molybdenum is suitable to prevent crack. Both the thermal expansion coefficients of Mo and carbon material are 4.2 to $4.8 \times 10^{-6}/°$ C.

Figure 94:
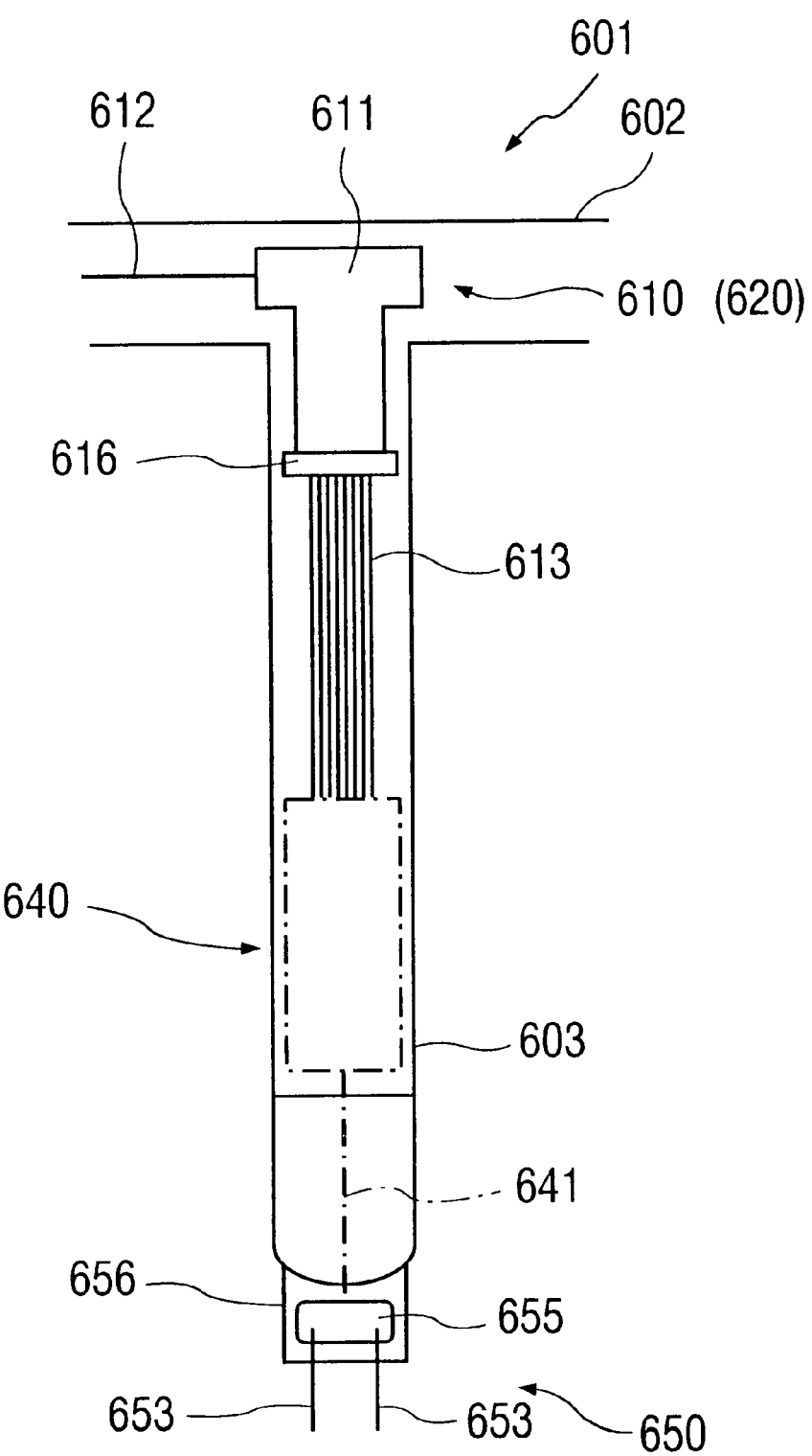
FIG. 94 is a schematic view showing a first to third terminal devices and a part of a carbon heater to which said terminal devices are applied according to the invention of the 4th-2 group.

Finally, the embodiment of the third terminal device will be explained with reference to FIG. 94. FIG. 94 schematically shows a part of the carbon heater and the first to third terminal devices.

The first terminal device and the second terminal device are connected by a plurality of wire-like carbon terminal wires 613 within a glass pipe 603. The plurality of wire-like carbon terminal wires 613 are used as conductors as described above to thereby lower the resistance to suppress the heat generation. The wire-like carbon is advantageously extremely small in heat conduction.

Preferably, nitrogen or argon gas is charged into the glass pipe 603. Thereby, the oxidization resistance at high temperature of the terminal device arranged in the pipe can be enhanced.

The third terminal device 650 is to connect an inscribed wire 641 arranged internally of the quartz glass pipe 603 and a circumscribed wire 653 on the power supply side.

In this embodiment, the inscribed wire 641 is a molybdenum rod 641. The molybdenum rod 641 has one end connected to the second terminal device 640 and the other end connected to a molybdenum foil 655. The molybdenum rod 641 is connected to the heater member 612 indirectly. A cap made of quartz glass is connected to the lower end of the quartz glass pipe 603, and the molybdenum rod 641 is drawn through the cap.

Two circumscribed wires 653 are drawn outside from the bottom side of the molybdenum foil 655. The circumscribed 653 may be of one pole.

A pinch seal portion 656 is formed so that the whole molybdenum foil 655 is embraced. The pinch seal portion 656 cuts off the molybdenum foil 655 from the interior of the glass pipe 3 and the atmosphere. The pinch seal portion 656 is made of quartz glass.

The pinch seal portion 656 is formed, for example, by heating and softening the extreme end of the cap made of quartz, pinching and sealing it.

As described above, the heater member 612 having the carbon fiber bundles woven is connected to the inscribed wire 641 not directly but indirectly. It is important to arrange the heat generating element at a distance thermally.

As the circumscribed wire 653, two molybdenum rods whose diameter is 1.4 mm to 2.0 mm can be used.

As the inscribed wire 641, a molybdenum rod whose diameter is 1.4 mm to 2.0 mm can be used.

As the quartz pipe 603, a pipe whose contour is 15 mm or more can be used.

As the molybdenum foil 655, one whose width is 8 mm or more, and thickness is 0.2 mm to 0.5 mm can be used.

EXAMPLE 4TH-2-2

Example 4th-2-2 relates to the first terminal device.

Two terminal members purified in the nitrogen atmosphere are arranged, and two purified heater members are fixed at intervals of 1 m therebetween. At this time, the resistance value was 5 Ω. 18 heater members are secured to the terminal members using the core member and the terminal wire connecting member to prepare a terminal device shown in FIG. 86. Power was supplied from the heater members to the heater.

After 10 minutes, the temperature of the heater was 1100° C., and the resistance value was 2.5 Ω. At this time, the temperature of 18 carbon wires measured was 105° C.

The heater was used for 1000 hours, and no change in resistance was confirmed.

The carbon wire terminal members and other carbon members used were purified to less than 5 ppm in ashes.

On the other hand, the non-purified articles were used, and they were broken in 16 hours. The carbon wire heater portion after broken was observed by EPMA, and deterioration caused by iron was considered.

As described above, preferably, the heater members and other carbon members are less than 5 ppm in ashes. Further, the iron concentration of purified carbon material is preferably less than 0.1 ppm.

EXAMPLE 4TH-2-3

Example 4th-2-3 relates to a second terminal device.

A metal rod made of Mo having a diameter of 2 mm was used to prepare a device shown in FIG. 92. The carbon wire heater was arranged in the container made of quartz glass and the interior of the container was maintained in the nitrogen atmosphere, and the terminal device in Example 4th-2-2 and the terminal device in Example 4th-2-3 were connected.

Two heater members having a length of 1 m were wired. The resistance value of the heater was 5 Ω at room temperature and 2.5 Ω when heated at 1100° C. When the heater is at 1100° C., the temperature of the wire-like carbon terminal wires (18) was 105° C. The metal terminal portion made of Mo was at 55° C.

The carbon heater was used for 1000 hours, and as a result, no damage such as crack occurred in the terminal body and no other problems occurred.

The carbon member of the terminal device in Example 4th-2-3 used was also purified similar to that of Example 4th-2-2.

EXAMPLE 4TH-2-4

Example 4th-2-4 relates to a third terminal device.

Two circumscribed wire having a diameter of 1.4 mm, a quartz pipe having an outside diameter of 15 mm, and a Mo foil having a width of 8 mm were used to prepare a third terminal device as shown in FIG. 94. It has been confirmed that when a current of 30 A causes to flow into the terminal device, no break such as crack occurred in the sealed portion.

According to the terminal device for the first carbon heater according to the invention of the 4th-2 group, the heater members and the terminal wire formed from a plurality of wire-like carbons can be connected positively and easily. This terminal device is simple in construction and excellent in life.

According to the terminal device for the second carbon heater according to the invention of the 4th-2 group, the terminal wire formed from a plurality of wire-like carbons and the terminal wire made of metal can be connected positively and easily. This terminal device is simple in construction and excellent in life.

According to the terminal device for the third carbon heater according to the invention of the 4th-2 group, even if it is used with a high current of about 30 A, the long life can be enjoyed.

The invention of the 4th-2 group is not limited to the aforementioned embodiments. For example, the relationship between the internal threads and external threads of various members and the relationship between irregularities can be freely reversed. Such a change in design can be readily achieved by those skilled in art on the basis of description of the present specification, and will not be described in detail.

Invention of the 5th Group

Preferred embodiments of the invention according to the 5th group will be explained hereinafter with reference to FIGS. 41 to 61.

Figure 41A:
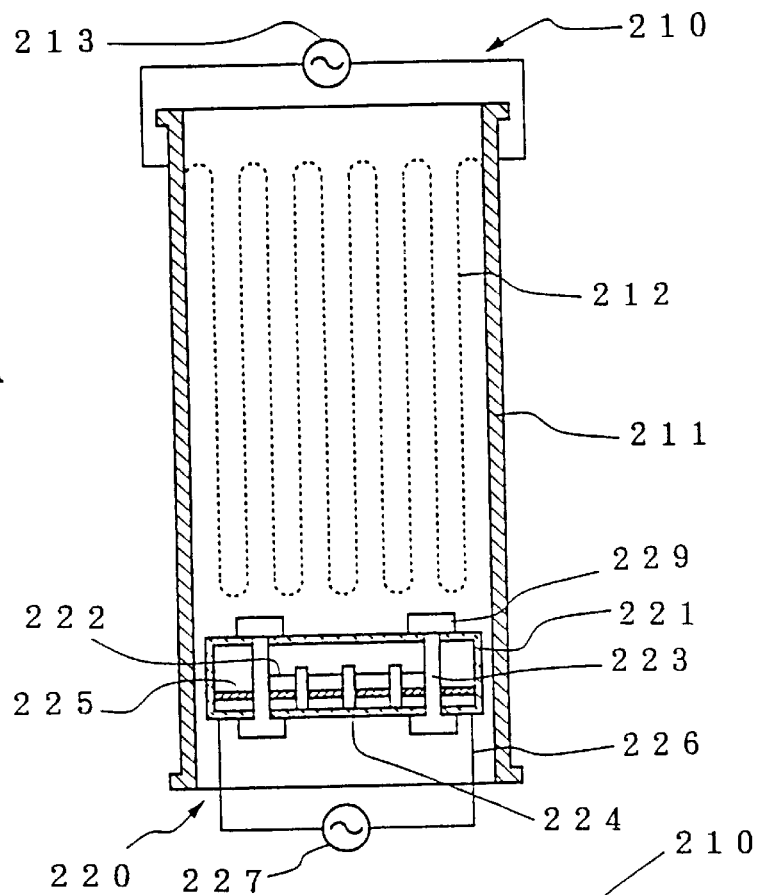
FIGS. 41(A) and (B) are respectively schematic views showing a first embodiment and a second embodiment in which the invention of a fifth group is used for a semiconductor heat treatment apparatus.
Figure 41B:
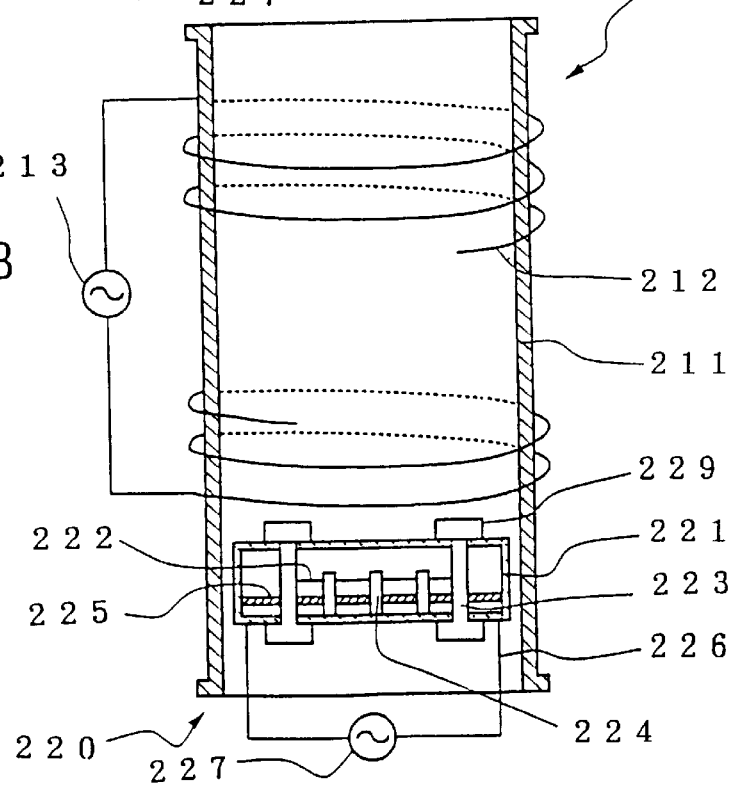

FIGS. 41(A) and (B) are schematic views showing a first embodiment and a second embodiment in which the invention of the 5th-group is used for a semiconductor manufacturing apparatus.

A heater unit 210 is provided with a furnace core tube 211, and a heater member 212 is wound therearound. In the first embodiment shown in FIG. 41(A), the heater member 212 is wound so that it reciprocates in a longitudinal direction, whereas in the second embodiment shown in FIG. 41(B), the heater member 212 is wound spirally.

In the heater member 212 of the second embodiment and first embodiment, if it is divided into a plurality of zones which are separately controlled, temperature distributions in upper and lower parts in the furnace are easily controlled uniformly.

As the heater member 212, a carbon wire of high purity with ashes less than 3 ppm is suitable. By using such a high purity carbon wire, it is possible to prevent impurity contamination and since thermal conduction is small rapid temperature rising and decreasing are enabled. However, a heater made of metal can also be used.

At the lower part inside the furnace core tube 211 is arranged a carbon heater 220 in the form of a flat plate container comprising a heater member 222 in which a plurality of carbon fiber bundles combining a plurality of carbon fibers are woven into a wire-like elongated shape. As the heater member 222, a tape shape can be also used as long as it is in an elongated shape. As a specific example of the heater member, nine carbon fiber bundles having 330 carbon fibers whose diameter is 3 $\mu$m bundled are used and woven into a wire-like shape whose diameter is about 2 mm.

Figure 42:
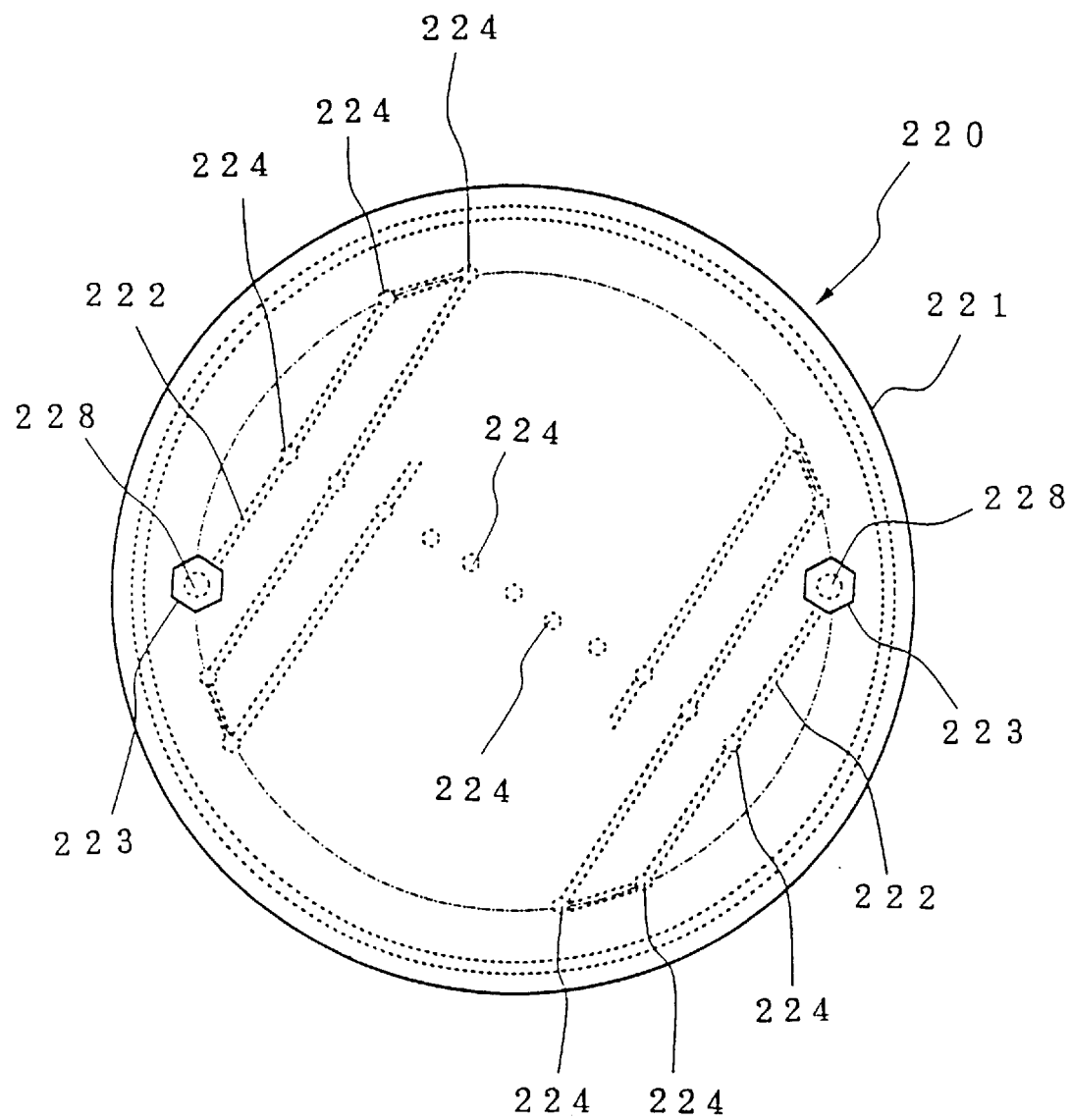
FIG. 42 is a plan view showing a heat unit shown in FIG. 41.
Figure 43:
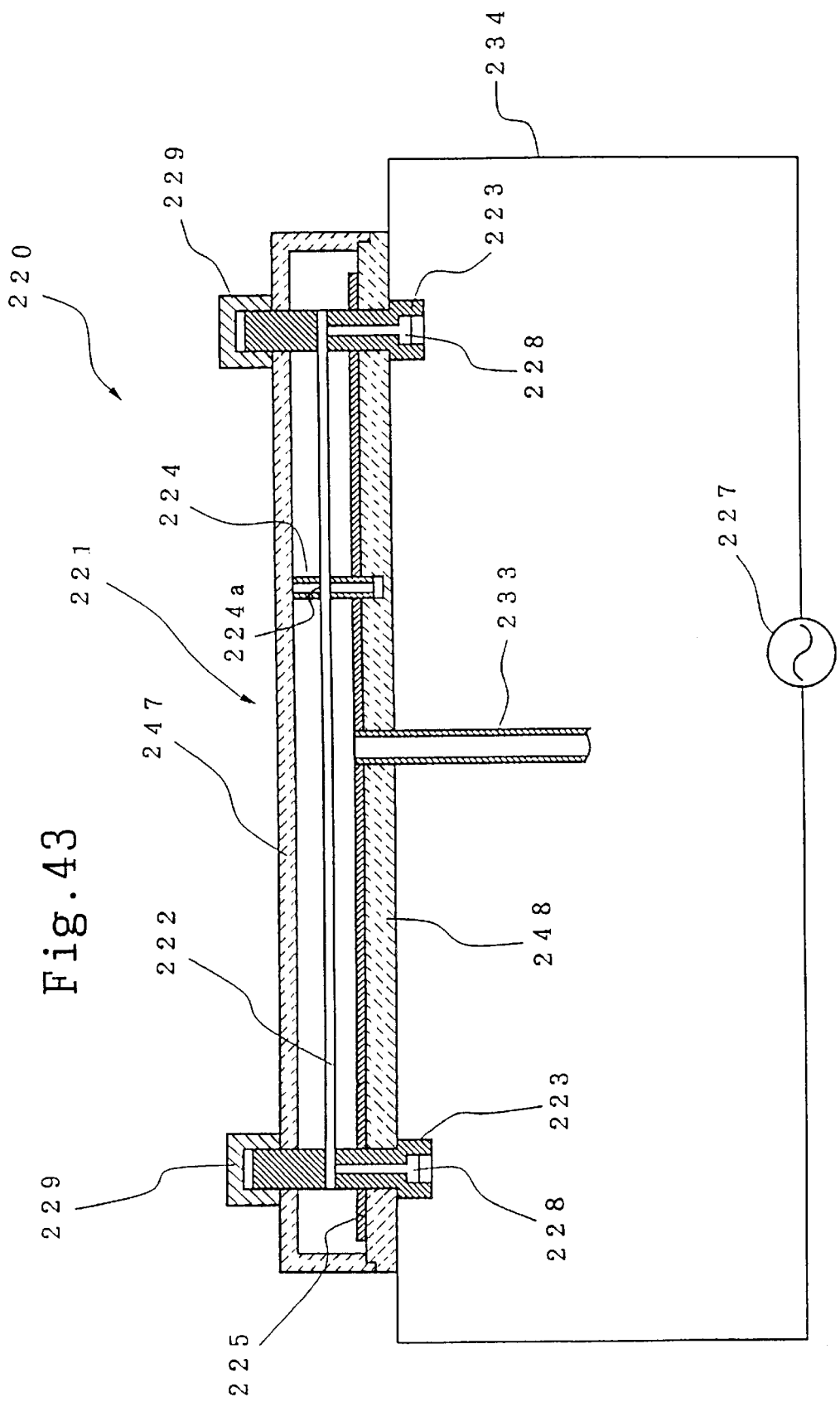
FIG. 43 is a sectional view showing the heat unit shown in FIG. 41.

FIGS. 42 and 43 are respectively a top view and a sectional view showing the carbon heater 220.

The carbon heater 220 is constituted such that the heater member 222 is supported by a rod-like terminal member 223 made of high purity carbon and a wire support jig 224 formed of a single transparent alumina within a container 221 made of quartz glass.

The container 221 made of quartz glass can be constituted of transparent quartz and comprises a container body 247 and a base 248. The container body 247 and the base 248 are joined by ground glass.

The outer surface exposed portion, particularly the upper surface to be the heat generating surface of the container body 247 is formed to be semicircular in section, or a trapezoidal gibbous portion being stripe as a whole, or concentric circular, or lattice-like. The outer surface is preferably subjected to glossing process. This obtains the prism effect that the heat generation upward of the heater surface caused by the linear heat generating element such as the heater member according to the present invention is made uniform by the scattering of light.

Normally, in order to obtain the similar effect, there is employed a method for sand-blasting the heater surface. In this case, however, the surface is in the form of the meshes of sand so that the radiation from the surface is suppressed, and heat is accumulated on the quartz glass itself to lower the energy efficiency. In this sense, the glossing process is an important matter.

Furthermore, the container made of quartz glass can be also constituted of opaque quartz in which a number of fine closed pores are present.

A branch pipe 233 made of quartz glass is connected to the base 248. Inert gas or nitrogen gas and so on can be introduced from the branch pipe 233 in order to prevent oxidization of carbon which is a heater member. Also in the case where the container is exhausted to vacuum, for example, less than 10 torr, the branch pipe 233 can be utilized.

The upper surface of the base 248 is provided with a number of inserting holes for setting the wire support member 224 described later and two through-holes through which the rod-like terminal member 223 passes.

The base 248 is constituted of opaque quartz glass in order to prevent heat from escaping downward of the carbon heater 220. A carbon reflecting plate 225 formed of glassy carbon is arranged on the upper surface or above the base. By placing the reflecting plate 225 under the heater member 222 as described above, downward heat radiation can be reduced. The surface of the reflecting plate 225 is applied with mirror-surface processing of which a center line average roughness Ra is less than 0.1 $\mu$m.

As described above, in the invention according to the 5th group, the heater member 222 in which a plurality of carbon fiber bundles having carbon fibers bundled are used, and are woven into a wire-like elongated shape is used as the heater, the heater is bended by the plurality of wire support jigs 224, and a substantially disk-like element like a semiconductor wafer is heated so that the in-plane temperature distribution is uniform.

To this end, it is an important point how the heater member 222 is placed in an uniform stretched state.

In the invention of the 5th group, as shown in FIG. 42, first, the heater members 222 are caused to pass through the through-holes of all the wire support jigs 224, both ends are respectively caused to insert through lateral holes 237 of the rod-like terminal members 223, after which the heater members 222 are pressed and held on one rod-like terminal member 223 by means of bolt-like keep members 228, and similarly pressed and held by the bolt-like keep members 228 while pulling the other one heater member 222 with an adequate force.

Preferably, the heater member 222 with ashes less than 10 ppm is used. In this case, the impurity contamination can be prevented, and since the heat conduction is small and the thermal capacity is also small rapid temperature rising and decreasing is enabled.

The heater members 222 are guided by the wire support jigs 224 and have a plurality of bends on the surface parallel with the surface of the container 221, and arranged in a zigzag pattern. The rod-like terminal members 223 are arranged on both ends of the heater member 222, and power is supplied therethrough.

Figure 44:
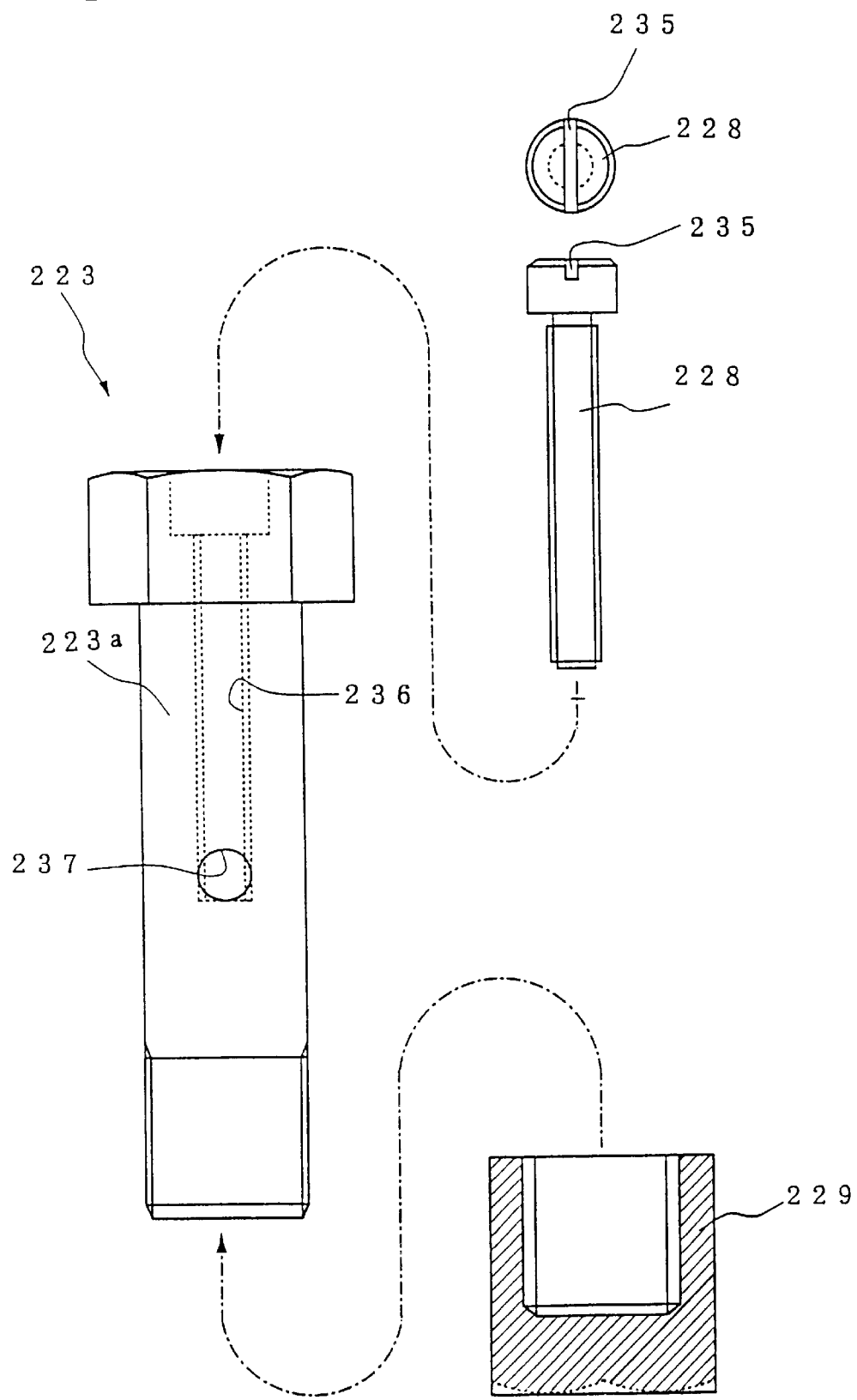
FIG. 44 is an assembly view of a rod-like terminal member made of carbon of FIG. 41.

FIG. 44 is an assembly view of the terminal members 223. The terminal member 223 comprises a terminal body 223a, a keep member 228, and a cap 229. At least a part of the exposed portion, preferably, the whole exposed portion of the terminal member 223 is subjected to coating with SiC. If such a SiC coating is carried out, the terminal member 223 can be used even in the atmospheric pressure.

The terminal body 223a is made of carbon, and is formed into a bolt shape as a whole. The through lateral hole 237 perpendicular to the axis is bored in the vicinity of the intermediary in an axial direction of the terminal body 223a. An axial hole 236 for storing the keep member is formed across the lateral hole 237 extended through from a hexagonal head of the terminal body 223a. The axial hole 236 is formed in the inner wall thereof with threads. The terminal body 223a is also formed in the leg thereof with threads. While in FIG. 44, the head of the terminal body 223 is hexagonal, but other shapes can be employed if the head can be rotated by a tool such as a spanner.

The keep member 228 is formed into a screw shape corresponding to the axial hole 236 of the terminal body 223. The head is provided with a groove 235 for a minus screw driver. The keep member 228 is screwed into the axial hole 236 of the terminal body 223 to keep the heater member 222 inserted into the through-hole 203. The heater member 222 is placed in firm contact with the terminal body 223a using the keep member 228 to prevent the heater member 222 from slipping off and from occurrence of spark.

The cap 229 is formed into a nut shape corresponding to the threads of the leg of the terminal body 223a.

An expansion graphite sheet (not shown) is put on the terminal body 223a and the contact portion between the cap 229 and the quartz glass surface to prevent an air leakage into the heater and an occurrence of dust.

Figure 45A:
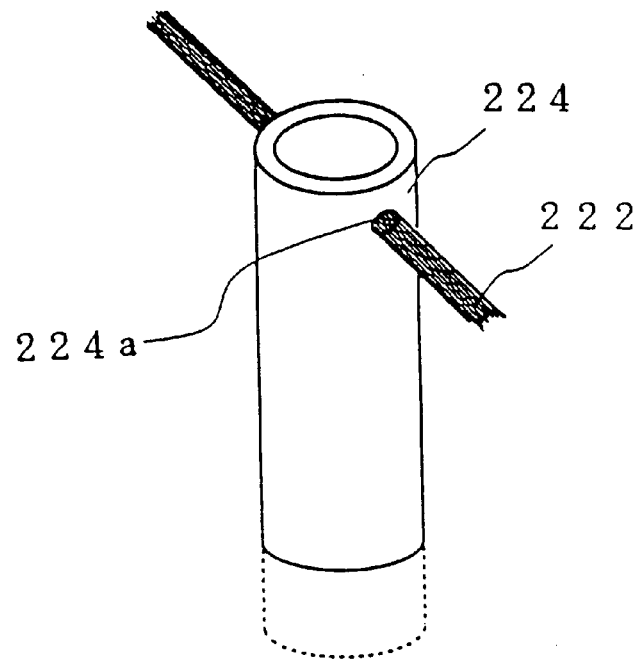
FIG. 45(A) is a perspective view showing a wire support fitting shown in FIG. 41, (B) being a sectional view showing a modified example thereof.
Figure 45B:
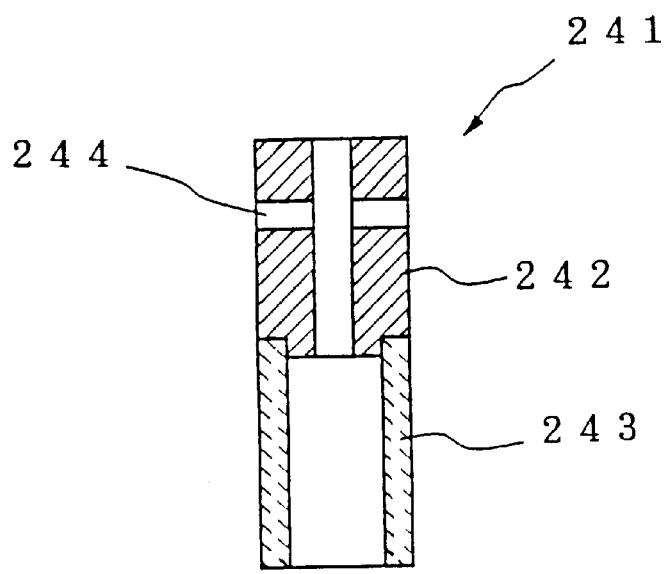

FIG. 45(A) is a perspective view showing the wire support jig 224 of FIGS. 42 and 43, and FIG. 45(B) is a sectional view showing a modified example of the wire support jig.

The wire support jig 224 is of a thin cylindrical shape and is bored with a hole 224a through which the heater member 222 passes. The root portion of the wire support jig 224 is embedded into the set hole of the quartz glass container 221.

The heater member 222 is supported by the wire support jig 224 so that the heater member 222 is not in touch with the quartz glass container. In this way, it is possible to prevent the wire from being silicified and the specific resistance from being changed.

When the wire support jig 224 is formed to be thin cylindrical, that is, pipe-like, the upward heat radiation can be increased and the thermal capacity can be made small. When the thermal capacity is small, the thermal response becomes quick to withstand the thermal shock.

The wire support jig 224 can be formed of transparent alumina. In this case, since the heat radiation from the transparent portion increases, the temperature equalizing property of an article to be processed can be enhanced.

The characteristics required for the wire support jig 224 are the unreactivity between the former and the heater member 222 under a high temperature of for example, approximately 1300° C., and non-conductivity. The transparent alumina is satisfied with both the conditions. That can be formed by the single transparent alumina. However, even the transparent alumina, when an attempt is made to enhance a degree of rapid temperature rising, there is a possibility that crack or break occurs in the wire support jig due to the thermal shock. The construction for solving this comprises an assembly member of a high purity carbon and the transparent alumina. Particularly, the construction in which a portion in contact with the heater member of the assembly member comprises a high purity carbon material and a portion arranged in and connected to the flat plate-like container 221 of the assembly member comprises a permeable alumina material is optimal.

A wire support jig 241 shown in FIG. 45(B) comprises a construction in which a carbon member 242 and an alumina pipe member 243 are connected. The carbon member 242 is formed with a lateral hole 244 through which a heater member 222 of a carbon wire passes.

FIGS. 46 to 60 show modified embodiments of FIGS. 42 to 44.

Figure 46:
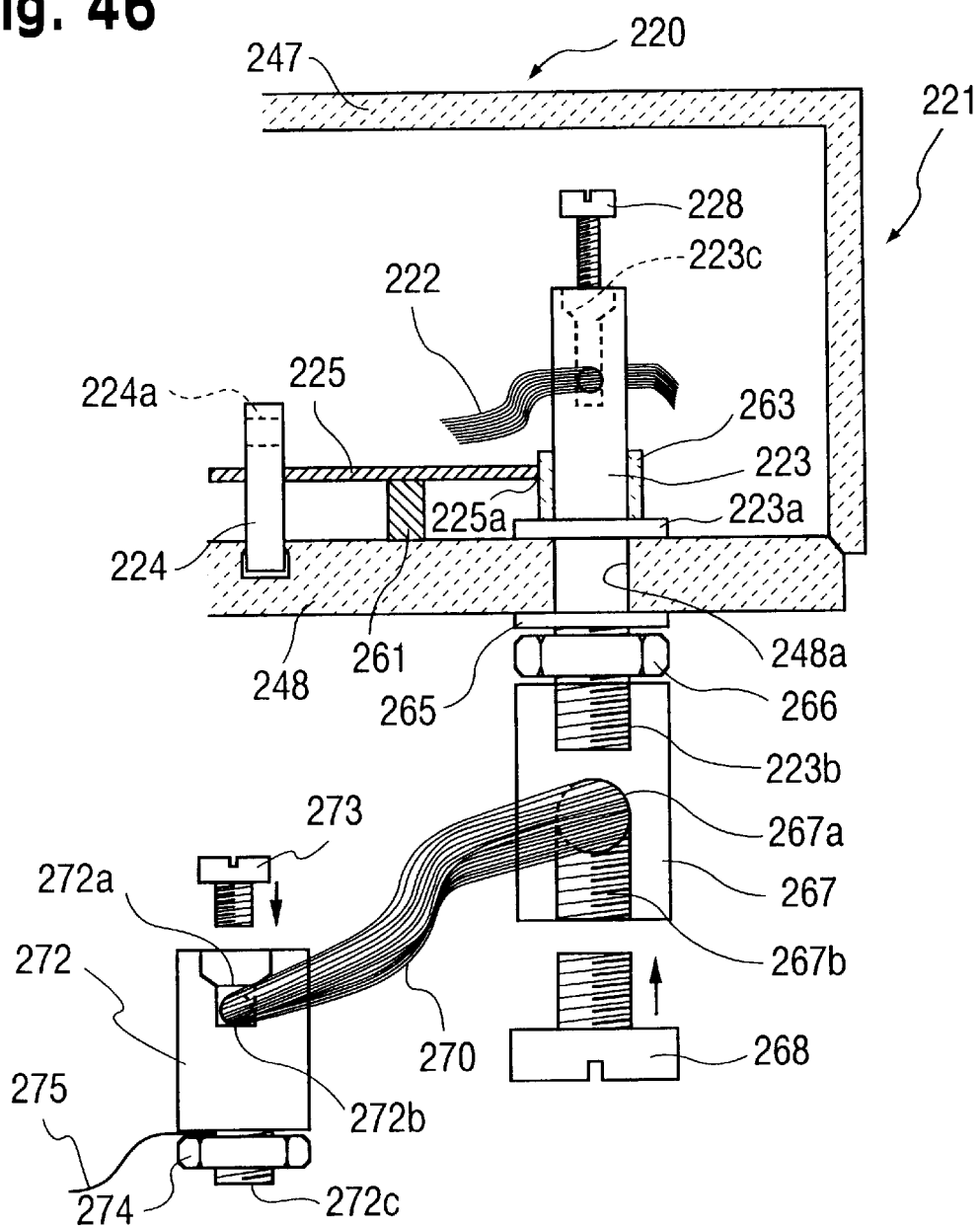
FIG. 46 is a sectional view showing an outline of main parts in another embodiment of a heater unit according to the invention of a fifth group.

FIG. 46 is a sectional view showing main parts of a heater unit 220. The rod-like terminal member and the construction of connecting the former to the heater member are substantially common to those of the embodiments of FIGS. 42 to 44 and the embodiments of FIGS. 46 to 60. The featurized construction will be explained hereinafter.

The heater member 222 is constructed such that a plurality of carbon fiber bundles comprising carbon fibers are woven into a wire shape. As the heater member 222, a tape shape thereof can be also used as long as it is in an elongated shape. Preferably, the heater member 222 is of a weaving type having a certain thickness (about 2 mm). A twist wire tends to come loose, has an unevenness in temperature, and is poor in equalizing property. Then, an unevenness occurs in electric resistance, and the equaling property relative to the wafer lowers.

As the heater member 222, preferably, a carbon wire having ashes less than 3 ppm is used. In this case, the impurity contamination can be prevented, and since thermal conduction is small and thermal capacity is small rapid temperature rising and decreasing is enabled.

The terminal members 223 made of carbon are arranged on both ends of the heater member 222, and power is supplied through the terminal members 223.

Figure 47:
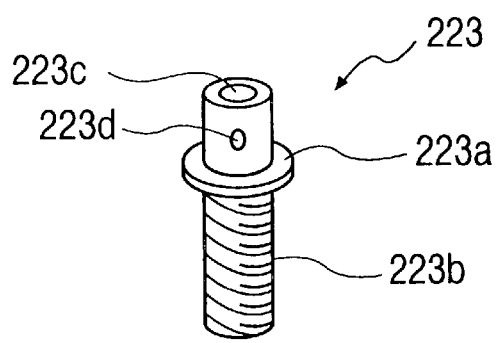
FIG. 47 is a perspective view showing one example of a terminal member shown in FIG. 46.
Figure 48:
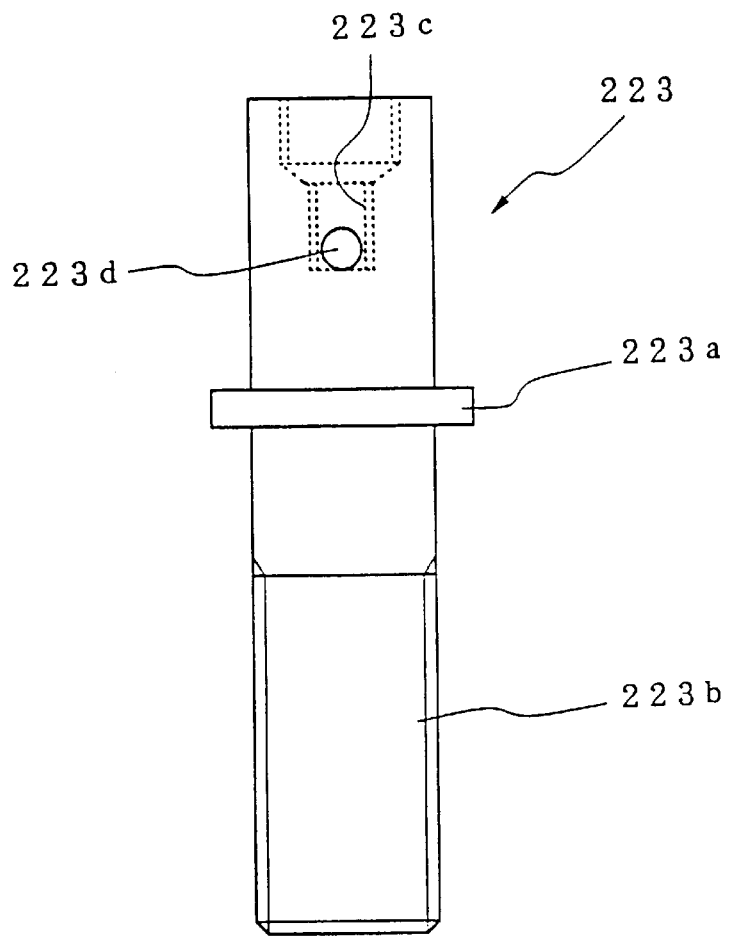
FIG. 48 is a front view showing one example of a terminal member shown in FIG. 46.

As shown in FIGS. 46 to 48, the terminal member 223 has a flange 223a in the middle thereof. The flange 223a is formed on one side with external threads 223b, and formed on the other side with an axial hole 223c and lateral hole 223d. The heater member 222 is inserted into the lateral hole 223d of the terminal member 223, and then the bolt-like keep member 228 made of carbon is screwed into the axial hole 223c of the terminal member 223 to secure the wire 223 to the terminal member 223.

A ring 263 of an alumina insulator is parted downward from the heater member 222 of the wire and arranged in contact with the flange 223a of the terminal member 223. This provides an electric insulation between the carbon-made reflecting plate 225 made of glassy carbon and the carbon-made terminal member 223.

The flange 223a of the aforementioned terminal member 223 is set to the upper side of the base 248, and a spring washer 265 made of a composite material (C/C) of carbon and carbon fiber to the lower side of the base 248. A nut 266 is threaded into the external threads 223b of the terminal body 223 whereby the terminal member 223 is secured to the base 248.

An additional terminal 267 is secured such that internal threads formed in an axial hole 267b are engaged with external threads 223b of the terminal member 223.

A bolt-like keep member 268 is threaded into the additional terminal 267 made of carbon. At least a part of the exposed portion, preferably, the whole exposed portion of the additional terminal 267 is subjected to coating with SiC. If such a SiC coating is carried out, the additional terminal can be used even in the atmospheric pressure.

A through lateral hole 267a perpendicular to the axis is provided in the vicinity of the axial intermediary of the additional terminal 267. An axial hole 267b for storing the keep member 268 is formed from one end of the additional terminal 267 to a hole 267a. The axial hole 267b is formed in the inner wall thereof with threads. The additional terminal 267 is also formed in the other end with threads.

The keep member 268 is formed into a screw shape corresponding to the axial hole 267b of the additional terminal 267. The keep member 268 is threaded into the axial hole 267b of the additional terminal 267 to keep a terminal wire 270 formed of wire-like carbon inserted into the lateral hole 267a. In this way, the terminal wire 270 formed of wire-like carbon is placed in firm contact with the additional terminal 267 using the keep member 268 to prevent the terminal wire 270 formed of wire-like carbon from slipping off and from occurrence of spark.

The terminal wire 270 formed of wire-like carbon is constructed such that a plurality (for example, 20) of carbon fiber bundles comprising a plurality of carbon fibers are woven.

The other end of the terminal wire 270 formed of wire-like carbon is further secured to a separate additional terminal 272. The additional terminal 272 is formed in the upper end thereof with an axial hole 272a where internal thread are formed. A lateral hole 272b is formed in the additional terminal 272 so that the former passes through the bottom of the hole 272a. The end of the terminal wire 270 formed of wire-like carbon is inserted into the lateral hole 272b, and a stop screw 273 is screwed into the lateral hole 272a of the additional terminal 272 to secure the terminal wire 270 formed of wire-like carbon to the additional terminal 272.

The additional terminal 272 is formed in the lower end thereof with an internal thread portion 272c. A nut 274 is threaded therein so that one end of a metal wiring 275 is secured to the additional terminal 272. The other end of the metal wiring 275 is connected to a power supply (not shown).

Normally, the metal wiring 275 is connected to the aforementioned nut 266. In this case, the metal wiring is oxidized and deteriorated due to the heat generation of the terminal body 223 made of carbon. However, such a problem is overcome by the construction provided with the terminal wire formed of wire-like carbon.

Figure 49:
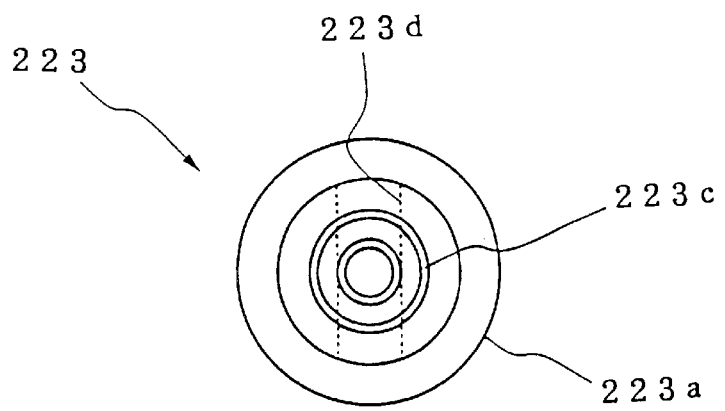
FIG. 49 is a top view showing one example of a terminal member shown in FIG. 46.

FIGS. 48 to 49 show specific examples of the terminal member 23 shown in FIG. 46.

Figure 50:
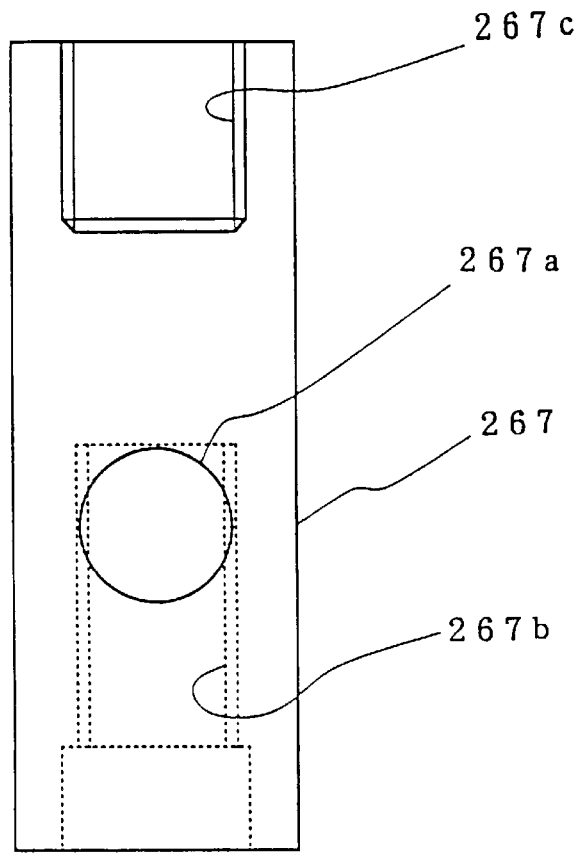
FIG. 50 is a front view showing a concrete example of an additional terminal shown in FIG. 46.
Figure 51:
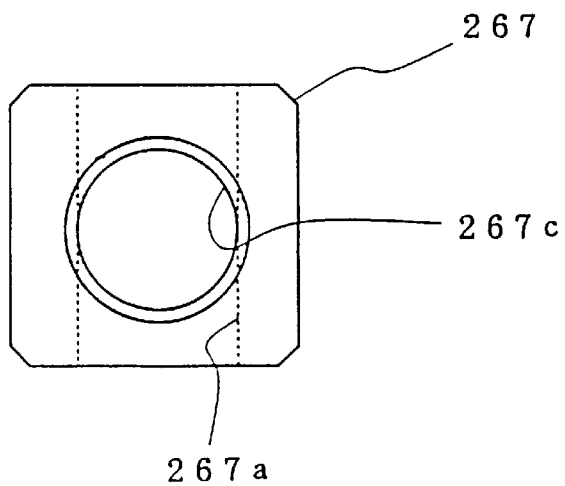
FIG. 51 is a top view showing a concrete example of an additional terminal shown in FIG. 46.

FIGS. 50 to 51 show specific examples of the additional terminal 67 shown in FIG. 46.

Figure 52:
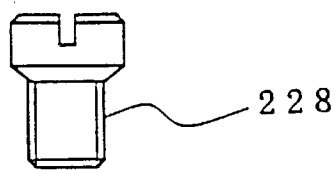
FIG. 52 is a front view showing a concrete example of a keep member shown in FIG. 46.
Figure 53:
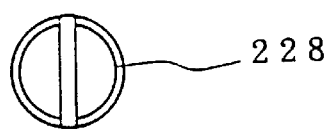
FIG. 53 is a top view showing a concrete example of a keep member shown in FIG. 46.

FIGS. 52 to 53 show specific examples of the keep member 28 shown in FIG. 46.

Figure 54:
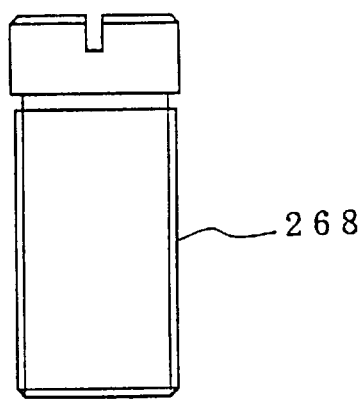
FIG. 54 is a top view showing a concrete example of a keep member shown in FIG. 46.
Figure 55:
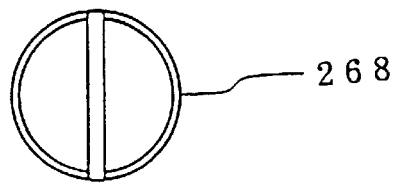
FIG. 55 is a top view showing a concrete example of a keep member shown in FIG. 46.

FIGS. 54 to 55 show specific examples of the terminal 68 shown in FIG. 46.

Figure 56:
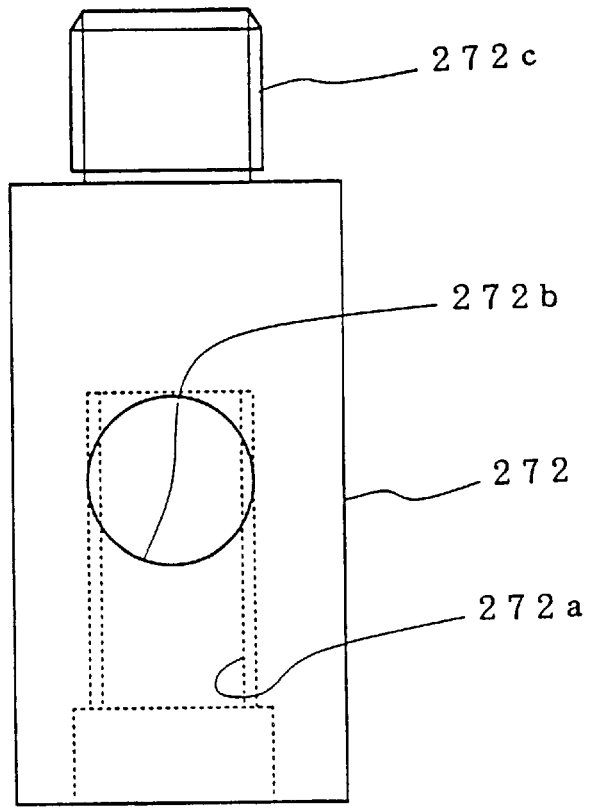
FIG. 56 is a front view showing a concrete example of an additional terminal shown in FIG. 46.
Figure 57:
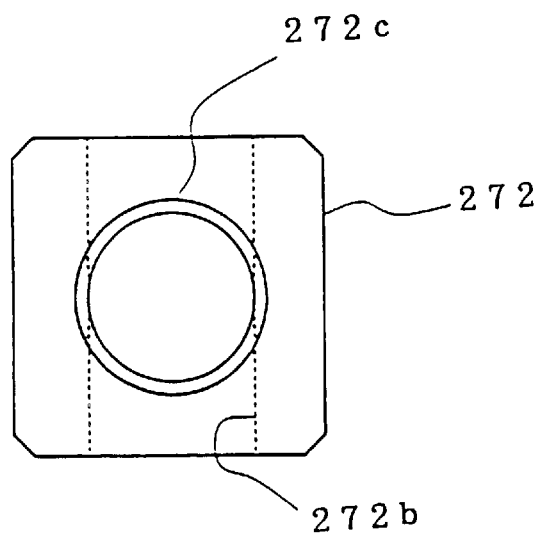
FIG. 57 is a top view showing a concrete example of an additional terminal shown in FIG. 46.

FIGS. 56 to 57 show specific examples of the additional terminals 72 shown in FIG. 46.

Figure 58:
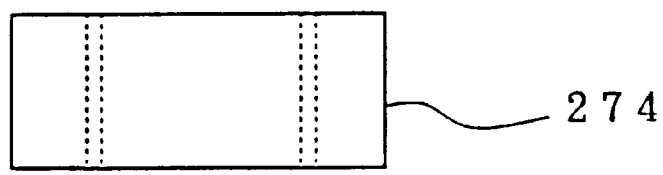
FIG. 58 is a front view showing a concrete example of a nut shown in FIG. 46.
Figure 59:
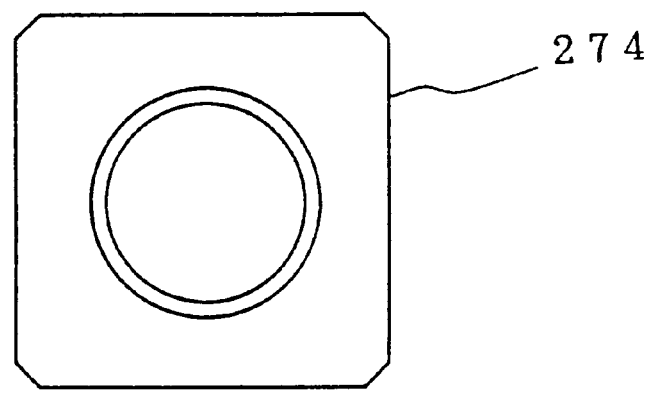
FIG. 59 is a top view showing a concrete example of a nut shown in FIG. 46.

FIGS. 58 to 59 show specific examples of the nut 74 shown in FIG. 46.

The wire support jig 224 is of a thin cylindrical shape and is bored with a hole through which the heater member 222 passes. The root portion of the wire support jig 224 is embedded into the set hole of the quartz glass container 221.

The heater member is supported by the wire support jig 224 so that heater member 222 is not in touch with the quartz glass container. In this way, it is possible to more positively prevent the heater member made of carbon from being silicified and the electrical resistance from being changed.

The wire support jig 224 is formed to be thin cylindrical, that is, pipe-like whereby the upward heat radiation can be increased and the thermal capacity can be made small. When the thermal capacity is small, the thermal response becomes quick to withstand the thermal shock.

The wire support jig 224 can be formed of transparent alumina. In this case, since the heat radiation from the transparent portion increases, the temperature equalizing property of an article to be processed can be enhanced.

The invention of the 5th group is constructed such that the substantially cylindrical hole 223c for inserting the bolt-like keep member 228 is formed lengthwise of the rod-like terminal member 223, and the substantially circular lateral hole 223d extending through the hole 223c is formed so that the heater member is inserted into the lateral hole 223d, and the bolt-like keep member 228 having a length at least reaching the lower part of the lateral hole 223 is rotatably inserted into the hole. Preferably, a diameter of the substantially cylindrical hole 223c for inserting the bolt-like keep member 228 is made larger than that of the substantially cylindrical lateral hole 223d, as shown in FIG. 60(A), and the heater member inserted into the lateral hole 223d is pressed by the bolt-like keep member 228 and deformed to flat so as to reach the bottom of the hole 223d, as shown in FIG. 60(B).

As shown in FIG. 60, if the heater member 222 is flatly deformed by the bolt-like keep member 228 directly and held, when the bolt-like keep member 228 is rotatably inserted, the carbon fibers constituting the heater member 222 are cut not a little and as a result, the holding strength possibly lowers. This inconvenience can be avoided by intervening an expansion graphite sheet (not shown) between the bolt-like keep member 228 and the heater member 222.

The carbon heater according to the invention of the 5th group can be applied to not only the aforementioned form but also a semiconductor manufacturing apparatus in which the carbon heater is arranged below the semiconductor wafer to carry out the heating treatment, for example, as shown in FIG. 61.

Further, the carbon heater according to the invention of the 5th group is not limited to the aforementioned embodiments. For example, the carbon heater is not limited to a cylindrical shape but a hexagonal shape, a rectangular shape and so on can be employed. Furthermore, the arrangement of the heater member in the carbon heater may be volute and other shapes.

In the invention according to the 5th group, the carbon heater effective particularly for a semiconductor manufacturing apparatus has the construction wherein a heater member in which a plurality of carbon fiber bundles comprising carbon fibers bundled are woven into a wire-like elongated shape is supported in a non-contact manner by a plurality of rod-like terminal members and wire support jigs in the flat plate-like container and sealed therein. With this constitution, it is possible to reduce the uneven heat generation of the heat generating element and enhance the equalizing property. Furthermore, the rapid temperature rising and decreasing is enabled.

The present carbon heater can be a simple construction to reduce costs. Furthermore, by selecting the detailed construction and material thereof various problems peculiar to the present carbon heater can be solved, and the durable life thereof can be prolonged.

Invention of the 6th Group

It is an object of the invention according to the 6th group to provide a carbon heater, for example, for a semiconductor manufacturing apparatus which is excellent in equalizing property and flexibility, enables rapid temperature rising and decreasing, and can be manufactured at low costs.

The carbon heater according to the present invention of the 6th group uses, as a heater element, a carbon wire in which wire support portions made of alumina are arranged on both ends, and a plurality of carbon fiber bundles comprising carbon fibers bundled are woven into a wire shape, characterized in that the carbon wire is reciprocated between both the wire support portions and stretched to form a wholly cylindrical heating space.

The wire support portion is made of alumina because when the aforementioned heater member comes in contact with quartz glass or metal at a high temperature (for example, less than 1300° C.), it reacts to deteriorate the strength. Even the support member made of alumina, preferably, an alumina material of high purity is used to prevent the heater member form being deteriorated.

Particularly, it is important to make iron impurities low concentration That is, preferably, the concentration of iron impurities of the wire support portion made of alumina is less than 100 ppm. More preferable concentration of iron impurities is less than 10 ppm.

There can be employed the constitution in which a number of small holes are provided in the wire support portion to guide the heater members through the small holes.

The wire support portion can be formed of a flat plate having a ring shape, a horseshoe shape, and an elliptic shape.

The preferable form of the heater member is as mentioned in connection with the invention according to the first group.

The carbon heater according to the 6th group can be suitably used as a carbon heater of a longitudinal type apparatus for manufacturing a semiconductor.

Preferred embodiments of the invention according to the 6th group will be described hereinafter with reference to FIGS. 62 to 69.

Figure 62:
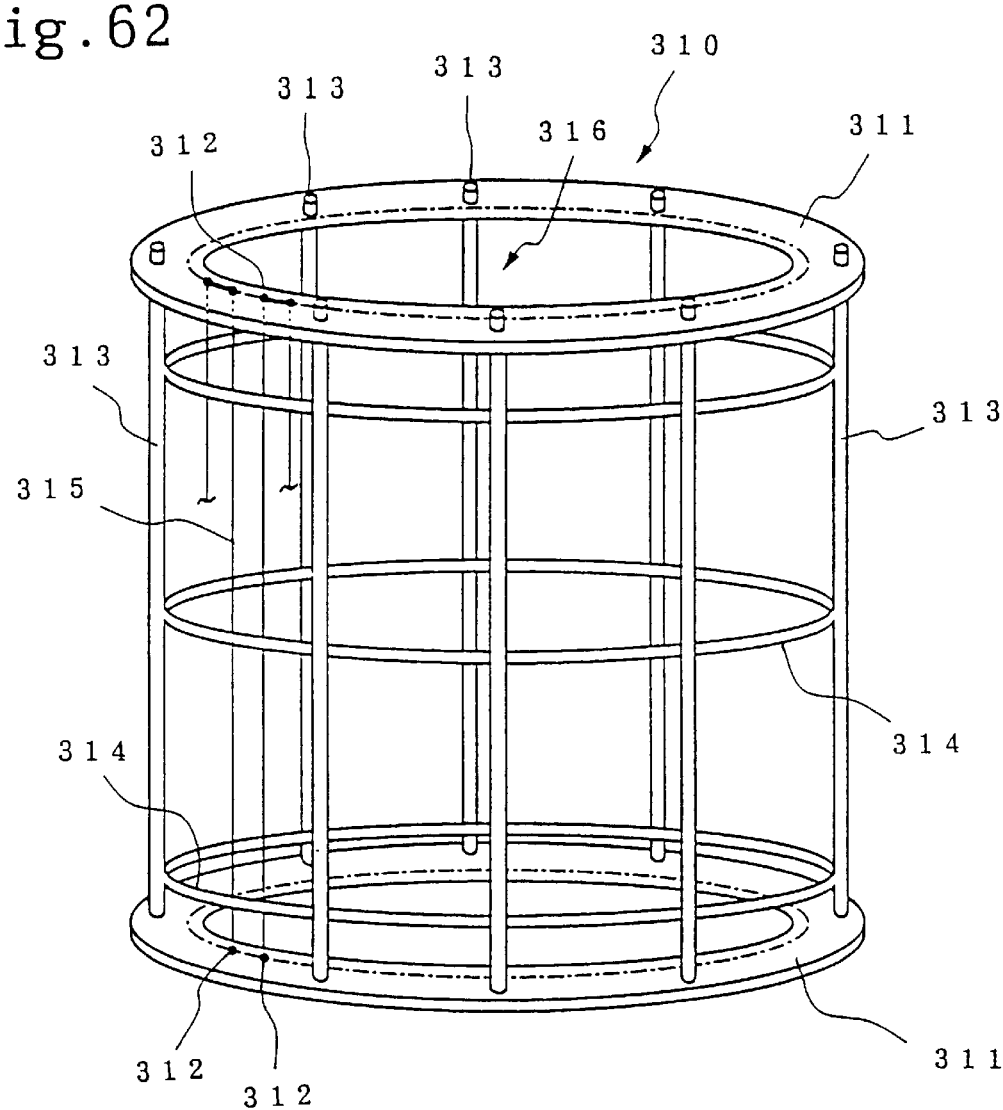
FIG. 62 is a perspective view showing an embodiment of a carbon heater unit for a semiconductor heat treatment apparatus according to the invention of a sixth group.
Figure 63:
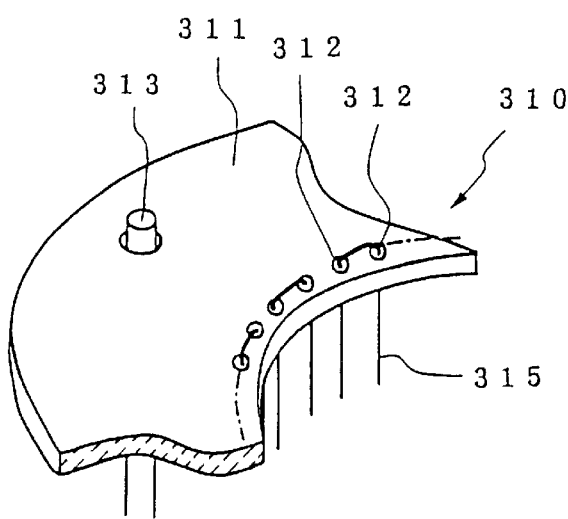
FIG. 63 is a perspective view showing, in an enlarged scale, a part of a carbon heater unit shown in FIG. 62.

FIG. 62 is a perspective view showing an embodiment of a carbon heater effective particularly for a semiconductor heat treatment apparatus. FIG. 63 is a perspective view showing a part of the carbon heater of FIG. 62 in an enlarged scale.

A carbon heater 310 has a frame comprising wire support members 311 arranged on the top and the bottom, 8 longitudinal frame members 313 for connecting the wire support portions 311, and lateral frame members 314 for connecting the longitudinal frame members 313 each other. Heater members 315 as heater elements are stretched in parallel at fixed intervals between the top and bottom wire support portions 311.

In this embodiment, the heater member 315 is arranged between both the wire support portions to form a cylindrical shape. A cylindrical heating space 316 is formed internally of the present carbon heater 310.

The support member 311 is made of alumina and in the shape of a ring-like flat plate. Through-holes 312 are provided in a row at fixed intervals in portions along the inner periphery of the support members 311. The heater member 315 is changed in direction through the through-holes 312 and reciprocated between both the support members 311 and stretched.

The shape of the support member 311 is not limited to a ring shape, but shapes such as a horseshoe shape, an elliptic shape, a polygonal shape and so on may be employed. The support member 311 can be also divided into a plurality of pieces. The through-holes 312 can be arranged not only in a row but in a zigzag manner.

The longitudinal frame member 313 and the lateral frame member 314 can be formed of quartz glass, carbon, metal and so on.

The frame members 313 and 314 may be originally made of alumina However, since alumina is difficult to mold and expensive, the aforementioned materials are used. Among them, quartz glass is considered to be best.

The heater member 315 may be divided by taking out a plurality of electrode portions on the way for adjustment of resistance.

The heater member 315 is prepared by weaving, into a wire shape, a plurality of carbon fiber bundles having a plurality of carbon fibers bundled.

The impurity content of the heater member 315 is less than 10 ppm in ashes, more preferably, less than 5 ppm. When the impurity content exceeds 10 ppm, abnormal heat generation tends to occur.

Since the heater member formed of carbon fibers tends to abnormal heat generation, the use thereof under the oxidized atmosphere is not suitable. Therefore, preferably, the present carbon heater 310 is used in a quartz glass container or a metal dome. It is therefore desired that the present carbon heater 310 is made thin in thickness to provide a compact constitution.

Preferably, the heater member is set to 1 to 20 $\Omega$/m.pce. in electrical resistance at 1000° C. The reason is that in a general heating apparatus for semiconductors, it needs to match the conventional transformer capacity.

In a wiring system in which the heater member is wound in a circumferential direction, the construction of insulators for supporting wires becomes complicated. Therefore, in the aforementioned embodiment, a wiring system which reciprocates the heater member is employed.

If two carbon heaters 310 or more shown in FIG. 62 are put one upon another to constitute a longitudinal heating space, it is possible to control electric power to finely perform temperature control.

Furthermore, a reflecting plate made of glassy carbon can be arranged between the heater member 315 and the frame members 313, 314 made of quartz glass. The provision of the reflecting plate enhances the thermal efficiency of the heater member and enables controlling the unevenness of temperature caused by heat escape in the vicinity of the frame members 313, 314.

It is advantageous that a piece 317 made of carbon is arranged between the heater member 315 and the support member 311. The arrangement of the piece 317 made of carbon reduces the contact portion between the heater member 315 and the support member 311, and enables preventing the thermal shock from extending to the support member 311.

Figure 64:
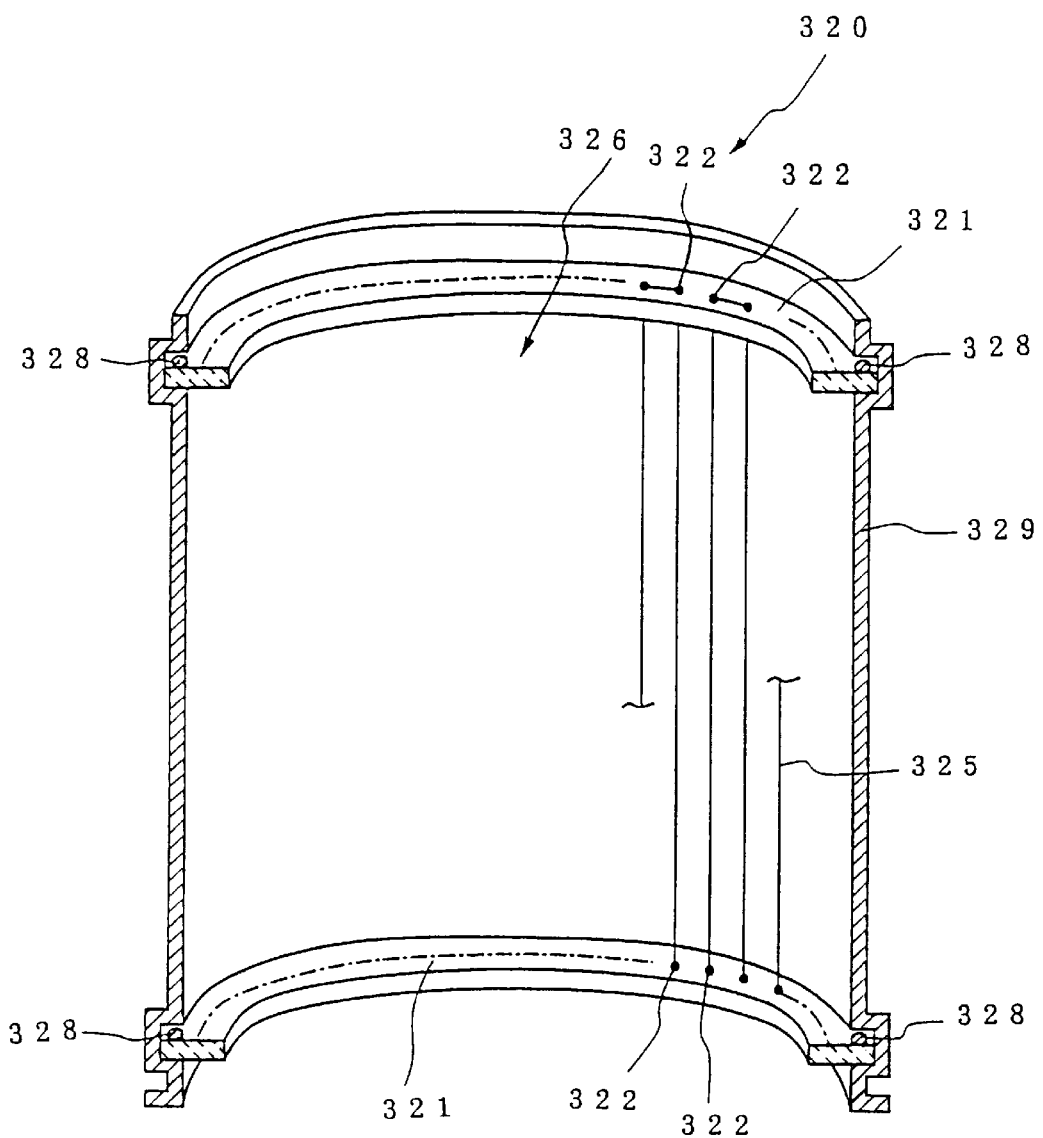
FIG. 64 is a perspective view showing a further embodiment of a carbon heater unit for a semiconductor heat treatment apparatus according to the invention of a sixth group.

FIG. 64 shows another embodiment of the invention according to the 6th group.

In this embodiment, support members 321 for supporting a heater members 325 are mounted on a cylindrical container 329.

The support member 321 is divided into a plurality of pieces and arranged in a ring-like pattern as a whole. Alternatively, the cylindrical container 329 may be longitudinally divided into two sections without dividing the support member 321.

The cylindrical container 329 is of a double-pipe shape but an inner pipe is not shown. Upper and lower lids and a drain pipe system are also not shown.

It is possible to introduce non-oxidizing gases into the container using the drain pipe system and reduce in pressure of the interior of the container to less than 200 torr, for example.

Figure 65:
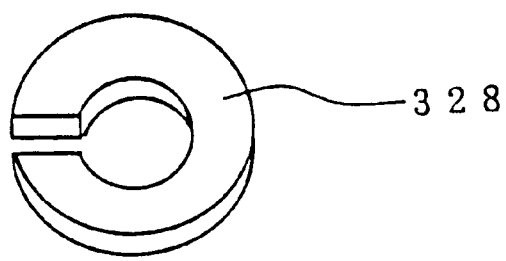
FIG. 65 is a view showing a spring washer made of carbon in the embodiment shown in FIG. 64.
Figure 66:
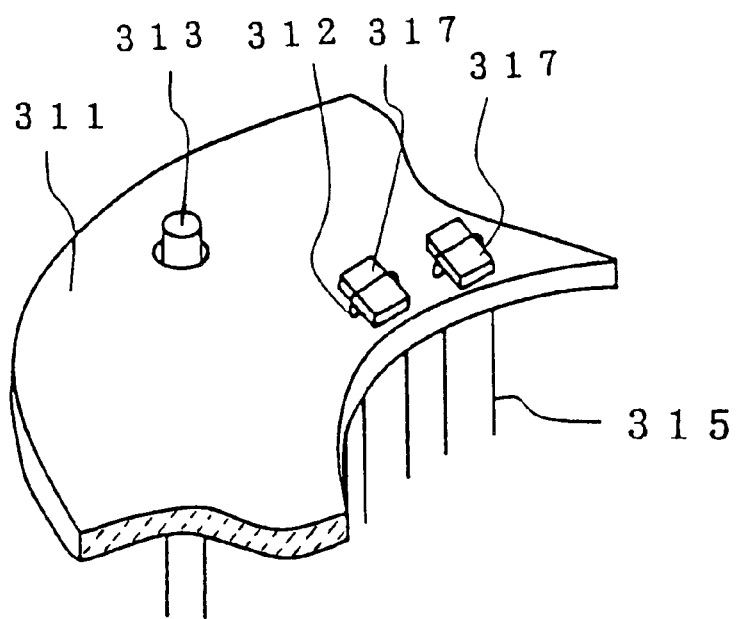
FIG. 66 is a perspective view showing a state that a piece made of carbon is used in the embodiment according to the invention of the sixth group.

The cylindrical container 329 has annular setting portions at top and bottom, where the support members 321 are held. A plurality of spring washers 328 made of carbon shown in FIG. 65 are arranged between the setting portions and the support members 321 to secure the support members 321.

Figure 67:
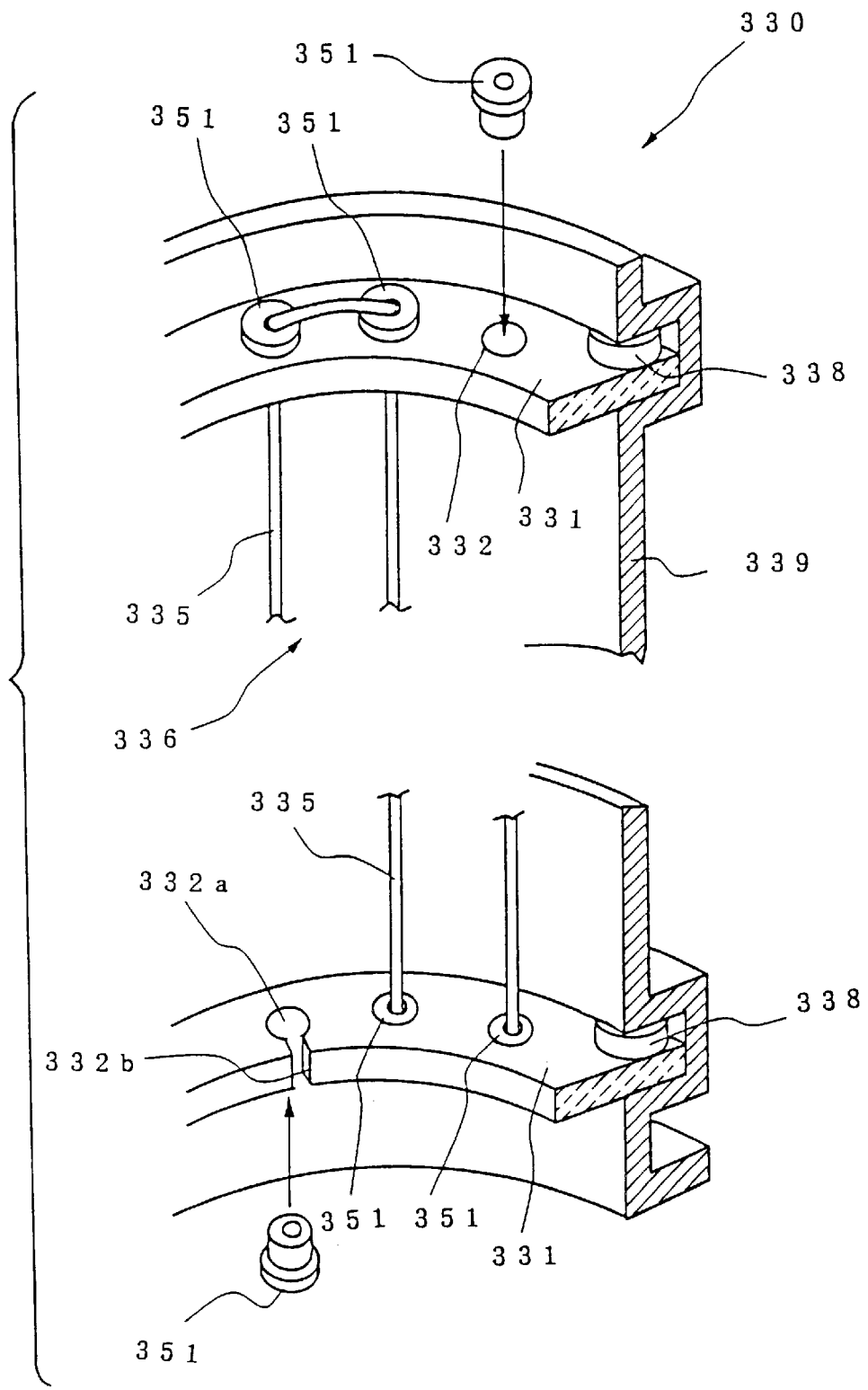
FIG. 67 is a perspective view showing a further embodiment of a carbon heater unit for a semiconductor heat treatment apparatus according to the invention of the sixth group.

FIG. 67 shows still another embodiment of the invention according to the 6th group.

The whole construction of a carbon heater 330 is the same as that of the FIG. 64 embodiment.

In this embodiment, a small hole 332 of a wire support portion 331 is formed to be somewhat large, into which a permeable alumina pin 351 is inserted.

In the transparent alumina pin 351, an inner wall 352 through which at least a wire-like heater member 335 passes is formed of transparent alumina The height of the pin 351 is equal to or higher than the wall thickness of the wire support portion 331. The pin 351 has various shapes as shown in FIGS. 68(A) to (C).

By using the pin 351, it is possible to prevent the reaction between the wire support member 331 made of quartz and the heater member 35 at a high temperature.

Figure 68A:
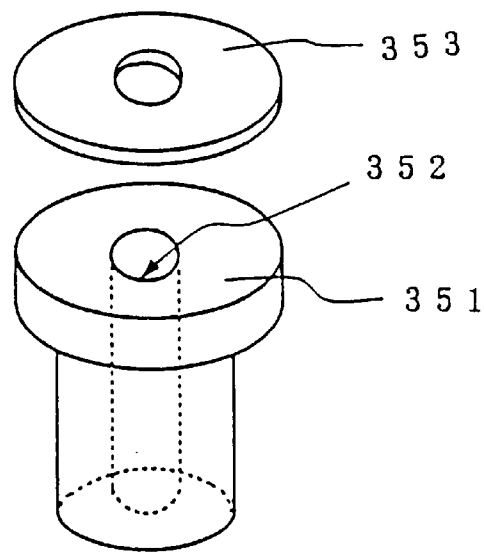
FIG. 68 is a perspective view showing a transmissive alumina pin used for a carbon heater unit shown in FIG. 67.

A ring-like member 353 made of carbon shown in FIG. 68(A) can be arranged on the head of the pin 351. The ring-like member 353 made of carbon prevents the pin 351 from being cracked at the time of rapid temperature rising and decreasing.

Figure 68B:
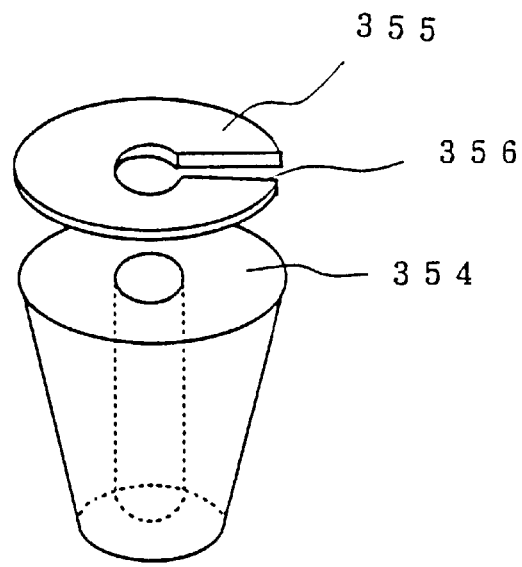
Figure 68C:
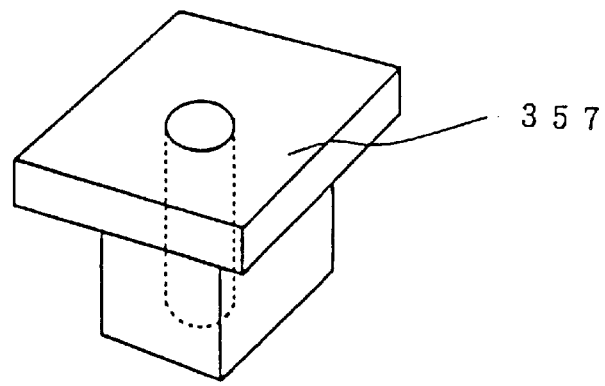

A ring-like member 355 made of carbon shown in FIG. 68(B) is formed with a cut 356. This cut 356 has a width through which a wire passes. When the ring-like member 355 is deteriorated, only the ring-like member 355 can be replaced making use of the cut 356. The cut 356 is also useful in enhancing the heat shock resistance.

A small hole 332a at the left of the lower support portion 331 in FIG. 67 has a cut 332b. The cut 332b has a width through which the heater member 335 passes. When the cut 332b is provided in the support portion 331 as described above, all the pins 351 have been inserted into the wires 335, and after this, the pins 351 can be sequentially set one by one into the small holes 332 of the support portion 331, thus simplifying the assembly of units.

Figure 69:
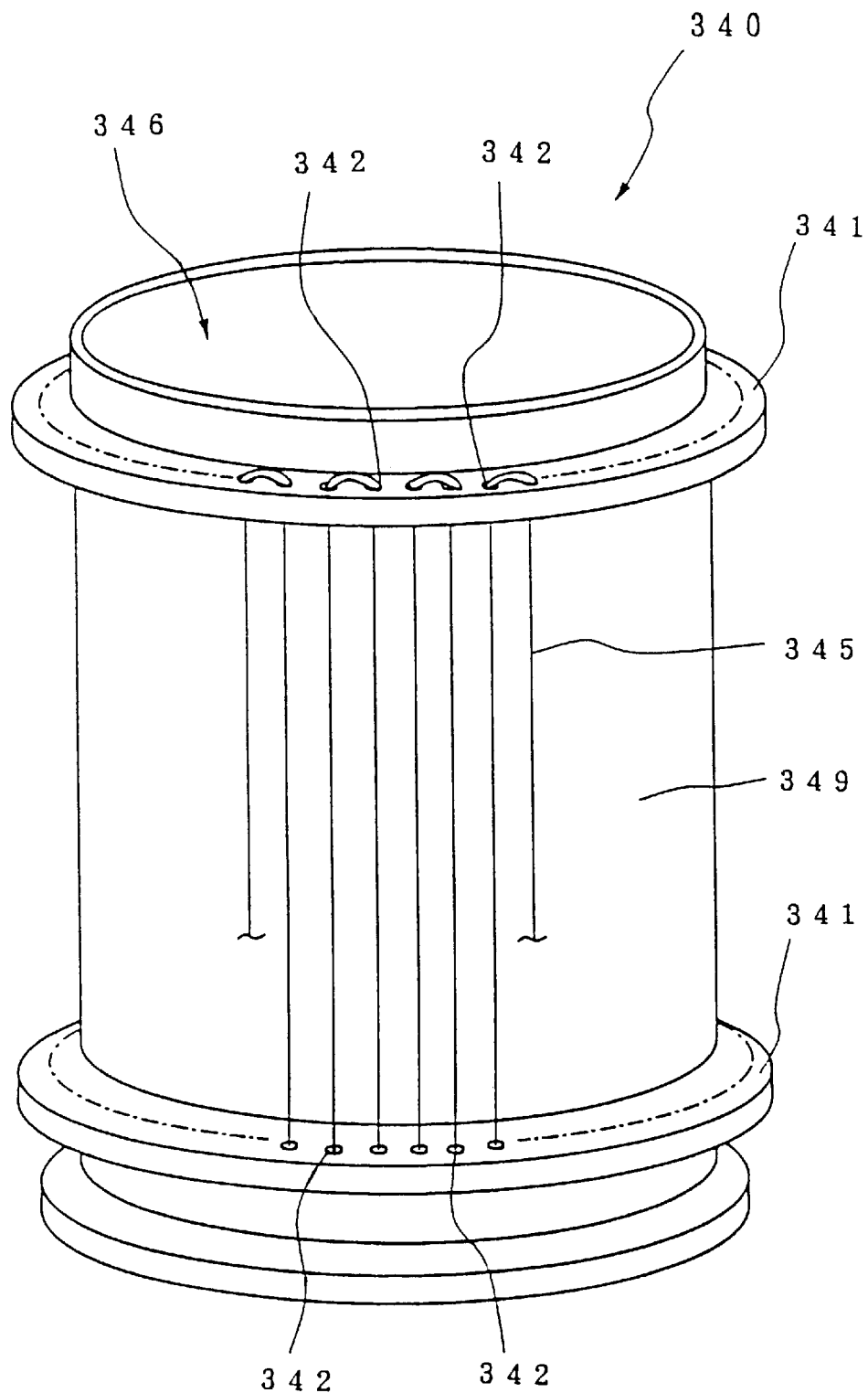
FIG. 69 is a perspective view showing another embodiment of a carbon heater unit for a semiconductor heat treatment apparatus according to the invention of the sixth group.

FIG. 69 shows a further embodiment.

In this carbon heater 340, wire support portions 341 are arranged externally of a cylindrical container 349, and heater members 345 are stretched externally of the container 349.

In this embodiment, since the heater members 345 are not present in a heating space 346 in the container, heating can be achieved in more clean atmosphere.

The heater unit effective particularly for a semiconductor manufacturing apparatus according to the invention of the 6th group is excellent in equalizing property and flexibility and enables rapid temperature rising and decreasing, and designing of shapes can be done freely.

The invention according to the 6th group is not limited to the aforementioned embodiments. For example, the support member can be formed with a groove or projection instead of the hole to guide the wire.

We claim:

1. A carbon heater comprising a heater member (11, 111, 121 ... 161, 212, 222, 315, 325 ... 345, 411, 515, 612) in which a plurality of carbon fiber bundles comprising carbon fibers, 5 to 15 μm in a diameter, are woven into a longitudinally elongated shape, and the impurity content is less than 10 ppm in ashes.

2. The carbon heater according to claim 1, wherein one or a plurality of said heater members (11, 111, 121 ... 161, 212, 222, 315, 325 ... 345, 411, 515, 612) are sealed into a sealed type member made of quartz glass (12, 136, 146, 156, 221, 412, 414, 511, 512, 602).

3. The carbon heater according to claim 2, wherein said sealed type member (136, 146, 156) has a shape either of a double pipe shape (136), a straight pipe shape (146) or an annular pipe shape (156), and a plurality of them are combined to form a fixed shaped heating zone.

4. The carbon heater according to claim 2, wherein non-oxidizing gas is filled in a space formed in said sealed type member (136, 146, 156, 221, 412, 414, 511, 512, 602).

5. The carbon heater according to claim 2, wherein a space formed in said sealed type member (136, 146, 156, 221, 412, 414, 511, 512, 602) is vacuumed at less than 20 torr.

6. The carbon heater according to claim 2, wherein said sealed type member (11) is made of a substantially integrated plate-like quartz glass support element (12), and a hollow space is formed around the peripheral portion of said heater member (11).

7. The carbon heater according to claim 6, wherein said quartz glass support element (12) is integrated by fusion of the whole joining surface of a plurality of quartz glass plates (12a to 12h, 32a to 32e), a wiring groove (14) is formed in the surface of at least one quartz glass plate, and said heater member (11) is arranged thereon.

8. The carbon heater according to claim 6, wherein said quartz glass support element (12) is formed by fusion of two quartz glass plates (12a, 12b), a wiring groove having a fixed depth is formed in the joining surface of at least one quartz glass plate, and the thicknesses of each quartz glass plates substracted said depth are substantially the same.

9. The carbon heater according to claim 6, wherein said quartz a support element (12) is formed by fusion of two quartz glass plates (12a, 12b) which are different in thickness, a wiring groove having a fixed depth is formed in the joining surface of at least one quartz glass plate, and the thickness of one quartz glass plate (12a) substracted said depth is less than ½ of that of the other (12b).

10. The carbon heater according to claim 7, wherein said wiring groove (14) has a curved shape (14d) in at least a lower side (14d) of a sectional shape vertical to lengthwise thereof and is subjected to glossing process.

11. The carbon heater according to claim 10, wherein said wiring groove (14) is interiorly joined in a reduced or non oxidizing gas atmosphere.

12. The carbon heater according to claim 7, wherein said wiring groove (14) is a wholly "gibbous shape" (36, 636) in sectional shape vertical to lengthwise thereof.

13. The carbon heater according to claim 12, wherein a wiring groove (14a) is formed in a first quartz glass plate (32a), a narrow inserting groove (14b) or a through-slit paired with said wiring groove (14a) in a second quartz glass plate (32b), said first and second quartz glass plates (32a, 32b) are joined so that the grooves (14a, 14b) are opposed to each other, the surface of said second quartz glass plate (32b) is polished or ground to delete a bottom of the inserting groove (14b) or the through-slit to thereby expose it as an inserting window, said heater member (11) is pressed therefrom into the wiring groove (14a) of the first quartz glass plate (32a), a third quartz glass plate (32c) is adjusted to a polished surface or a ground surface (33), after which three quartz glass plates (32a to 32c) are fused to substantially integrate the whole surface except the groove (14) whereby said wiring groove (14) has a wholly "gibbous shape" in sectional shape vertical to lengthwise thereof.

14. The carbon heater according to claim 6, wherein said quartz glass support element (12) has an opaque quartz glass layer (12e).

15. The carbon heater according to claim 7, wherein one (12e) out of a plurality of quartz glass plates (12c to 12e) is an opaque quartz glass plate (12e).

16. The carbon heater according to claim 6, wherein a reflecting plate (15) made of carbon whose at least one surface is a mirror surface are sealed into said substantially integrated plate-like quartz glass support element (12), and another hollow space is formed around the peripheral portion of said reflecting plate (15).

17. The carbon heater according to claim 16, wherein said heater member (11) is arranged on the wiring grooves (14), which is formed in the surface of at least one quartz glass plate (12d), and said reflecting plate (15) is arranged on the concavity (16) which is formed in the surface of at least one quartz glass plate (12e), and said quartz glass plates (12c, 12d, 12e) are integrated by fusion to seal said heater member (11) and reflecting plates (15).

18. The carbon heater according to claim 6, wherein reflecting plate (1l) whose at least one surface is a mirror surface is sealed into a substantially integrated wholly plate-like quartz glass support element (22), and said wholly plate-like quartz glass support element (22) is arranged adjacent to said quartz glass support element (12) which seals heater member (11).

19. The carbon heater according to either of claim 2, wherein at least one outer surface of plate-like quartz glass support elements (12, 136, 146, 156, 221, 412, 414, 511, 512, 602) is formed with a gibbous portion (13a, 13b) which is semicircular or trapezoidal in section, said outer surface being subjected to glossing process.

20. The carbon heater according to claim 2, wherein said sealed type member comprises a setting member (412) made of quartz glass having a wiring groove (413) and a lid member (414) made of quartz glass, said heater member being arranged on said wiring groove.

21. The carbon heater according to claim 20, wherein a flame weir (434) is formed on the outer peripheral portion of either said setting member (412) or said lid member (414) or both members (412, 414), the opposed surfaces except said flame weir are arranged at intervals of 0.2 to 1.0 mm, and both the members are integrated by a build-up method of quartz glass.

22. The carbon heater according to claim 21, wherein carbon terminals (416) are arranged on both ends of said heater members (411), metal electrodes (417) are connected to the carbon terminals (416), and a quartz glass pipe (418) covers a portion of said metal electrode (417) on the carbon terminal side.

23. The carbon heater according to claim 22, wherein a non-oxidizing gas is introduced into a space into which the heater members are sealed, and the gas is discharged from the quartz glass pipe (418) covering the electrode (417).

24. The carbon heater according to claim 20, wherein an alumina powder (415) is arranged on the wiring groove (413), and the said heater member (411) is supported by a sintered element of the alumina powder (415).

25. The carbon heater according to claim 6, wherein said heater member (11, 515, 612) or terminal members are connected on both ends of said heater member (11) are drawn substantially vertical with respect to heater surfaces (13, 531) formed by said heater member (11).

26. The carbon heater according to claim 25, wherein both ends of said heater member (612) are projected to the opposite side of the heater surface (631), the projected heater member is fixed by a plurality of wire-like carbons, or wire-like carbon which is woven and having at least one end divided into a plurality of parts arranged in a quartz glass tube (661) in contact with the quartz glass support plate (602), and a quartz glass tube (661) covers the quartz glass pipe to seal said sealed type member.

27. The carbon heater according to claim 26, wherein the other end side of said wire-like carbon (613) is connected to a second wire-like carbon connecting member (640) formed with a hollow portion (649) and having a core member (635) internally thereof by the pressing by way of said core member (635), a metal inscribed wire (641) is connected by a metal wire connecting member (645) making use of a split core (647), and both the connecting members are connected by a cylindrical core (648).

28. The carbon heater according to claim 27, wherein a tapered surface (647b) is formed externally of said split core (647), a tapered portion (642b) engaged with the tapered surface (647b) is formed on the metal wire connecting member (645), the metal inscribed wire (641) is held between support portions (647a) formed in the split core and connected to the cylindrical core (648) while pressing it.

29. The carbon heater according to claim 28, wherein the heater member (515) is linear-symmetrically arranged in said sealed type member, a gas inlet and outlet (518) is formed on the symmetrical axis, a non-oxidizing gas is introduced from the gas inlet and outlet (518) when the containers (511, 512) are welded, and the gas is exhausted from the gas inlet and outlet (518) when the containers (511, 512) are fused.

30. The carbon heater according to claim 25, wherein said heater member (11, 612) are fixed by a plurality of wire-like carbons or wire-like carbon which is woven and having at least an end divided into a plurality of parts arranged in a quartz glass tube (661), said wire-like carbon (613) and a metal inscribed wire (641) on the power supply side are connected by a second terminal device (640), said second terminal device (640) comprising a second wire-like carbon connecting member (643) for connecting a plurality of wire-like carbons, or wire-like carbons having at least an end divided into a plurality of parts, a metal wire connecting member (645) adapted to connect the metal inscribed wire (641) making use of a split core (647), and the second wire-like carbon connecting member (643) and the metal wire connecting member (645) are connected by the cylindrical core (648).

31. The carbon heater according to claim 30, wherein said quartz glass tube (661) and said second terminal device (640) are sealed into a quartz glass pipe (603).

32. The carbon heater according to claim 31, comprising a third terminal device wherein the metal inscribed wire (641) arranged internally of said quartz glass pipe (603) and a circumscribed wire (653) on the power supply side are connected through a Mo foil (655), said Mo foil (655) being sealed by a pinch seal portion (656) made of quartz glass.

33. The carbon heater according to claim 25, wherein said terminal members (521) are projected to the opposite side of the heater surface (531), and the quartz glass pipe (513) covers the terminal member (521) to seal the quartz glass member (511, 512).

34. The carbon heater according to claim 33, wherein said terminal portion body (523) is arranged on the free end side of said quartz glass pipe (513), and said terminal member (521) and the terminal portion body (523) are connected by a plurality of wire-like carbons, or wire-like carbon (522) which is woven and having at least an end divided into a plurality of parts.

35. The carbon heater according to claim 34, wherein the heater member (515) is linear-symmetrically arranged in said sealed type member, a gas inlet and outlet (518) is formed on the symmetrical axis, a non-oxidizing gas is introduced from the gas inlet and outlet (518) when the containers (511, 512) are welded, and the gas is exhausted from the gas inlet and outlet (518) when the containers (511, 512) are fused.

36. The carbon heater according to claim 33, wherein the heater member (612) formed of carbon wire and the wire-like carbon (613) are connected by the first terminal device (611), and the wire-like carbon (613) and the metal inscribed wire (641) on the power supply side are connected by the second terminal device (640), said first terminal device (611) comprising the terminal member (611), said heater member (612) being connected to the heater member connecting portion (614) formed on one end side thereof, and the first wire-like carbon connecting member (616) for connecting a plurality of or wire-like carbons (613) having an end divided into a plurality of parts, the first wire-like carbon connecting member (616) being connected to the other end side of the terminal member (611), the first wire-like carbon connecting member (616) being formed into hollow and arranging the core member (635) internally thereof, the divided wire-like carbon (613a) being connected by being pressed by the core member (635), said second terminal device (640) comprising a second wire-like carbon connecting member (643) for connecting a plurality of or wire-like carbons (613) having an end divided into a plurality of parts, a metal wire connecting member (645) adapted to connect the metal inscribed wire (641) making use of a split core (647), and a terminal portion body (642) for connecting the second wire-like carbon connecting member (643) and the metal wire connecting member (645), and both the connecting members (643, 645) are connected to one end and the other end of the terminal portion body (642).

37. The carbon heater according to claim 36, comprising a third terminal device wherein said heater member (612) and said first and second terminal devices (611, 640) are sealed into the quartz glass pipe (603), the metal inscribed wire (641) arranged internally of said quartz glass pipe (603) and the circumscribed wire (653) on the power supply side are connected through the Mo foil (655), said Mo foil (655) being sealed by the pinch seal portion (656) made of quartz glass.

38. The carbon heater according to claim 2, wherein said sealed type member having the heater member sealed therein comprises a flat plate-like container made of quartz glass or alumia.

39. The carbon heater according to claim 38, wherein said heater member (222) are supported in a non-contact manner within the flat plate-like container (221) by a plurality of terminal members and wire support jigs (224) and sealed.

40. The carbon heater according to claim 39 wherein a substantially cylindrical hole portion for inserting a bolt is formed lengthwise of said terminal member, and a substantially cylindrical lateral hole at least extending through said hole portion is formed, whereby said heater members are inserted into said lateral hole, and a bolt having a length at least reaching the lower end of said lateral hole is rotatably inserted into said hole portion.

41. The carbon heater according to claim 39, wherein said wire support jig (224) comprises a single transparent alumina or an assembly member of high purity carbon and transparent alumina.

42. The carbon heater according to claim 41, wherein a portion of said assembly member in contact with the heater member is formed of a high purity carbon material, and a portion of said assembly member is arranged and connected to the flat plate-like container (221) is formed of a transparent alumina material.

43. The carbon heater according to claim 32, wherein the heat generating surface of said flat plate-like container is formed with a gibbous portion which is semicircular or trapezontal in section, said surface being subjected to glossing.

44. The carbon heater according to claim 2, wherein said sealed type member having said heater members sealed therein has a curved shape.

45. The carbon heater according to claim 44, wherein a plate-like carbon heater having said heater member (11) sealed into said plate-like quartz glass support element (12), and the quartz glass support element (12) substantially integrated, except for the peripheral portion of the heater member, is pressed between a die (41) made of carbon having a fixed shaped section and a male die (42) made of carbon paired therewith to curve the plate-like carbon heater into a fixed shape.

46. The carbon heater according to claim 45, wherein said die and said male die (41, 42) made of carbon have a shape which is semicircular in section to provide a substantially semicylindrical carbon heater.

47. The carbon heater according to claim 45, wherein a reflecting plate made of carbon at least one surface of which is a mirror surface is sealed into said plate-like quartz glass support element (12) independently of said heater members (11).

* * * * *